US012755924B2

(12) United States Patent
Henstra

(10) Patent No.: US 12,755,924 B2
(45) Date of Patent: Oct. 6, 2026

(54) ABERRATION CORRECTION SYSTEMS AND CHARGED PARTICLE MICROSCOPE SYSTEMS INCLUDING THE SAME

(71) Applicant: FEI Company, Hillsboro, OR (US)

(72) Inventor: Alexander Henstra, Utrecht (NL)

(73) Assignee: FEI Company

( * ) Notice: Subject to any disclaimer, the term of this patent is extended or adjusted under 35 U.S.C. 154(b) by 332 days.

(21) Appl. No.: 18/478,966

(22) Filed: Sep. 29, 2023

(65) Prior Publication Data

US 2025/0112018 A1 Apr. 3, 2025

(51) Int. Cl.

*H01J 37/153* (2006.01)
*H01J 37/147* (2006.01)
*H01J 37/28* (2006.01)

(52) U.S. Cl.

CPC ........ *H01J 37/153* (2013.01); *H01J 37/1477* (2013.01); *H01J 37/28* (2013.01); (Continued)

(58) Field of Classification Search

CPC ...... H01J 37/153; H01J 37/1477; H01J 37/28; H01J 2237/1514; H01J 2237/1516; H01J 2237/1534; H01J 2237/1532

See application file for complete search history.

(56) References Cited

U.S. PATENT DOCUMENTS 3,679,896 A * 7/1972 Wardly .................. H01J 29/74 250/294
4,758,722 A * 7/1988 Leckey .................. H01J 49/48 250/397

(Continued)

FOREIGN PATENT DOCUMENTS

CN 102568989 A 7/2012
DE 102020107738 1/2021

(Continued)

OTHER PUBLICATIONS

Extended European Search Report dated May 3, 2025, from European Application No. 24203151.6-1211, 7 pages.

(Continued)

*Primary Examiner* — David A Vanore
(74) *Attorney, Agent, or Firm* — Leron Vandsburger

(57) ABSTRACT

Aberration correction systems and charged particle microscope systems including the same. An apparatus can include a plurality of electrostatic multipole elements configured to at least partially correct an axial chromatic aberration of the charged particle beam. The apparatus additionally includes a deflector assembly with a corrector electrostatic prism. The corrector electrostatic prism can include a first corrector prism electrode and a second corrector prism electrode that define an electrode gap therebetween and a deflector optical axis extends within the electrode gap. The plurality of electrostatic multipole elements can include a first hexapole-generating element, a second hexapole-generating element, a third hexapole-generating element, and/or a fourth hexapole-generating element. In some examples, the second hexapole-generating element is positioned proximate to a midpoint of the deflector optical axis. In some examples, each of the second hexapole-generating element and the third hexapole-generating element is positioned at least partially within the corrector electrostatic prism.

20 Claims, 27 Drawing Sheets

(52) U.S. Cl.
CPC .................. *H01J 2237/1514* (2013.01); *H01J 2237/1516* (2013.01); *H01J 2237/1534* (2013.01)

(56) References Cited

U.S. PATENT DOCUMENTS

| | | | | |
|---|---|---|---|---|
| 4,823,003 | A * | 4/1989 | King | H01J 49/22 250/305 |
| 4,962,313 | A | 10/1990 | Rose | |
| 5,097,125 | A * | 3/1992 | Gruen | H01J 49/061 250/305 |
| 5,448,063 | A * | 9/1995 | De Jong | H01J 37/05 250/305 |
| 5,886,346 | A * | 3/1999 | Makarov | H01J 49/425 250/290 |
| 6,384,412 | B1 * | 5/2002 | Krahl | H01J 37/05 250/305 |
| 6,770,878 | B2 * | 8/2004 | Uhlemann | H01J 37/05 250/311 |
| 6,770,887 | B2 | 8/2004 | Krivanek et al. | |
| 6,861,651 | B2 * | 3/2005 | Rose | H01J 37/153 250/398 |
| 6,900,443 | B2 | 5/2005 | Schlichting | |
| 7,378,667 | B2 | 5/2008 | Henstra | |
| 7,679,051 | B2 * | 3/2010 | Burch | H01J 49/42 250/296 |
| 8,314,402 | B2 | 11/2012 | Zach | |
| 8,373,137 | B2 | 2/2013 | Krivanek et al. | |
| 8,642,956 | B2 * | 2/2014 | Fober | H01J 37/26 250/311 |
| 10,825,644 | B1 | 11/2020 | Henstra | |
| 11,043,353 | B2 * | 6/2021 | Omoto | H01J 49/46 |
| 11,114,271 | B2 | 9/2021 | Henstra et al. | |
| 11,239,045 | B1 | 2/2022 | Henstra et al. | |
| 2003/0098415 | A1 * | 5/2003 | Matsuya | H01J 37/153 250/306 |
| 2004/0051985 | A1 | 3/2004 | Rose et al. | |
| 2005/0017194 | A1 | 1/2005 | Matsuya et al. | |
| 2005/0104006 | A1 | 5/2005 | Yoshia et al. | |
| 2008/0067378 | A1 * | 3/2008 | Kawasaki | H01J 37/28 250/310 |
| 2008/0290273 | A1 * | 11/2008 | Uhlemann | H01J 49/48 250/305 |
| 2012/0074315 | A1 * | 3/2012 | Krivanek | H01J 37/05 250/311 |
| 2012/0091332 | A1 * | 4/2012 | Makarov | H01J 49/40 250/281 |
| 2013/0068942 | A1 | 3/2013 | Verenchikov | |
| 2017/0162362 | A1 | 6/2017 | Yoshida | |
| 2018/0366295 | A1 | 12/2018 | Morishita | |
| 2020/0027689 | A1 | 1/2020 | Breuer | |
| 2021/0302333 | A1 | 9/2021 | Henstra et al. | |
| 2021/0305007 | A1 | 9/2021 | Henstra et al. | |
| 2022/0108864 | A1 | 4/2022 | Zeidler et al. | |
| 2022/0336199 | A1 | 10/2022 | Chen et al. | |
| 2023/0028084 | A1 | 1/2023 | Ren | |
| 2025/0112016 | A1 * | 4/2025 | Henstra | H01J 37/153 |
| 2025/0112018 | A1 * | 4/2025 | Henstra | H01J 37/153 |
| 2025/0112019 | A1 * | 4/2025 | Henstra | H01J 37/12 |
| 2025/0253123 | A1 * | 8/2025 | Van Engelen | H01J 37/3177 |

FOREIGN PATENT DOCUMENTS

| | | |
|---|---|---|
| JP | 7072196 | 5/2022 |
| JP | 2022094682 | 6/2022 |
| WO | WO 2024/154182 | 7/2024 |

OTHER PUBLICATIONS

Extended European Search Report dated May 3, 2025, from European Application No. 24201604.6-1211, 9 pages.
Krivanek et al., "Aberration Correction in the STEM," *Institute of Physics Conference Series*, pp. 35-40, Jan. 1, 1997.
O. Scherzer, Über einige Fehler von Elektronenlinsen, Zeitschrift für Physik, vol. 101, pp. 593-603, Sep. 1936, 12 pages. (with machine-generated English translation of Abstract).
O. Scherzer, Sphärische und chromatische Korrektur von Elektronenlinsen, Optik, vol. 2, pp. 114-132, 1947, 21 pages. (with machine-generated English translation of Abstract).
H. Zyngier, Strategie pour la Correction de Chromaticite, U.E.R. du Laboratoire de L' Accelerateur Lineaire, vol. 35, Nov. 1977, 21 pages. (with English Abstract on p. 2).
P. Krejcik, A Practical Algorithm for Chromaticity Correction in Linear Collider Final Focus Systems, Conference Record of the 1991 IEEE Particle Accelerator Conference, vol. 5, pp. 3258-3260, May 1991, 3 pages.
M. Donald et al., Localized Chromaticity Correction of Low-Beta Insertions in Storage Rings, Proceedings of International Conference on Particle Accelerators, vol. 1, pp. 131-133, May 1993, 3 pages.
F. Kahl, Design eines Monochromators für Elektronenquellen, Technische Universität Darmstadt, Doctoral Dissertation, Nov. 29, 1999, 186 pages. (with machine-generated English translation of the summary).
A. Kalimov et al., Optimization of the Pole Shape of Quadrupole Magnets by Multimag, IEEE Transactions on Applied Superconductivity, vol. 16(2), pp. 1282-1285, Jun. 2006, 4 pages.
H. Muller et al., Advancing the Hexapole Cs-Corrector for the Scanning Transmission Electron Microscope, Microsc. Microanal., vol. 12(6), pp. 442-455, Dec. 2006, 14 pages.
O. L. Krivanek et al., High-energy-resolution monochromator for aberration-corrected scanning transmission electron microscopy/electron energy-loss spectroscopy, Phil. Trans. R. Soc. A, vol. 367, pp. 3683-3697, Sep. 28, 2009, 15 pages.
S. Okayama et al., High-Precision Quadrupole Correction Lens for Ion-Beam Focusing: Design and Test of Multistage Self-Aligned Quadrupole Correction-Lens System, Jpn. J. Appl. Phys., vol. 51, pp. 026702-1-026702-8, Feb. 1, 2012, 8 pages.
A. Ponomarov et al., Five magnetic quadrupole lenses with four power supplies as a single-stage lens system of a nuclear microprobe, Nuclear Instruments and Methods in Physics Research B, vol. 348, pp. 83-87, Apr. 2015, 5 pages.
Y. Dou et al., GEANT4 models for the secondary radiation flux in the collimation system of a 300 MeV proton microbeam, Physica Medica, vol. 32, pp. 1841-1845, Oct. 27, 2016, 5 pages.
H. Rose et al., Magnetic Cc/Cs-corrector compensating for the chromatic aberration and the spherical aberration of electron lenses, Ultramicroscopy, vol. 203, pp. 139-144, Aug. 2019, 6 pages.
Electrostatic Corrector, Corrected Electron Optical Systems GmbH, Research article, downloaded Nov. 7, 2023, 5 pages.
Partial European Search Report for related EP Application No. 24203245.6, 11 pages, mailed Mar. 6, 2025.
European Search Report for related EP Application No. 24203245.6, 11 pages, mailed May 27, 2025.

* cited by examiner

ABERRATION CORRECTION SYSTEMS AND CHARGED PARTICLE MICROSCOPE SYSTEMS INCLUDING THE SAME

FIELD

The present disclosure relates generally to charged particle microscope systems, and specifically to charged particle microscopes with systems for correcting spherical and/or chromatic aberration in a charged particle beam.

BACKGROUND

Particle-optical microscopes utilize round lenses to direct electron/charged particle beams to irradiate a specimen. Such round lenses, however, generate positive spherical and chromatic aberration coefficients that restrict higher opening angles and inhibit resolution and probe current.

SUMMARY

In a representative example, an apparatus includes a plurality of electrostatic elements configured to deflect an incident charged particle beam along an α-shaped path. The plurality of electrostatic elements includes a plurality of electrostatic multipole elements configured to at least partially correct an axial chromatic aberration of the charged particle beam. The apparatus additionally includes a deflector assembly with a corrector electrostatic prism and the plurality of electrostatic multipole elements. The corrector electrostatic prism includes a corrector prism body with a first corrector prism electrode and a second corrector prism electrode positioned radially exteriorly of the first corrector prism electrode. The first corrector prism electrode and the second corrector prism electrode define an electrode gap therebetween. The deflector assembly defines a deflector optical axis that extends within the electrode gap, and the deflector assembly is configured to at least partially correct an axial chromatic aberration in the charged particle beam as the charged particle beam travels along the deflector optical axis.

In another representative example, an apparatus includes a plurality of electrostatic elements configured to deflect an incident charged particle beam along an α-shaped path. The plurality of electrostatic elements includes a plurality of electrostatic multipole elements configured to at least partially correct an axial chromatic aberration of the charged particle beam.

The apparatus additionally includes a deflector assembly with a corrector electrostatic prism and the plurality of electrostatic multipole elements. The plurality of electrostatic multipole elements includes a first hexapole-generating element configured to generate a first hexapole field, a second hexapole-generating element configured to generate a second hexapole field, and a third hexapole-generating element configured to generate a third hexapole field. The deflector assembly defines a deflector optical axis, and the second hexapole-generating element is positioned proximate to a midpoint of the deflector optical axis within the corrector electrostatic prism and at a position along the deflector optical axis corresponding to a line focus of the charged particle beam. The deflector assembly is configured to at least partially correct an axial chromatic aberration in the charged particle beam as the charged particle beam travels along the deflector optical axis.

In another representative example, an apparatus includes a plurality of electrostatic elements configured to deflect an incident charged particle beam along an α-shaped path. The plurality of electrostatic elements includes a plurality of electrostatic multipole elements configured to at least partially correct an axial chromatic aberration of the charged particle beam. The apparatus additionally includes a deflector assembly with a corrector electrostatic prism and the plurality of electrostatic multipole elements. The plurality of electrostatic multipole elements includes a first hexapole-generating element configured to generate a first hexapole field, a second hexapole-generating element configured to generate a second hexapole field, a third hexapole-generating element configured to generate a third hexapole field, and a fourth hexapole-generating element configured to generate a fourth hexapole field. Each of the second hexapole-generating element and the third hexapole-generating element is positioned at least partially within the corrector electrostatic prism. The deflector assembly defines a deflector optical axis, and the deflector assembly is configured to at least partially correct an axial chromatic aberration in the charged particle beam as the charged particle beam travels along the deflector optical axis.

The foregoing and other objects, features, and advantages of the disclosed technology will become more apparent from the following detailed description, which proceeds with reference to the accompanying figures.

DETAILED DESCRIPTION

Figure 1:
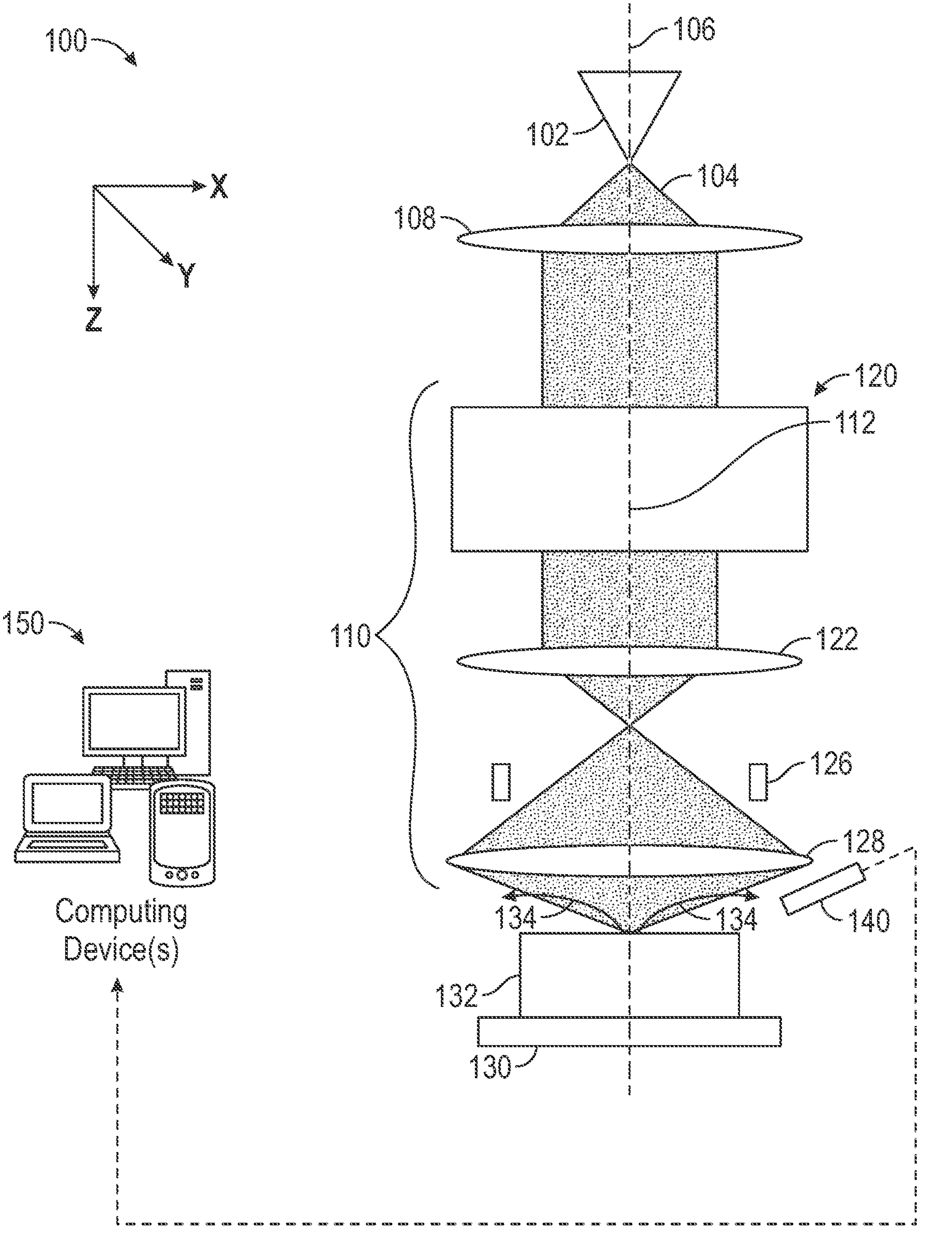
FIG. 1 is a schematic side elevation view of a charged particle microscope system according to an example.

Charged particle beam systems such as scanning electron microscopes and focused ion beam microscopes are widely used in the semiconductor and nanotechnology industries for imaging, manufacturing, and/or modifying microscopic structures, such as by irradiating such structures with a charged particle beam (e.g., an electron beam or an ion beam). Such beam systems commonly utilize electromagnetic lenses to converge, deflect, and focus the charged particle beam onto the sample. As with optical systems, charged particle beam systems introduce axial aberrations that increase the size of the charged particle beam spot on the sample, thereby limiting the spatial resolution of the system.

In particular, the focusing lens positioned closest to the sample, also known as the objective lens, contributes the most to the axial aberrations of an aperture, such as the chromatic and spherical aberrations (denoted Cc and Cs, respectively). As described in the publication by O. Scherzer, "Ober einige Fehler von Elektronenlinsen," Z. Physik 101, 1936, electromagnetic round lenses always generate a positive chromatic and spherical aberration coefficient so that a round lens cannot fully compensate for the aberration of another round lens.

Moreover, in another publication of the same author (O. Scherzer, "Spharische und chromatische Korrektur von Elektronenlinsen," Optik 2, 1947, p. 114), it was shown that aberrations of round electromagnetic lenses can be compensated by the negative aberrations generated by multipoles. A multipole element comprises N poles (e.g., electrodes) and is configured for generating electrostatic or magnetic multipole fields of ≤N-fold rotational symmetry. Thus, a multipole element can generate (a combination of) dipole fields, hexapole fields, octupole fields, and so on.

An example of a current solution for correcting the chromatic and spherical aberration of electron lenses has been recently proposed in "Magnetic Cc/Cs-corrector compensating for the chromatic aberration and the spherical aberration of electron lenses" (H. Rose, A. Nejati, H. Müller, Ultramicroscopy 203, 2019, p. 139-144, referred to hereinafter as Rose et al. 2019) in which a purely magnetic corrector is introduced in detail. In particular, the authors describe a curved axis corrector that comprises magnetic quadrupole and hexapole-generating elements arranged in an omega-shaped design.

As mentioned in Rose et al. 2019, the quadrupoles are configured for focusing and forming the beam, while the hexapoles are tuned in a manner that counterbalances the positive chromatic aberration of the electrical-optical system. Because the first-order rays are very astigmatic inside the corrector, one can add octupoles in appropriate places in order to correct for the spherical aberration as well. This fully magnetic imaging corrector is intended for implementation in electron microscopes such as a Transmission Electron Microscope (TEM) and is particularly configured for correcting the chromatic aberration and spherical aberration for beam energies up to 1.2 MeV. However, the Cc/Cs correctors of Rose et al. 2019 utilize magnetic fields alone, and are therefore impractical for ions, since ions being heavier than electrons, are less susceptible to magnetic fields.

Alternatively, one could use purely electrostatic Cc/Cs correctors for both electron and ion beams with a straight axis, as described for example in U.S. Patent Application Publication No. 2004/0051985, but such correctors are complex and the pass beam energy is quite low (up to 8 kV), so ion-ion interactions are problematic.

Very recently, the company CEOS/JEOL developed an electrostatic corrector suitable for beam energies up to 30 keV (https://www.ceos-gmbh.de/en/research/electrostat). However, the proposed corrector leads to major disadvantages, such as the generation of large higher order aberrations, and high sensitivity to alignment errors due to very strong focusing power of the Cc-correcting elements. Thus, the proposed corrector by CEOS/JEOL is suited only for ion optics.

Examples of the disclosed technology seek to alleviate and/or overcome the shortcomings and disadvantages of existing aberration correction systems. More particularly, examples herein can include improved systems for correcting axial aberrations of a charged particle beam system.

Examples of the disclosed technology can also include a corrector of axial chromatic and/or spherical aberrations, such as a purely electrostatic corrector compensating the chromatic and/or spherical aberrations of a charged particle beam system.

FIG. 1 illustrates an example of a charged particle microscope system 100 that can include and/or utilize aberration correction systems as disclosed herein. In the example of FIG. 1, the charged particle microscope system 100 is configured to direct or focus a charged particle beam 104 upon a sample 132 for inspection and/or analysis of one or more properties of the sample 132. The charged particle microscope system 100 can include and/or be any of a variety of systems, such as an electron microscope (EM) setup or electron lithography setup configured to irradiate and/or otherwise impinge the sample 132 with the charged particle beam 104.

In various examples, the charged particle microscope system 100 may include and/or be one or more different types of EM and/or charged particle microscopes, examples of which include a scanning electron microscope (SEM), a scanning transmission electron microscope (STEM), a transmission electron microscope (TEM), a charged particle microscope (CPM), dual beam microscopy system, etc. Additionally, in some examples, a TEM is capable of operating as a STEM as well. In the example of FIG. 1, the charged particle microscope system 100 is a SEM or FIB system.

As shown in FIG. 1, the example charged particle microscope system 100 includes a charged particle source 102 (e.g., a thermal electron source, Schottky-emission source, field emission source, a liquid metal ion source, a plasma ion source, etc.) that emits the charged particle beam 104 along an emission axis 106 and toward condenser optics 108. The condenser optics 108 can include an electrostatic gun lens, an accelerator, and/or one or more condenser lenses. The emission axis 106 can be a central axis that runs along the length of the example charged particle microscope system 100 from the charged particle source 102 and through the sample 132. Additionally or alternatively, the emission axis 106 can refer to and/or include a portion of the path followed by the charged particle beam 104 that extends proximate the charged particle source 102.

The accelerator lens of the condenser optics 108 accelerates/decelerates, focuses, and/or directs the charged particle beam 104 towards a focusing column 110. As used herein, the focusing column 110 additionally or alternatively may be referred to as an optical column 110. The focusing column 110 focuses the charged particle beam 104 so that it is incident on sample 132. Additionally, the focusing column 110 corrects and/or tunes aberrations (e.g., geometric aberrations, chromatic aberrations) of the charged particle beam 104.

As shown in FIG. 1, the focusing column 110 can be described as including, encompassing, and/or defining an optical column axis 112 along which the charged particle beam 104 travels through at least a portion of the focusing column 110. In some examples, the emission axis 106 may be described as including the optical column axis 112. While FIG. 1 illustrates the optical column axis 112 as being straight for simplicity, this is not required, and it is within the scope of the present disclosure that the optical column axis 112 may be curved.

As shown in FIG. 1, the focusing column 110 can include an aberration correction system 120 as described in more detail below. The focusing column 110 additionally can include a transfer lens 122 and an objective lens 128.

The objective lens 128 is an optical element that focuses the charged particle beam 104 to a point (e.g., a well-localized spot) on the sample 132. The objective lens 128 can generate a positive Cs. The objective lens 128 can include and/or be any of a variety of focusing elements, examples of which include a single-polepiece lens, a magnetic electrostatic compound lens, electrostatic objective lens, or another type of objective lens.

FIG. 1 further illustrates the charged particle microscope system 100 as including a sample holder 130 that holds the sample 132 and a detector 140 that is configured to detect charged particles 134 that are discharged from the sample 132 as a result of the charged particle beam 104 being incident upon the sample 132. In addition, the charged particle microscope system 100 is illustrated as including astigmatism correction and scan coils 126 for directing the charged particle beam 104 to scan the surface of the sample 132. For example, the scan coils 126 can be configured to selectively shift the direction of the charged particle beam 104 so that the charged particle beam 104 can be scanned (e.g., raster scanned) across an area of the surface of the sample 132 to be probed.

As shown in FIG. 1, the charged particle microscope system 100 additionally can include one or more computing devices 150 programmed and/or configured to control operation of one or more aspects of the charged particle microscope system 100. As an example, the computing device(s) 150 can be programmed and/or configured to direct the charged particle beam 104 to a desired location upon the sample 132, such as by translating the sample holder 130 and/or operating the scan coils 126. Additionally or alternatively, the computing device(s) 150 can be programmed and/or configured to receive a signal from the detector 140 to characterize the sample 132.

Those skilled in the art will appreciate that the computing devices 150 depicted in FIG. 1 are merely illustrative and are not intended to limit the scope of the present disclosure. The computing device(s) 150 can include and/or be any suitable combination of hardware or software that can perform the indicated functions, including computers, network devices, Internet appliances, PDAs, wireless phones, controllers, oscilloscopes, amplifiers, etc. The computing device(s) 150 also can be connected to other devices that are not illustrated (e.g., via wired and/or wireless communication connections), or may operate as a stand-alone system.

As discussed above, one or more components of a charged particle beam system such as the objective lens 128 of the charged particle microscope system 100 can generate chromatic and spherical axial aberrations that limit the precision with which a charged particle beam can be focused upon a sample. To clarify the manner in which correction systems such as the aberration correction system 120 can operate to correct for such aberrations, the following discussion considers the origins and forms of such aberrations. While the following discussion is presented primarily in the context of electron beams, it is to be understood that the principles can apply to electron beams and ion beams, e.g., by introducing a sign change in some equations. In the following discussion, calculations are performed in a non-relativistic approximation, which is suitable for ion beams and for electron beams with electron energies representative of SEM systems (e.g., with $eU \leq 30$ keV).

In the present disclosure, various properties of the charged particle beam can be described with reference to rays characterizing the charged particle beam. In particular, the systems described herein can be described as operating in a regime in which the constituent particles of the charged particle beam travel along substantially straight paths unless such paths are blocked, bent, and/or deflected by other components of the systems. Accordingly, many principles of ray optics can be applied to such charged particle beams.

A spatial extent of the charged particle beam can be characterized with reference to any suitable coordinate system. In the present disclosure, a position of a portion (e.g., a portion of a ray) of the charged particle beam can be described with reference to an x component as measured along an x-axis, a y component as measured along a y-axis, and a z component as measured along a z-axis. In the present disclosure, the z-axis generally corresponds to an optical axis along which the charged particle beam travels, which in some cases can be a curved axis. The x-axis and the y-axis can extend along any suitable directions such that the x-axis, the y-axis, and the z-axis are mutually perpendicular to one another.

Multipoles

As used herein, the term "multipole element" can refer to any suitable component with a plurality of poles, or electrodes, to which respective voltages can be applied to generate a multipole field. For example, a multipole element with four poles can be configured to generate at least a quadrupole field. Similarly, a multipole element with six poles can be configured to generate at least a hexapole field. In the present disclosure, a multipole element may be named and/or described with reference to the multiplicity of a multipole field that the multipole element is configured to produce (e.g., as a primary or sole multipole field generated by the multipole element). For example, a "quadrupole-generating element" can have four or more poles to generate at least a quadrupole field, and/or can have one or more poles that are shaped to produce at least a quadrupole field. Similarly, a "hexapole-generating element" can have six or more poles to generate at least a hexapole field, and/or can have one or more poles that are shaped to produce at least a hexapole field.

In some examples, a multipole element additionally or alternatively can be configured to generate any of a variety of multipole fields (and/or superpositions thereof). For example, in some examples, a hexapole-generating element with six poles can be configured to generate dipole fields, quadrupole fields, and/or hexapole fields. Unless otherwise stated, references herein to multipole fields (e.g., dipole fields, quadrupole fields, hexapole fields, octupole fields, etc.) generally refer to electrostatic multipole fields.

Figure 2:
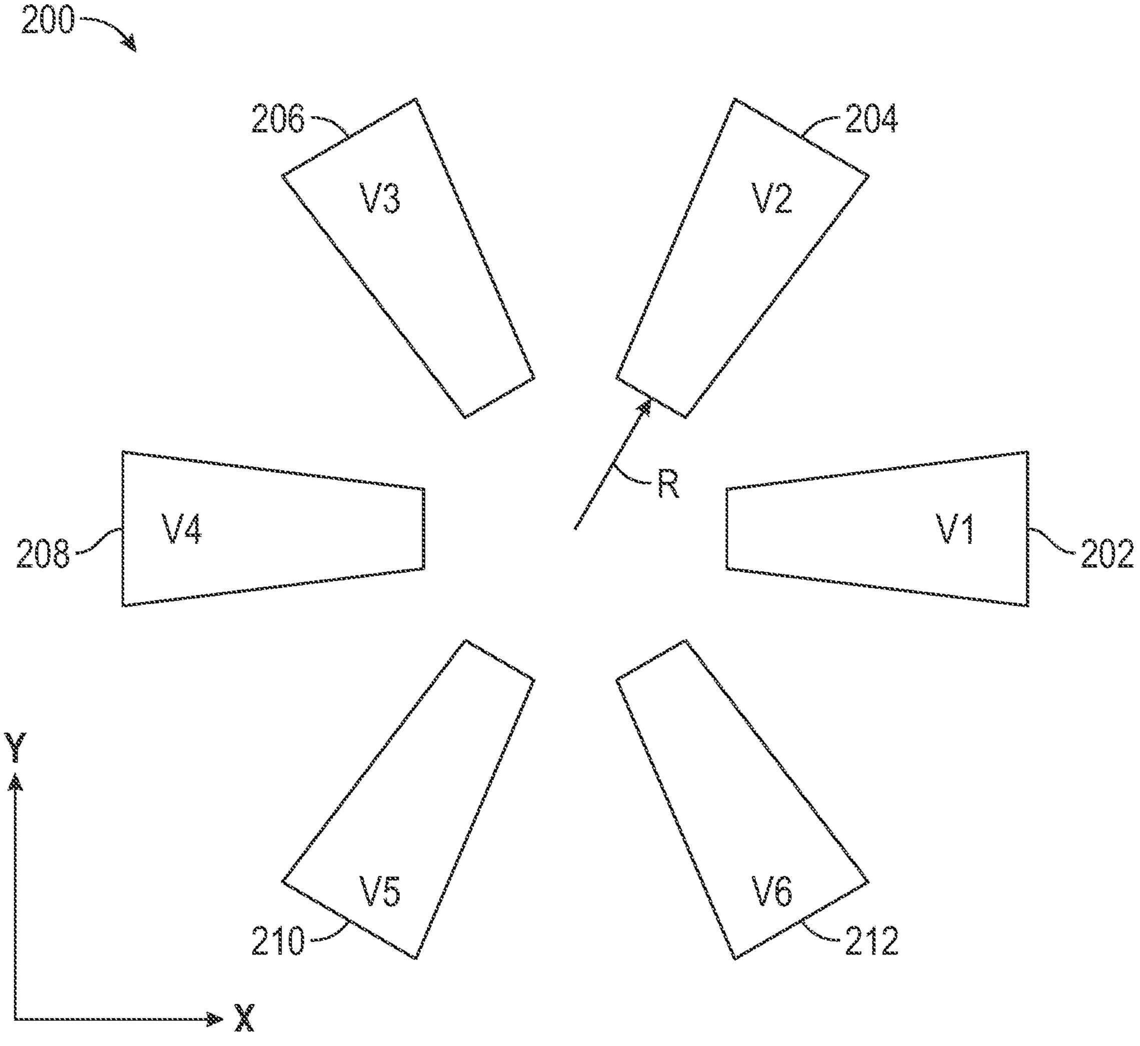
FIG. 2 is a front elevation view of an electrostatic hexapole-generating element according to an example.

As an example, FIG. 2 illustrates an example of an electrostatic hexapole-generating element 200 that includes six electrodes 202, 204, 206, 208, 210, and 212 to which respective voltages $V_1, V_2, \ldots, V_6$ can be applied. With one such hexapole-generating element, one can generate dipole and quadrupole electrostatic fields of any orientation in the xy-plane and/or a hexapole field of fixed orientation.

We consider Cc-correcting devices in which the curved deflector optical axis lies in one plane, and we define the y-axis to be perpendicular to that plane. If we exclude the small multipole fields that are needed to correct for the effect of mechanical errors (i.e., ignoring parasitic aberrations), then all electrostatic multipole potentials are symmetric in y; that is, $\phi(x, y, z)=\phi(x, -y, z)$, in which case the hexapole potential is given by $\phi_3(x, y, z)=\alpha_3(z)(x^3-3xy^2)$+fringe field terms.

FIG. 2 illustrates an example in which the electrostatic field generated by the hexapole-generating element 200 is tunable via selection of the voltages applied to each electrode. In particular, a hexapole field is generated if $V_1=V_3=V_5=V$ and $V_2=V_4=V_6=-V$. Alternatively, a dipole field Ex is generated if $V_1=V$, $V_2=V/2$, $V_3=-V/2$, $V_4=-V$, $V_5=-V/2$, and $V_6=V/2$ and a dipole field $E_y$ is generated if $V_1=0$, $V_2=V$, $V_3=V$, $V_4=0$, $V_5=-V$, and $V_6=-V$. Similarly, any linear combination of dipole, quadrupole, and/or hexapole fields can be generated. In other examples, and as discussed in more detail below, the shapes of the electrodes of a multipole element can generate a multipole field of fixed orientation corresponding to such shapes.

An electrostatic multipole potential of multiplicity m that satisfies the symmetry condition $\phi_m(x, y, z)\ \phi_m(x, -y, z)$ is given by $$\phi_m(x, y, z) = a_m(z)\mathrm{Re}[(x+iy)^m] = a_m(z)r^m\cos(m\varphi) \tag{1}$$

excluding fringe field terms, and with $x=r\cos(\theta)$ and $y=r\sin(\theta)$. The multiplicity m takes the value m=1 for dipole fields, m=2 for quadrupole fields, etc. Without the symmetry condition, equation (1) extends to $$\phi_m(x, y, z) = a_m(z)\mathrm{Re}[(x+iy)m] + b_m(z)\mathrm{Im}[(x+iy)^m] = a_m(z)r^m\cos(m\varphi) + b_m(z)r^m\sin(m\varphi). \tag{2}$$

First Order Rays

First order rays of the charged particle beam, also known as Gaussian rays, can be characterized by five ray parameters. One such parameter is the relative energy spread $\kappa=\Delta U/U$. The remaining four parameters typically represent orthogonal components of the position and angle of the ray in a given plane, such as the specimen plane $z=z_S$ in which the sample is positioned. In particular, these parameters can be represented as the x and y components of the ray in the sample plane, represented as $x_s$ and $y_s$, respectively, as well as the angles of the x and y components of the ray in the sample plane, represented as $x'_s=\alpha$ and $y'_s=\beta$, respectively.

Figure 4:
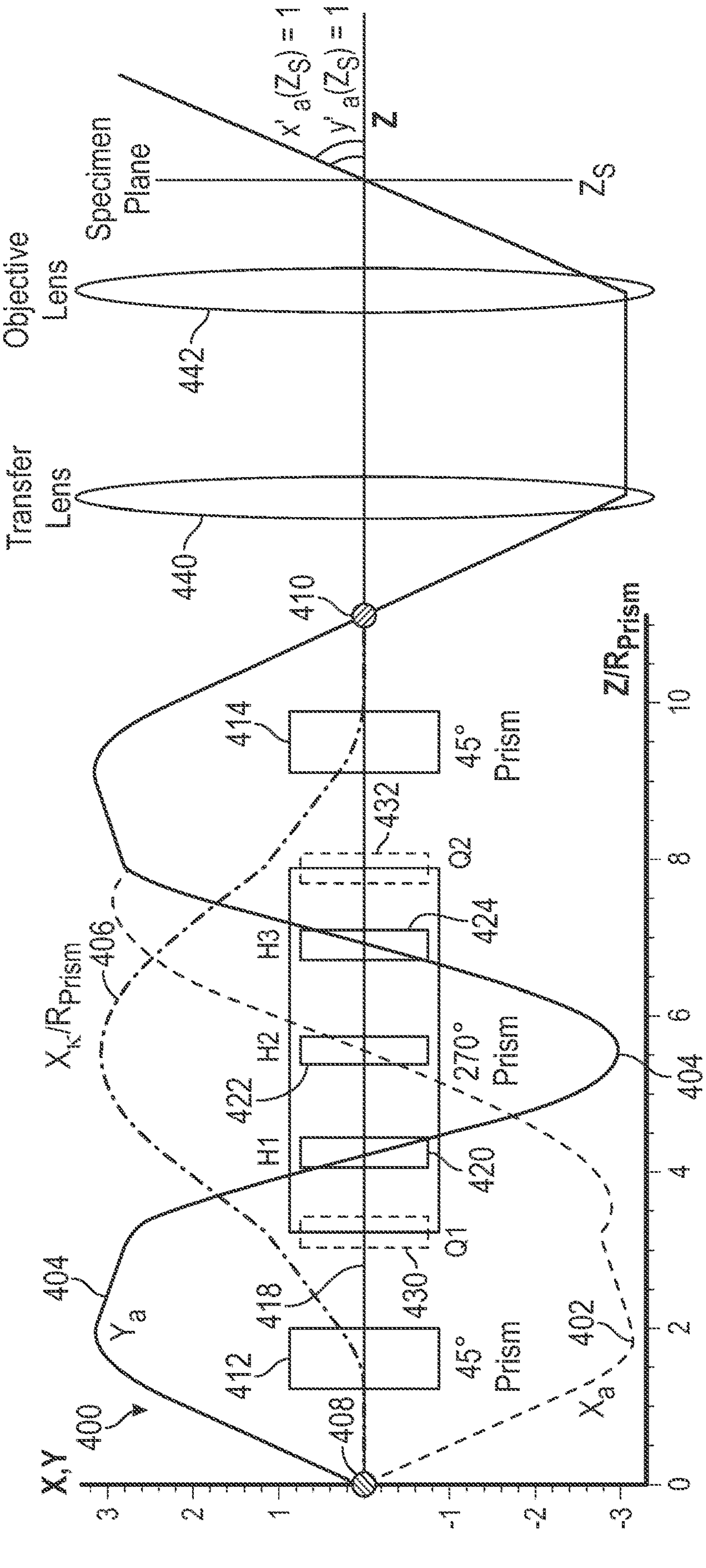
FIG. 4 is an illustration of the fundamental rays of a charged particle beam with respect to a straightened optical axis of the aberration correction system of FIG. 3 according to an example.

Ignoring the off-axial fundamental ray components that are less relevant to a probe-forming system, the first order rays thus can be represented as $$x(z) = \alpha \cdot x_\alpha(z) + \kappa \cdot x_\kappa(z) \quad (3)$$

and $$y(z) = \beta \cdot y_\alpha(z), \quad (4)$$

where $x_\alpha(z)$ and $y_\alpha(z)$ represent axial rays and $x_\kappa(z)$ represents a dispersion ray. Examples of such rays are illustrated in FIG. 4, discussed below.

Axial Geometric Aberrations

Geometric axial aberrations of the charged particle beam in the specimen plan can be defined via a phase function $S(\alpha, \beta)$, in which $\alpha=x'=dx/dz$ and $\beta=y'=dy/dz$. This function features as $\exp(i2\pi\lambda^{-1}S(\alpha, \beta))$ in wave-optical expressions, in which $\lambda$ is the charged particle wavelength. Excluding parasitic aberrations, $S(\alpha, \beta)$ contains only even powers of $\beta$, due to the symmetry of the electrostatic potential, and is then given by $$S(\alpha,\beta) = \frac{1}{2}C_1(\alpha^2+\beta^2) + \frac{1}{2}A_{1r}(\alpha^2-\beta^2) + B_{2r}\alpha(\alpha^2+\beta^2) + \frac{1}{3}A_{2r}(\alpha^3-3\alpha\beta^2) + \frac{1}{4}C_3(\alpha^2+\beta^2) + S_{3r}(\alpha^2-\beta^2)(\alpha^2+\beta^2) + \frac{1}{4}A_{3r}(\alpha^4-6\alpha^2\beta^2+\beta^4) + \frac{1}{6}C_5(\alpha^2+\beta^2)^3 + \ldots \quad (5)$$

If parasitic aberrations are included, then an extension of equation (5) is needed, in which all aberration coefficients except $C_1$, $C_3 \equiv C_S$, and $C_5$ are complex. For example, the terms for coma $B_{2r}$ and three-fold astigmatism $A_{2r}$ then extend to $$\mathrm{Re}(B_2\omega^2\overline{\omega}) + \frac{1}{3}\mathrm{Re}(A_2\overline{\omega}^3), \quad (6)$$

in which $B_2=B_2r+iB_{2i}$, $A_2=A_2r+iA_{2i}$, $\omega=\alpha+i\beta$, and $\overline{\omega}=\alpha-i\beta$. Third-order aberrations are spherical aberration $C_3$, star aberration $S_{3r}$ (which is two-fold), and four-fold astigmatism $A_{3r}$. Position aberrations in the specimen plane are given by $\delta x=\partial S/\partial\alpha$ and $\delta y=\partial S/\partial\beta$. The equivalent equation in complex notation is $\delta u=\delta x+i\delta y=2\partial S(\omega, \overline{\omega})/\partial\overline{\omega}$. For example, second-order aberrations are given by $$x = (3B_{2r}+A_{2r})\alpha^2 + (B_{2r}-A_{2r})\beta^2 \equiv \langle x\,|\,\alpha^2\rangle\alpha^2 + \langle x\,|\,\beta^2\rangle\beta^2, \quad (7)$$

$$y = 2(B_{2r}-A_{2r})\alpha\beta \equiv \langle y\,|\,\alpha\beta\rangle\alpha\beta. \quad (8)$$

In these equations, the $\langle\,.\,|..\,\rangle$ notation is used to represent aberration coefficients that do not have well established symbols. For example, in an expression of the form $\delta x=c_1\alpha^2+c_2\beta^2$, the coefficients can be denoted as $c_1=\langle x|\alpha^2\rangle$ and $c_2=\langle x|\beta\rangle$.

Off-Axial Geometric Aberrations

While geometric axial aberrations are particularly relevant to a probe-forming charged particle beam, off-axial aberrations also are relevant. For example, off-axial aberrations can determine a sensitivity of components of the charged particle microscope to drift of the incoming charged particle beam. Additionally, for sufficiently small off-axial aberrations, alternating current (AC) scanning advantageously can be done partly upstream of the aberration correction system.

All geometric aberrations can be conveniently described by an image-side perturbation eikonal function $S(\alpha, \beta, x_S, y_S)$, in which the additional ray parameters $x_S$ and $y_S$ are defined in the specimen plane $z=z_S$. The function $S(\alpha, \beta, 0,0)$ is equal to the phase function $S(\alpha, \beta)$ presented in equation (5). The relations $$\delta x = \partial S/\partial\alpha \quad (9)$$

and $$\delta y = \partial S/\partial\beta$$

remain valid; additionally, angle aberrations are given by $$\delta x' = -\partial S/\partial x_S \text{ and } \delta y' = -\partial S/\partial y_S. \quad (10)$$

For correctors according to the present disclosure, second-order aberrations are most relevant. Ignoring parasitic aberrations, the corresponding image-side eikonal is given by $$S_2(\alpha,\beta,x_S,y_S) = B_{2r}\alpha(\alpha^2+\beta^2) + \frac{1}{3}A_{2r}(\alpha^3-3\alpha\beta^2) + \frac{1}{2}\langle x|\alpha x_S\rangle\alpha^2 x_S + \frac{1}{2}\langle y|\beta x_S\rangle\beta^2 x_S + \langle x|\beta y_S\rangle\alpha\beta y_S, \quad (11)$$

$$\langle .|..\rangle\delta x = \langle x|\alpha x_S\rangle\alpha x_S + \langle x|\beta y_S\rangle\beta y_S \quad (12)$$

which features five independent coefficients. The three off-axial aberration coefficients yield $\langle .|..\rangle$ and $$\delta y = \langle y|\beta x_S\rangle\beta x_S + \langle x|\beta y_S\rangle\alpha y_S. \quad (13)$$

Unless all three off-axial coefficients are zero, beam drift above the corrector (resulting in nonzero $x_S$ and/or $y_S$) thus will induce defocus and/or astigmatism, i.e., the aberrations that are first-order in $\alpha$ and $\beta$. As a result of equation (10), the three off-axial aberration coefficients are determined via the angle aberrations of the axial beam:

$$\delta x' = -\frac{1}{2}\langle x|\alpha x_S\rangle\alpha^2 - \frac{1}{2}\langle y|\beta x_S\rangle\beta^2 \text{ and } \delta y' = -\langle x|\beta y_S\rangle\alpha\beta. \quad (14)$$

$$\text{Hence, } \langle x'|\alpha^2\rangle = -\frac{1}{2}\langle x|\alpha x_S\rangle,\ \langle x'|\beta^2\rangle = -\frac{1}{2}\langle y|\beta x_S\rangle, \text{ and } \langle y'|\alpha\beta\rangle = -\langle x|\beta y_S\rangle.$$

Third order off-axial aberrations also can be relevant; the corresponding terms in the perturbation eikonal function are then proportional to $\alpha^3 x_S$, $\alpha\beta^2 X_S$, $\alpha^2\beta y_S$, and $\beta^3 y_S$, for inherent aberrations only. Also in this case, angle aberrations of the axial beam provide these off-axial aberrations. Mirror symmetry in the xz-plane corresponds to the constraint that the terms $$\ldots \beta^n y_S^m$$

only appear if n+m is an even number.

Chromatic Aberrations

The axial chromatic aberration of round lenses is characterized by the coefficient $C_c$, with corresponding aberrations $$\delta x = -C_c \alpha \frac{\Delta U}{U} = -C_c \alpha\kappa \text{ and } \delta y = -C_c \beta\kappa, \quad (15)$$

in which eU equals the electron energy. For correctors according to the present disclosure, this is generalized to $$\delta x = -C_{cx}\alpha\kappa \text{ and } \delta y = -C_{cy}\beta\kappa. \quad (16)$$

Alternatively, in examples in which $C_{cx} \neq C_{cy}$, one can use the chromatic aberration coefficient $C_c=(C_{cx}+C_{cy})/2$ and the chromatic astigmatism coefficient $A_{1\kappa,r}=(C_{cx}-C_{cy})/2=\mathrm{Re}(A_{1\kappa})$, so in general $\delta u=\delta x+i\delta y=-C_c\omega\kappa+A_{1\kappa}\bar{\omega}\kappa$, in which $\omega=\alpha+i\beta$.

Correctors according to the present disclosure can be designed such that the charged particle beam exiting the corrector is completely free of dispersion. Stated differently, the dispersion ray can coincide with the optical axis below the corrector such that the first-degree aberrations $\langle x|\kappa\rangle$ and $\langle x'|\kappa\rangle$ are zero here, and in particular at the sample.

In the present disclosure, aberrations may be characterized by an order and/or a degree. In particular, as used herein, the term "order" corresponds to the geometric part of the aberration, while the term "degree" refers to the power of $\kappa$ in an aberration. As an example, the chromatic aberration coefficient $C_c$ represents an aberration of order 1 and degree 1. As another example, the spherical aberration coefficient $C_3$ represents an aberration of order 3 and degree 0. Additionally, as used herein, the term "rank" represents the sum of the order and the degree of an aberration.

Second Rank Aberrations

For a perfect device, all relevant second rank aberrations can be derived from the image-side perturbation eikonal $$S_2(\alpha, \beta, \kappa) = B_{2r}\alpha(\alpha^2+\beta^2) + \frac{1}{3}A_{2r}(\alpha^3 - 3\alpha\beta^2) + \frac{1}{2}C_{cx}\alpha^2\kappa + \frac{1}{2}C_{cy}\beta^2\kappa + \langle x|\kappa^2\rangle\alpha\kappa^2 + \frac{1}{2}\langle x|\alpha x_S\rangle\alpha^2 x_S + \frac{1}{2}\langle y|\beta x_S\rangle\beta^2 x_S + \langle x|\beta y_S\rangle\alpha\beta y_S, \quad (17)$$

in which the first line contains the axial aberration coefficients, and in which the second line contains the (only geometric) off-axial aberration coefficients. The ray angles $\alpha=x'(z_S)$ and $\beta=y'(z_S)$ represent ray angles in the specimen plane $z=z_S$, while $x_S$ and $y_S$ are position coordinates in the specimen plane, $\kappa=\Delta U/U$ represents the relative energy deviation, and position aberrations in the specimen plane are given by $\delta x=\partial S/\partial\alpha$ and $\delta y=\partial S/\partial\beta$.

Second rank parasitic aberrations can be represented as $$S_{2,par.}(\alpha, \beta, \kappa) = -B_{2i}\beta(\alpha^2+\beta^2) + \frac{1}{3}A_{2i}(3\alpha^2\beta - \beta^3) + \quad (18)$$

-continued $$A_{1i,\kappa}\alpha\beta\kappa + \frac{1}{2}\langle x|\alpha y_S\rangle\alpha^2 y_S + \frac{1}{2}\langle y|\beta y_S\rangle\beta^2 y_S + \langle x|\beta x_S\rangle\alpha\beta x_S.$$

The latter three off-axial aberrations generally are negligible and need not be considered in the design of the corrector.

First Rank Aberrations

Aside from parasitic defocus and astigmatism $C_1$ and $A_1$, which can be trivially nullified, the first-degree parasitic dispersion is important:

$$S_{1,par.} = \langle x|\kappa\rangle\alpha\kappa + \langle y|\kappa\rangle\beta\kappa \quad (19)$$

$$\delta x = \langle x|\kappa\rangle\kappa \quad (20)$$

$$\delta y = \langle y|\kappa\rangle\kappa \quad (21)$$

Hexapole Fields for Second Rank Aberrations

In an ideal device, hexapole fields can affect the axial second rank aberrations $A_{2r}$, $B_{2r}$, $C_{cx}$, $C_{cy}$, and $\langle x|\kappa^2\rangle$. If desired, additional hexapole fields can be applied to reduce or nullify one or more of the off-axial aberration coefficients $\langle x|\alpha y_S\rangle$, $\langle y|\beta y_S\rangle$, and $\langle x|\beta x_S\rangle$, in order to make the corrector insensitive to drift of the charged particle beam above the corrector.

For an actual device subject to parasitic aberrations, additional hexapole fields may be needed to nullify $A_{2i}$ and $B_{2i}$, preferably in regions in which $x_\kappa=0$. Additional hexapole fields also may be needed to nullify the chromatic astigmatism component $A_{1\kappa i}$. The corresponding hexapole potentials then are of the form $$\phi_3(x, y, z) = \tilde{\alpha}_3(z)(y^3 - 3x^2y) + \text{fringe field terms.} \quad (22)$$

Aberrations Induced by Thin Multipoles

For a multipole element of relatively short length L positioned at $z=z_M$, the hexapole potential of the multipole element in the sharp cutoff of fringe fields (SCOFF) approximation is given by $$\phi_3 = a_3(x^3 - 3xy^2) \quad (23)$$

for $z_M-L/2<z<z_M+L/2$, and $\phi_3=0$ outside this region. In other words, $\alpha_3(z)$ is a "rectangular" or "top-hat" function. Electrode voltages lie approximately within the range $\pm\alpha_3R^3$, where R is the inner radius of the multipole element. The electric field is given by $E_x=-\partial\phi_3/\partial_x$ and $E_y=-\partial\phi_3/\partial_y$. To good approximation, the hexapole field induces small deflection angles $$\theta_x = \frac{3L}{2U}a_3(x^2 - y^2) \text{ and} \quad (24)$$

$$\theta_y = -\frac{3L}{U}a_3xy,$$

and the resulting second rank aberrations in the specimen plane $z=z_S$ are then given by $$\delta x = -\theta_x \cdot x_a(z_M) = -\frac{3L}{2U} a_3 (x^2 - y^2) \cdot x_a(z_M) \text{ and } \quad (25)$$

$$\delta y = \frac{3L}{U} a_3 xy \cdot y_a(z_M),$$

in which the lateral electron position (x, y) is given by $$x(z) = \alpha \cdot x_a(z_M) + \kappa \cdot x_\kappa(z_M) \text{ and } \quad (26)$$

$$y(z) = \beta \cdot y_a(z_M).$$

As an example, for a hexapole field at $z=z_M$ at which there is no dispersion (i.e., $x_\kappa(z_M)=0$) and at which the axial beam is round (i.e., $x_\alpha(z_M)=y_\alpha(z_M)\equiv x_\alpha$), then equations (25) and (26) yield $$\delta x = -\frac{3L}{2U} a_3 x_a^3 \cdot (\alpha^2 - \beta^2) \text{ and } \delta y = \frac{3L}{2U} a_3 x_a^3 \cdot 2\alpha\beta, \quad (27)$$

such that the real part of the coefficient for three-fold astigmatism $A_{2r}$ in the specimen plane is given by $$A_{2r} = -\frac{3La_3}{2U} x_a^3. \quad (28)$$

Generalizing to a case in which $x_\alpha(z_M) \neq \phi y_\alpha(z_M)$ and in which $x_\kappa(z_M)=0$, the results for astigmatism $A_{2r}$ and coma $B_{2r}$ are $$A_{2r} = -\frac{3La_3}{8U} x_a (x_a^2 + 3y_a^2) B_{2r} = \frac{3La_3}{8U} x_a (y_a^2 - x_a^2). \quad (29)$$

Generally, for nonzero dispersion in the thin multipole element (i.e., $x_K \neq 0$), the axial second rank aberrations induced by a hexapole field are $A_{2r}$, $B_{2r}$, $C_{cx}$, $C_{cy}$, and second degree dispersion $\langle x|\kappa^2\rangle$.

Chromatic Aberration Correction in the yz-Plane

In many examples, the fundamental ray $x_\alpha(z_{mid})=0$ in the corrector mid-plane $z=z_{mid}$, and $y_\alpha(z_{mid})$ and $X_\kappa(z_{mid})$ are large there. In such examples, $C_c$-correction in the yz-plane preferably is performed with a tunable hexapole-generating element in the corrector mid-plane. Assuming equal radius $R_{prism}$ for all electrostatic prisms, $x_\kappa(z_{mid}) - g_1 R_{prism}$, in which $1|g_1|\sim 2$ for the alpha-type correctors discussed below and $|g_1|\sim 3$ for the omega-type correctors discussed below. Combining equations (22) and (23) yields $$\delta y = \frac{3La_3}{U} x_\kappa y_a^2 \cdot \kappa\beta \quad (30)$$

in the specimen plane, with $y_\alpha=y_a(z_{mid})$ and $x_\kappa=x_\kappa(z_{mid})$. With reference to equation (16), it can be seen that $$C_{cy} = -\frac{3La_3}{U} x_\kappa y_a^2, \quad (31)$$

where the sign is determined by the hexapole polarity (i.e., the sign of $\alpha_3$). As a result, the mid-plane hexapole field can nullify $C_{cy}$ of the full optical column.

In the xz-plane, the mid-plane hexapole field induces an angle $$\theta_x = \frac{3La_3}{2U} (x_\kappa^2 \kappa^2 - y_a^2 \beta^2). \quad (32)$$

This does not lead to a position aberration $\delta x$, because the mid-plane is imaged onto the specimen plane in the xz-plane, but the second term ($\propto\beta^2$) does result in an angle aberration of the axial beam, which translates into an off-axial aberration as outlined above. The corresponding aberration coefficient is $(y|\beta x_s)$; the eikonal term $$\frac{1}{2}\langle y|\beta x_s\rangle \beta^2 x_s$$

leads to $$\delta x' = -\frac{1}{2}\langle y|\beta x_s\rangle \beta^2$$

and $\delta y=(y|\beta x_s)\beta x_s$ in the specimen plane. Accordingly, if the charged particle source drifts in (for example) the x-direction, this leads to defocus in the yz-plane. In some examples, this off-axial aberration can be nullified, such as by applying a hexapole field in a similar line focus (i.e., where $x_\alpha=0$) in a position at which there is little or no dispersion (i.e., where $x_\kappa$ is small).

Chromatic Aberration Correction in the xz-Plane

In some examples, chromatic aberration correction in the xz-plane is performed with two hexapole fields, positioned at two line foci at $z=z_A$ and $z=z_c$, where $y_\alpha(z_A) - y_\alpha(z_c)=0$. Additionally, in such examples, $x_\kappa(z_A) - x_\kappa(z_c) x_\kappa$ and $x_\alpha(z_A) - x_\alpha(z_c)\ x_\alpha$. Pure correction of $C_{cx}$ requires a symmetric excitation of both hexapole fields, but it is useful to treat the general case in which the hexapole excitations are $\alpha_3+\epsilon$ at $z=z_A$ and $\alpha_3-\epsilon$ at $z=z_c$.

These hexapole fields only cause a deflection at $\theta_x$:

$$\theta_x(z_A) = \frac{3L}{2U}(a_3 + \epsilon)(\alpha x_a + \kappa x_\kappa)^2 \text{ and } \quad (33)$$

$$\theta_x(z_C) = \frac{3L}{2U}(a_3 - \epsilon)(-\alpha x_a + \kappa x_\kappa)^2.$$

Accordingly, the total position aberration in the specimen plane is given by $$\delta x = -\frac{3L}{2U}\left(-x_a \cdot (a_3 + \epsilon)(\alpha x_a + \kappa x_\kappa)^2 + x_a \cdot (a_3 - \epsilon)(-\alpha x_a + \kappa x_\kappa)^2\right) \quad (34)$$

$$= -\frac{3L}{U}\left(2x_\kappa x_a^2 a_3 \cdot \kappa\alpha + \epsilon\left(x_a^2 \cdot \alpha^2 + x_\kappa^2 \cdot \kappa^2\right)\right).$$

For symmetric excitation (i.e., $\epsilon=0$), there is only one aberration:

$$C_{cx} = \frac{6La_3}{U} x_\kappa x_a^2. \quad (35)$$

Equation (34) shows that an asymmetric excitation can be used to tune second-degree dispersion $\langle x|\kappa^2\rangle$, but that such an excitation also generates the second-order aberration $(x|\alpha^2)$, which must be compensated elsewhere. Such compensation can be performed in another location of line focus of the charged particle beam, where also $y_\alpha=0$ and where there is little to no dispersion, i.e., where $x_\kappa \approx 0$. In such an example, a hexapole field in this line focus can primarily or exclusively generate a counterbalancing aberration coefficient $(x|\alpha^2)$.

Such hexapole fields also can cause an off-axial aberration with corresponding aberration coefficient $\langle x|\alpha x_S\rangle$. The eikonal term $$\frac{1}{2}\langle x|\alpha x_s\rangle\alpha^2 x_s$$

results in both $$\delta x' = -\frac{1}{2}\langle x|\alpha x_s\rangle\alpha^2$$

and $\delta x=\langle x|\alpha x_S\rangle\,\alpha x_S$ in the specimen plane. This off-axial aberration does not occur in the omega-type examples discussed below, because the two hexapole fields that correct for $C_{cx}$ are imaged onto each other not only in the yz-plane but also in the xz-plane, such that the second-order geometric aberrations cancel each other completely.

Chromatic Aberration Corrector Examples

Figure 3:
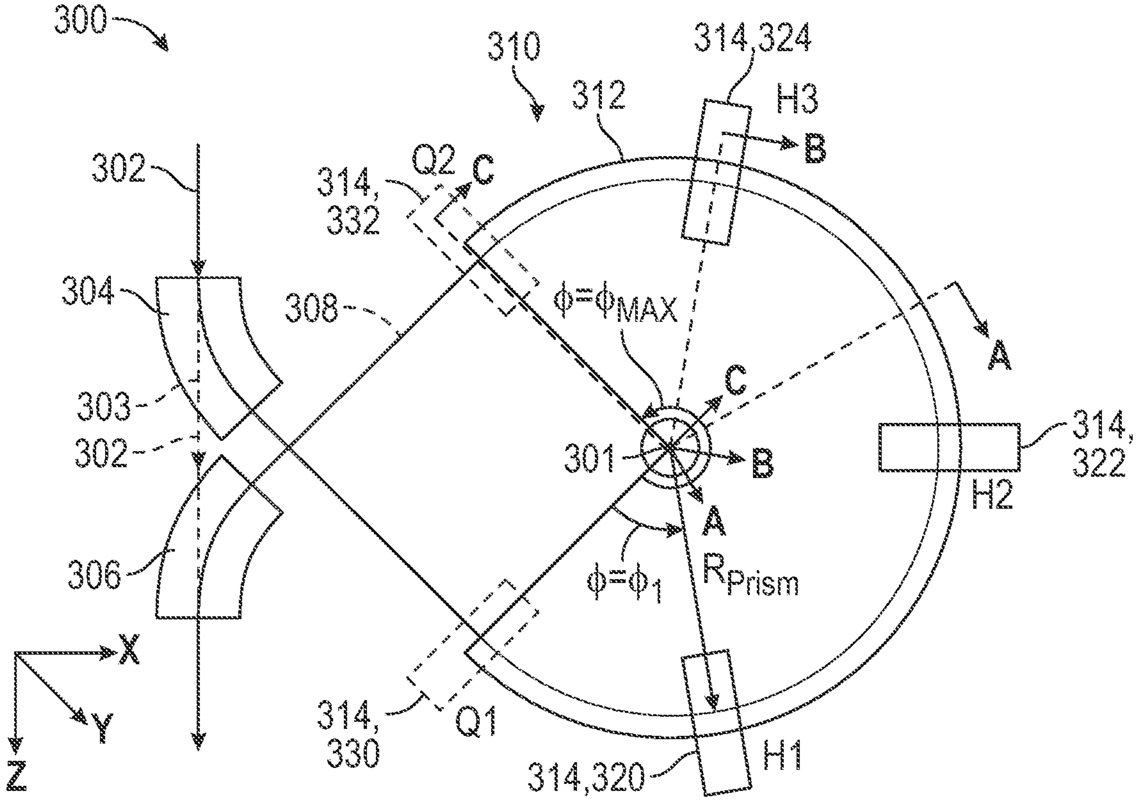
FIG. 3 is a schematic side elevation view of an aberration correction system according to an example.

FIG. 3 illustrates an aberration correction system 300 for at least partially correcting an axial chromatic aberration of a charged particle beam 302. The aberration correction system 300 may be described as representing an example of the aberration correction system 120 of FIG. 1. Similarly, the charged particle beam 302 can include and/or be the charged particle beam 104 of FIG. 1.

As shown in FIG. 3, the aberration correction system 300 includes a deflector assembly 310 that includes a corrector electrostatic prism 312 and a plurality of electrostatic multipole elements 314. As shown in FIG. 3, the deflector assembly 310 can define a deflector optical axis 308 such that the charged particle beam 302 travels along the deflector optical axis 308 as the charged particle beam 302 traverses the aberration correction system 300. The deflector assembly 310 thus may be configured to at least partially correct an axial chromatic aberration in the charged particle beam 302 as the charged particle beam 302 travels along the deflector optical axis 308. In the example of FIG. 3, the deflector optical axis 308 is a curved axis that is circular within the corrector electrostatic prism 312. Within the corrector electrostatic prism 312, the circular path of the deflector optical axis 308 can be characterized by a prism radius $R_{prism}$, as measured between a central axis 301 of the corrector electrostatic prism 312 and the deflector optical axis 308.

The corrector electrostatic prism 312 can be configured to generate at least a portion of an electrostatic deflection field associated within the corrector electrostatic prism 312 that directs the charged particle beam 302 along the curved deflector optical axis 308. The electrostatic deflection field can include a prism hexapole field, such as may be generated by at least a subset of the plurality of electrostatic multipole elements 314.

As shown in FIG. 3, the aberration correction system 300 additionally includes an entry electrostatic prism 304 configured to direct (e.g., deflect) the charged particle beam 302 toward and/or to the deflector optical axis 308, such as from an optical column axis 303, and an exit electrostatic prism 306 configured to direct (e.g., deflect) the charged particle beam 302 from the deflector optical axis 308, such as toward and/or to the optical column axis 303. The optical column axis 303 may represent at least a portion of the optical column axis 112 of FIG. 1. In this manner, the optical column axis 303 may be described as excluding the deflector optical axis 308 such that the deflector optical axis 308 represents and/or includes a path of a portion of the charged particle beam 302 that is deflected away from the optical column axis 303.

The entry electrostatic prism 304 and the exit electrostatic prism 306 each may have any of a variety of structures and/or configurations for directing the charged particle beam 302 as described. In some examples, each of the entry electrostatic prism 304 and the exit electrostatic prism 306 is configured to deflect the charged particle beam 302 through an angle that is equal, or approximately equal, to 45 degrees. This is not required, however, and it additionally is within the scope of the present disclosure that the entry electrostatic prism 304 and the exit electrostatic prism 306 each can deflect the charged particle beam 302 through an angle that is greater than or less than 45 degrees. Additionally or alternatively, in some examples, the entry electrostatic prism 304 and the exit electrostatic prism 306 can be configured to deflect the charged particle beam 302 by different amounts (e.g., through respective angles that are different from one another).

In some examples, one or both of the entry electrostatic prism 304 and the exit electrostatic prism 306 is a double-focusing prism. Additionally or alternatively, in some examples, one or both of the entry electrostatic prism 304 and the exit electrostatic prism 306 can be characterized by focusing action that is different in different planes (e.g., in the xz-plane and in the yz-plane as shown in FIG. 3).

In some examples, the entry electrostatic prism 304 and the exit electrostatic prism 306 can be configured to selectively direct the charged particle beam 302 to travel along the deflector optical axis 308 or alternatively to bypass the corrector electrostatic prism 312 (e.g., to continue traveling along the optical column axis 303). For example, the aberration correction system 300 can be configured to be selectively operated in each of a correction mode, in which the entry electrostatic prism 304 directs the charged particle beam 302 toward the deflector optical axis 308, and a straight-axis mode, in which the charged particle beam bypasses the deflector assembly 310. In some such examples, and as shown in dashed lines in FIG. 3, the aberration correction system 300 can be configured such that, when the aberration correction system 300 is in the straight-axis mode, the charged particle beam 302 travels through each of the entry electrostatic prism 304 and the exit electrostatic prism 306 without deflection. This can be accomplished, for example, by configuring each of the entry electrostatic prism 304 and the exit electrostatic prism 306 to include apertures and/or passages through which the charged particle beam 302 can pass without deflection when no deflecting voltage is applied to each prism.

In the present disclosure, a particle beam (e.g., the charged particle beam 104 and/or the charged particle beam 302) may be described as traveling "along" a direction and/or axis (e.g., the emission axis 106, the optical column axis 112, the optical column axis 303, and/or the deflector optical axis 308) even when and/or where at least a portion of the particle beam spatially departs from the direction and/or axis. For example, and as discussed herein, a particle beam may be characterized by a nonzero spatial extent in a direction perpendicular to its direction of travel in at least a portion of a beam path of the particle beam. Accordingly, in the present disclosure, an axis along which a particle beam travels can refer to a path encompassed and/or surrounded by the particle beam and/or a path that characterizes an average motion of the particles of the particle beam. Additionally or alternatively, a curved axis along which a particle beam travels can be defined to coincide with the central axial ray of the particle beam; that is, a ray of the charged particle beam that travels exactly along a straight optical axis upstream of the curved optical axis prior to being deflected onto the curved optical axis. Stated differently, this central axial ray may be described as representing the ray at the center of the axial beam cone.

Additionally, in the present disclosure, an axis (e.g., the emission axis 106, the optical column axis 112, the optical column axis 303, and/or the deflector optical axis 308) characterizing a beam path of a particle beam (e.g., the charged particle beam 104 and/or the charged particle beam 302) can follow a curved trajectory. In particular, in the example of FIG. 3, the deflector optical axis 308 traversing the deflector assembly 310 may be described as being α-shaped (that is, shaped in a similar manner to the Greek letter alpha). Additionally, in the example of FIG. 3, a portion of the deflector optical axis 308 extending within the corrector electrostatic prism 312 follows a circular path. In the present disclosure, any example of an aberration correction system and/or of a deflector assembly thereof that is characterized by a deflector optical axis that is generally α-shaped can be referred to as an "alpha-type" system or assembly.

In the example of FIG. 3, the plurality of electrostatic multipole elements 314 includes a first hexapole-generating element 320, a second hexapole-generating element 322, a third hexapole-generating element 324, a first quadrupole-generating element 330, and a second quadrupole-generating element 332.

As shown in FIG. 3, at least a subset of the plurality of electrostatic multipole elements 314 (e.g., at least the first hexapole-generating element 320, the second hexapole-generating element 322, and the third hexapole-generating element 324) can be at least partially positioned and/or incorporated within the corrector electrostatic prism 312. In particular, while FIG. 3 shows each electrostatic multipole element 314 as partially overlapping the corrector electrostatic prism 312 for clarity, it is to be understood that each electrostatic also can be at least substantially and/or fully contained within the corrector electrostatic prism 312.

In some examples, each of the first hexapole-generating element 320, the second hexapole-generating element 322, and the third hexapole-generating element 324 includes six poles for generating a respective hexapole field (e.g., as a primary or sole multipole field). In other examples, one or more of the first hexapole-generating element 320, the second hexapole-generating element 322, and/or the third hexapole-generating element 324 can include more than six poles (e.g., eight poles) in order to generate small additional multipole fields (e.g., a rotated hexapole field) to nullify parasitic aberrations caused by mechanical errors. Additionally or alternatively, one or more of the electrostatic multipole elements 314 can be configured to generate small dipole fields and/or small quadrupole fields. Such dipole fields can operate to align the central ray of the charged particle beam 302. Such quadrupole fields can operate to align the first order rays of the charged particle beam 302 (e.g., the fundamental rays shown in FIG. 4, discussed below).

In some examples, a quadrupole-generating element of an aberration correction system according to the present disclosure (e.g., the first quadrupole-generating element 330 and/or the second quadrupole-generating element 332) can include four poles for generating a respective quadrupole field (e.g., as a primary or sole multipole field). In other examples, a quadrupole-generating element can include more or fewer than four poles.

In some examples, a multipole element of an aberration correction system according to the present disclosure can be configured to generate a corresponding multipole field as a result of a geometry of the multipole element and/or of a corresponding structure. For example, a portion of an electrostatic prism (e.g., the corrector electrostatic prism 312, the entry electrostatic prism 304, and/or the exit electrostatic prism 306) can be shaped such that application of deflecting voltages to the electrostatic prism yields a multipole field component in addition to the deflection electrostatic field.

As another example, a multipole element that is configured primarily to produce a first type of multipole field (e.g., a quadrupole field) may include poles that are shaped to additionally produce additional types of multipole fields (e.g., octupole fields, 12-pole fields, etc.). That is, while it often is desirable to configure a multipole element to produce a corresponding multipole field that is as "pure" as possible (e.g., to produce a hexapole field with minimal quadrupole, octupole, etc. field components), it also can be desirable in other instances to configure a single multipole element to produce a superposition of multiple multipole fields. In some examples, this can simplify the design of a system by enabling the use of fewer optical elements and/or applied voltages to produce the desired fields.

In the present disclosure, such geometry-related multipole fields may be described as being "fixed" and/or "static," in the sense that such fields are of a type and/or orientation that are fixed by the geometry of the corresponding structure. Such fields additionally or alternatively may be referred to herein as "auxiliary fields." Such auxiliary fields may be variable in magnitude by varying the voltages that are applied to the structures that produce such auxiliary fields; however, since such voltages typically are applied to achieve a different primary effect (e.g., deflection of a charged particle beam along a well-defined direction and/or production of a different primary multipole field), the magnitude of the auxiliary field generally is not independently variable. Accordingly, the desired configuration of an auxiliary field generally must be achieved through careful shaping of the corresponding structures rather than through control of applied voltages.

In some examples, and as shown in FIG. 3, each of the first quadrupole-generating element 330 and the second quadrupole-generating element 332 can be configured to produce a corresponding auxiliary quadrupole field (e.g., as a primary or sole multipole field). In particular, each of the first quadrupole-generating element 330 and the second quadrupole-generating element 332 can be at least partially defined by the corrector electrostatic prism 312, such as via suitable shaping of the corrector electrostatic prism 312 where the deflector optical axis 308 enters and exits the corrector electrostatic prism 312.

Each of the first hexapole-generating element 320, the second hexapole-generating element 322, and the third hexapole-generating element 324 primarily is configured to generate a respective hexapole field, but also can generate small, fine-tuning dipole and/or quadrupole fields. Specifically, the first hexapole-generating element 320 is configured to generate a first hexapole field, the second hexapole-generating element 322 is configured to generate a second hexapole field, and the third hexapole-generating element 324 is configured to generate a third hexapole field.

Similarly, each of the first quadrupole-generating element 330 and the second quadrupole-generating element 332 primarily is configured to generate a respective quadrupole field. Specifically, the first quadrupole-generating element 330 is configured to generate a first quadrupole field and the second quadrupole-generating element 332 is configured to generate a second quadrupole field.

In the Figures of the present disclosure, an electrostatic multipole element illustrated and/or represented in solid lines, such as the first hexapole-generating element 320, the second hexapole-generating element 322, or and the third hexapole-generating element 324 of FIG. 3, represents an electrostatic multipole element that is configured to generate corresponding multipole fields that are tunable (e.g., in orientation and/or magnitude). In such examples, the illustrated solid lines additionally or alternatively may be understood as representing the corresponding tunable multipole field. In such examples, and as described herein, such tunable multipole fields can be generated and/or configured in any of a variety of manners, such as by applying independently controllable voltages to respective poles of the multipole elements in order to generate a desired multipole field with one or more degrees of freedom.

Alternatively, in the Figures of the present disclosure, an electrostatic multipole element illustrated and/or represented in dashed lines, such as the first quadrupole-generating element 330 or the second quadrupole-generating element 332 of FIG. 3, represents an electrostatic multipole element that is configured to generate a corresponding auxiliary multipole field. In such examples, the illustrated dashed lines additionally or alternatively may be understood as representing the corresponding auxiliary multipole field. In such examples, and as described herein, such auxiliary multipole fields can be generated and/or configured in any of a variety of manners, such as via appropriate shaping of the electrodes of the associated multipole elements.

As shown in FIG. 3, the charged particle beam 302, the optical column axis 303, and/or the deflector optical axis 308 also may be characterized with reference to an x-axis, a y-axis, and a z-axis. In particular, the z-axis can be defined as a direction along which the deflector optical axis 308 is oriented at a given location along the deflector optical axis 308. The x-axis can be defined as a direction that is perpendicular to the z-axis at the given location along the deflector optical axis 308 and that extends within a plane within which the deflector optical axis 308 extends within the deflector assembly 310, while the y-axis can be defined as the direction mutually perpendicular to each of the x-axis and the z-axis.

As shown in FIG. 3, a location and/or position along a portion of the deflector optical axis 308 extending within the corrector electrostatic prism 312 can be characterized by a prism angle $\phi$ that can assume any value between zero and a maximum prism angle $\phi_{max}$. In particular, a prism angle of $\phi=0$ can correspond to a location at which the charged particle beam 302 enters the corrector electrostatic prism 312 along the deflector optical axis 308, while a prism angle of $\phi=\phi_{max}$ can correspond to a location at which the charged particle beam 302 exits the corrector electrostatic prism 312 along the deflector optical axis 308. In this manner, the angle $\phi_{max}$ may be described as representing the full angular extent of the corrector electrostatic prism 312 and/or the total angle through which the charged particle beam 302 is deflected as the charged particle beam 302 traverses the corrector electrostatic prism 312.

The angle $\phi_{max}$ can assume any of a variety of values. In particular, in the example of FIG. 3, the angle $\phi_{max}$ is equal, or approximately equal, to 270 degrees. This is not required of all examples, however, and it additionally is within the scope of the present disclosure that the angle $\phi_{max}$ can be less than or greater than 270 degrees.

In various examples, and as shown in FIG. 3, the sum of the angle $\phi_{max}$ and the respective angles through which the entry electrostatic prism 304 and the exit electrostatic prism 306 deflect the charged particle beam 302 is equal, or approximately equal, to 360 degrees such that the charged particle beam 302 travels along substantially the same direction upstream and downstream of the deflector assembly 310. Thus, in some examples, the corrector electrostatic prism 312 can be characterized by a maximum prism angle $\phi_{max}$=250 degrees, and each of the entry electrostatic prism 304 and the exit electrostatic prism 306 can be configured to deflect the charged particle beam 302 through a 55-degree angle. Alternatively, in some other examples, the corrector electrostatic prism 312 can be characterized by a maximum prism angle $\phi_{max}$=280 degrees, and each of the entry electrostatic prism 304 and the exit electrostatic prism 306 can be configured to deflect the charged particle beam 302 through a 40-degree angle.

The electrostatic multipole elements 314 of the deflector assembly 310 can have any of a variety of configurations relative to one another and/or relative to the corrector electrostatic prism 312. For example, and shown in FIG. 3, the first quadrupole-generating element 330 can be positioned along the deflector optical axis 308 between the entry electrostatic prism 304 and the first hexapole-generating element 320, while the second quadrupole-generating element 332 can be positioned along the deflector optical axis 308 between the third hexapole-generating element 324 and the exit electrostatic prism 306.

In the example of FIG. 3, the second hexapole-generating element 322 is positioned proximate to a midpoint of the deflector optical axis 308 within the corrector electrostatic prism 312. In particular, in the example of FIG. 3, the corrector electrostatic prism 312 is characterized by a maximum prism angle of $\phi_{max}$=270 degrees, such that the second hexapole-generating element 322 is positioned and/or centered at a prism angle of $\phi$=135 degrees.

Additionally, in the example of FIG. 3, each of the first hexapole-generating element 320 and the third hexapole-generating element 324 are angularly equidistant from the second hexapole-generating element 322 such that the deflector assembly 310 is mirror-symmetric in the mid-plane (i.e., about the center of the second hexapole-generating element 322). In particular, in the example of FIG. 3, the first hexapole-generating element 320 is positioned and/or centered at a prism angle of approximately $\phi$=58 degrees, while the third hexapole-generating element 324 is positioned and/or centered at a prism angle of approximately $\phi$=212 degrees. Such an arrangement is not required, however, and it additionally is within the scope of the present disclosure that the first hexapole-generating element 320 and the third hexapole-generating element 324 may be positioned at any suitable respective prism angles, such as at prism angles that correspond to locations at or near line foci of the charged particle beam 302 within the corrector electrostatic prism 312.

FIG. 4 illustrates examples of the fundamental rays $x_\alpha(z)$, $y_\alpha(z)$, and $x_\kappa(z)$, respectively labeled 402, 404, and 406, of a charged particle beam 400 that traverses an aberration correction system such as the aberration correction system 300 of FIG. 3. Stated differently, the charged particle beam 400 of FIG. 4 can include and/or be at least a portion of the charged particle beam 302 of FIG. 3. FIG. 4 shows the fundamental rays along a straightened optical axis 418 corresponding to the deflector optical axis 308 and/or the z-axis of FIG. 3. As shown in FIG. 4, a charged particle source generating the charged particle beam 400 (e.g., the charged particle source 102 of FIG. 1) is imaged onto a corrector entrance 408, while a corrector exit focus 410 is imaged onto a specimen or sample (e.g., the sample 132 of FIG. 1) in a specimen plane $z_S$ via suitable optics. In the example of FIG. 4, such optics include a transfer lens 440 and an objective lens 442, which can be similar to the transfer lenses 122 and/or the objective lens 128 of FIG. 1, respectively.

FIG. 4 additionally shows the locations of a first hexapole-generating element 420, a second hexapole-generating element 422, a third hexapole-generating element 424, a first quadrupole-generating element 430, and a second quadrupole-generating element 432 relative to the straightened optical axis 418 and relative to the fundamental rays 402, 404, and 406. The first hexapole-generating element 420, the second hexapole-generating element 422, the third hexapole-generating element 424, the first quadrupole-generating element 430, and the second quadrupole-generating element 432 of FIG. 4 correspond to the first hexapole-generating element 320, the second hexapole-generating element 322, the third hexapole-generating element 324, the first quadrupole-generating element 330, and the second quadrupole-generating element 332 of FIG. 3, respectively.

As shown in FIG. 4, the charged particle beam 400 exhibits a line focus in the xz-plane at locations proximate the first hexapole-generating element 420 and the third hexapole-generating element 424 and exhibits a line focus in the yz-plane at a location proximate the second hexapole-generating element 422.

FIG. 4 additionally shows the locations of an entry electrostatic prism 412, an exit electrostatic prism 414, and a corrector electrostatic prism 416, which correspond to the entry electrostatic prism 304, the exit electrostatic prism 306, and the corrector electrostatic prism 312 of FIG. 3, respectively.

Figure 5:
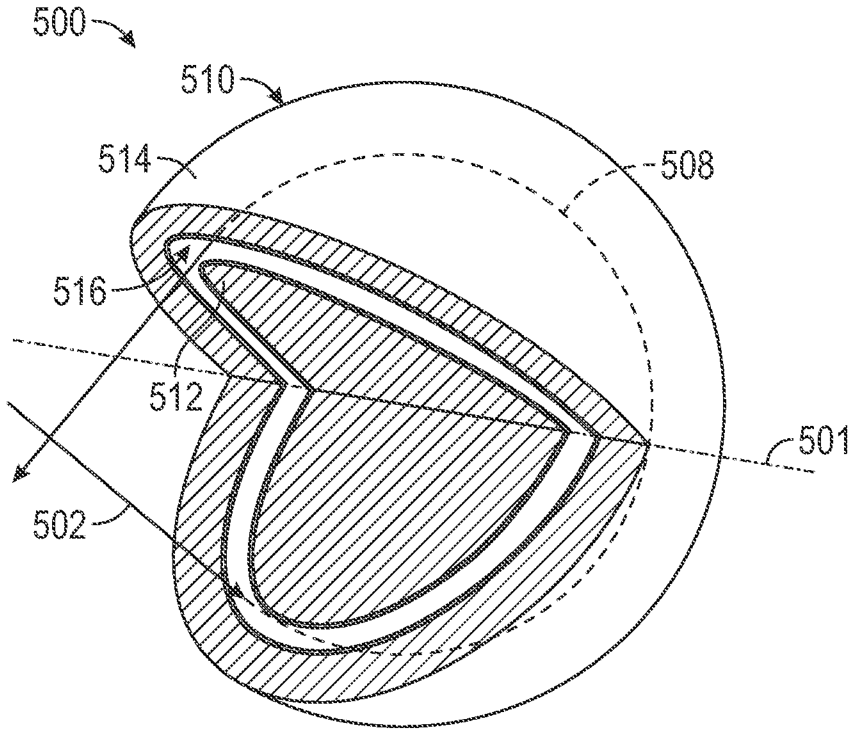
FIG. 5 is side perspective view of a corrector electrostatic prism according to an example.

The corrector electrostatic prism 312 of FIG. 3 and/or the corrector electrostatic prism 416 of FIG. 4 can have any suitable structure for deflecting the charged particle beam 302 and/or for supporting at least a subset of the plurality of electrostatic multipole elements 314. For example, FIG. 5 shows an example of a corrector electrostatic prism 500, which may be described as an example of the corrector electrostatic prism 312 of FIG. 3 and/or of the corrector electrostatic prism 416 of FIG. 4. In the example of FIG. 5, the corrector electrostatic prism 500 generally takes the shape of a solid of rotation about a central axis 501 (which may represent the central axis 301 of FIG. 3).

As shown in FIG. 5, the corrector electrostatic prism 500 can include a corrector prism body 510 with a first corrector prism electrode 512 and a second corrector prism electrode 514 positioned radially exteriorly of the first corrector prism electrode 512. In this manner, the first corrector prism electrode 512 also may be referred to as an inner corrector prism electrode 512, and/or the second corrector prism electrode 514 also may be referred to as an outer corrector prism electrode 514.

As shown in FIG. 5, the first corrector prism electrode 512 and the second corrector prism electrode 514 can be spaced apart to define an electrode gap 516 therebetween such that a deflector optical axis 508 along which a charged particle beam 502 travels extends within and/or through the electrode gap 516. The deflector optical axis 508 shown in FIG. 5 can include and/or be at least a portion of the deflector optical axis 308 of FIG. 3, and/or the charged particle beam 502 of FIG. 5 can include and/or be at least a portion of the charged particle beam 302 of FIG. 3.

The corrector electrostatic prism 500 can be configured such that, when a first electrode voltage is applied to the first corrector prism electrode 512 and a second electrode voltage is applied to the second corrector prism electrode 514, the corrector electrostatic prism 500 generates an electrostatic deflection field that directs the charged particle beam 502 to travel along the deflector optical axis 508 through the corrector electrostatic prism 500. As described in more detail herein, application of the first electrode voltage and the second electrode voltage to the corrector electrostatic prism 500 also can function to generate one or more auxiliary multipole fields (e.g., an auxiliary quadrupole field, an auxiliary hexapole field, an auxiliary octupole field, etc.), such as due to the geometry of the first corrector prism electrode 512 and/or the second corrector prism electrode 514.

Figure 6:
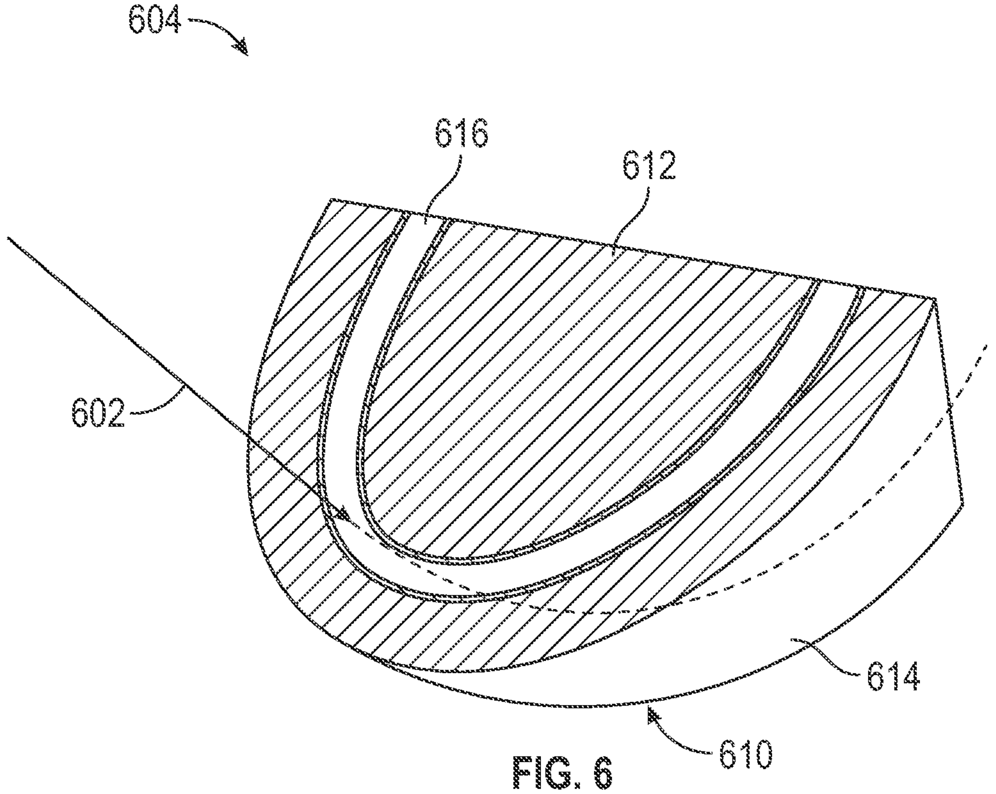
FIG. 6 is a side perspective view of an entry electrostatic prism according to an example.

Each of the entry electrostatic prism 304 and/or the exit electrostatic prism 306 of FIG. 3 also can have a structure similar to the corrector electrostatic prism 500 of FIG. 5. For example, FIG. 6 shows an example of an entry electrostatic prism 604, which may be described as an example of the entry electrostatic prism 304 of FIG. 3. In some examples, the structure shown in FIG. 6 additionally or alternatively may function as an exit electrostatic prism, such as the exit electrostatic prism 306 of FIG. 3. As shown in FIG. 6, the entry electrostatic prism 604 can include an entry prism body 610 with a first entry prism electrode 612 and a second entry prism electrode 614 positioned radially exteriorly of the first entry prism electrode 612. In this manner, the first entry prism electrode 612 also may be referred to as an inner entry prism electrode 612, and/or the second entry prism electrode 614 also may be referred to as an outer entry prism electrode 614.

As shown in FIG. 6, the first entry prism electrode 612 and the second entry prism electrode 614 can be spaced apart to define an electrode gap 616 therebetween such that a deflector optical axis 608 along which a charged particle beam 602 travels extends within and/or through the electrode gap 616. The deflector optical axis 608 shown in FIG. 6 can include and/or be at least a portion of the deflector optical axis 308 of FIG. 3, and/or the charged particle beam 602 of FIG. 6 can include and/or be at least a portion of the charged particle beam 302 of FIG. 3.

The corrector electrostatic prism 600 can be configured such that, when a first electrode voltage is applied to the first entry prism electrode 612 and a second electrode voltage is applied to the second entry prism electrode 614, the corrector electrostatic prism 600 generates an electrostatic deflection field that directs the charged particle beam 602 to travel along the deflector optical axis 608 through the corrector electrostatic prism 600. In some examples, the same voltage can be applied to each of the first corrector prism electrode 512 of the corrector electrostatic prism 500 and the first entry prism electrode 612 of the entry electrostatic prism 604, and/or the same voltage can be applied to each of the second corrector prism electrode 514 of the corrector electrostatic prism 500 and the second entry prism electrode 614 of the entry electrostatic prism 604. Such a configuration can enable the corresponding deflector assembly to direct a charged particle beam along a deflector optical axis with fewer independent voltages to regulate, thereby facilitating stable control of such a system.

Figure 7:
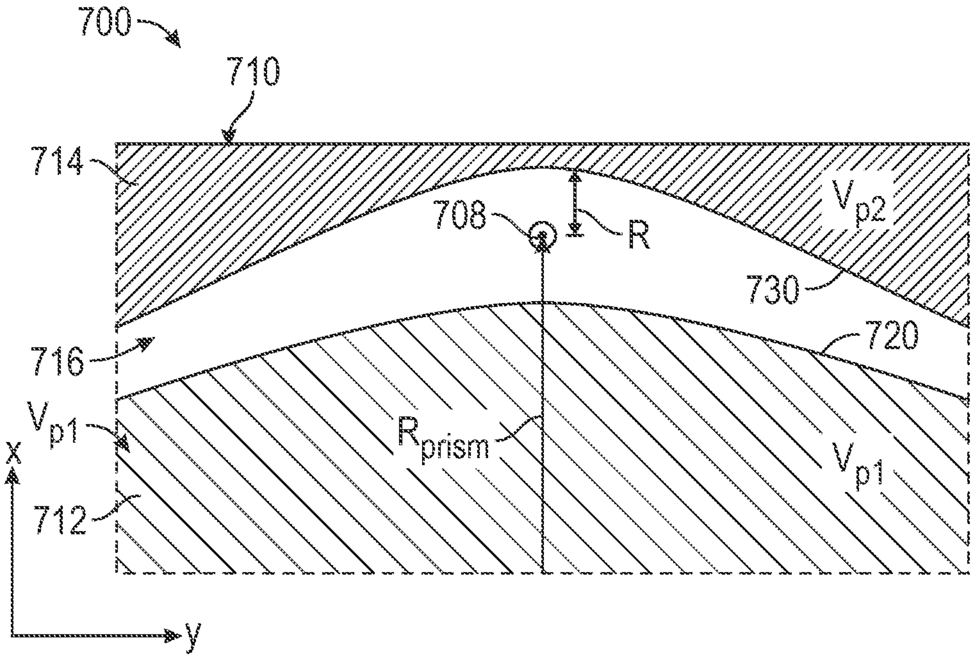
FIG. 7 is fragmentary cross-sectional side elevation view of a corrector electrostatic prism according to an example.

FIG. 7 is a cross-sectional view of a corrector electrostatic prism 700, which may represent the corrector electrostatic prism 312 of FIG. 3, the corrector electrostatic prism 416 of FIG. 4, and/or the corrector electrostatic prism 500 of FIG. 5. In particular, FIG. 7 represents a view of a cross-sectional plane that is spaced apart from any electrostatic multipole elements of the corrector electrostatic prism 700, such as a view along the line A-A in FIG. 3. The corrector electrostatic prism 700 includes a corrector prism body 710 with a first corrector prism electrode 712 and a second corrector prism electrode 714 spaced apart from the first corrector prism electrode 712 to define an electrode gap 716 therebetween.

The corrector prism body 710, the first corrector prism electrode 712, the second corrector prism electrode 714, and the electrode gap 716 can represent and/or be the corrector prism body 510, the first corrector prism electrode 512, the second corrector prism electrode 514, and the electrode gap 516 of FIG. 5, respectively.

In FIG. 7, the first electrode voltage applied to the first corrector prism electrode 712 is denoted $V_{p1}$, and the second electrode voltage applied to the second corrector prism electrode 714 is denoted $V_{p2}$.

As shown, the cross-sectional view of FIG. 7 may be described as being viewed along a direction parallel to a deflector optical axis 708 within the electrode gap 716. The deflector optical axis 708 shown in FIG. 7 can include and/or be at the deflector optical axis 508 of FIG. 5 and/or the deflector optical axis 308 of FIG. 3. Additionally, FIG. 7 may be described as being viewed along a plane that does not intersect any of the multipole elements of the deflector assembly.

As shown in FIG. 7, the first corrector prism electrode 712 can include a first electrode exterior surface 720 that faces the second corrector prism electrode 714 and a second electrode interior surface 730 that faces the first corrector prism electrode 712. In the example of FIG. 7, each of the first electrode exterior surface 720 and the second electrode interior surface 730 is a smooth surface (at least at locations away from the multipole elements contained within the corrector electrostatic prism 800).

In some examples, the shapes of the first electrode exterior surface 720 and/or the second electrode interior surface 730 can correspond to equipotential lines of a multipole electrostatic field within the electrode gap 716. In particular, in an electrostatic prism such as the corrector electrostatic prism 700, sufficiently far from the entrance and exit fringe fields, the Laplace equation for the electrostatic potential $\phi(x, y)$ can be written as $$\frac{\partial^2\phi}{\partial x^2}+\frac{\partial^2\phi}{\partial y^2}+\frac{1}{R_{prism}+x}\cdot\frac{\partial\phi}{\partial x}=0. \tag{36}$$

The corresponding multipole expansion (up to hexapole potential) is given by

-continued $$\phi(x, y)= a_0+a_1x+a_2(x^2-y^2)+b_2(x^2+y^2)+a_3(x^3-3xy^2)+b_3x(x^2+y^2)+\ldots \tag{37}$$

with $$b_2=-\frac{1}{4}Ka_1,\ b_3=-\frac{1}{4}Ka_2,$$

$K=1/R_{prism}$, and obeying $\phi(x, -y)=\phi(x, y)$. In the limit $K\to 0$ or $R_{prism}\to\infty$, all coefficients $b_m$ vanish, and $\phi(x, y)$ in Equation (37) reduces to the well-known multipole expansion around a straight axis. A generalization of Equation (37) in which the coefficients $a_k$ and $b_k$ depend on $z=\phi R_{prism}$ may be found in Equation 3.55 of found in "Geometrical Charged-Particle Optics" (Harald H. Rose, 2009).

For electron energy eU, the axial dipole field $$E_x(0, 0)=-a_1=2KU=2U/R_{prism} \tag{38}$$

ensures that the curvature radius of an electron traveling along the deflector optical axis 708 equals $R_{prism}$, and for the special case of a spherical prism, $$a_2=\frac{3}{2}K^2U$$

for the quadrupole field and $$a_3=-\frac{5}{4}K^3U$$

for the hexapole field. For a general prism, one can define a dimensionless hexapole parameter p via $$a_3=pK^3U. \tag{39}$$

In general, for any reasonable set of multipole strengths $\alpha_1$, $\alpha_2$, $\alpha_3$, $\alpha_4$, . . . , one can define the profiles of the first electrode exterior surface 720 and the second electrode interior surface 730 as shown in FIG. 7 to be equipotential lines of Equation (37); i.e., $\phi(x, y)=V_{p1}$ and $\phi(x, y)=V_{p2}$. The ratio $V_{p1}/V_{p2}$ can be close to −1, and these voltages can be chosen such that $\phi(0,0)$ (i.e., the electrostatic potential at the deflector optical axis 808) is zero, or approximately zero. In practice, the beam diameter of the charged particle beam can be much smaller than the radial extent of the electrode gap 816 (i.e., 2R in the example of FIG. 7), such that the values of the multipole components $\alpha_m$ for $m\geq 4$ or 5 are negligible. Accordingly, many shapes of the first electrode exterior surface 720 and the second electrode interior surface 730 are possible for given values of $\alpha_1$, $\alpha_2$, and $\alpha_3$.

The first order focusing properties of the corrector electrostatic prism 700 in the xz- and yz-planes can be determined by the quadrupole field parameter $\alpha_2$ of Equation (37). In particular, the first order ray equations in an electrostatic prism can be written as $$x'' + \left(\frac{5}{2}K^2 - \frac{a_2}{U}\right)x = 0 \text{ and } y'' + \left(\frac{a_2}{U} - \frac{1}{2}K^2\right)x = 0 \tag{40}$$

for an electron with nominal energy eU.

In some examples, such as in the example of FIG. 7, the electrostatic deflection field generated within the corrector electrostatic prism can be invariant in the prism angle. For example, FIG. 7 may be described as illustrating a portion of the corrector electrostatic prism 700 as viewed at a specific prism angle $\phi$ (as discussed above with reference to FIG. 3), which may represent any of a variety of prism angles and/or any prism angle within a continuous range of prism angles.

In some examples, the shapes of the first electrode exterior surface 720 and the second electrode interior surface 730 (e.g., the shapes of the corresponding profiles of these surfaces at a given prism angle $\phi$) can be substantially constant within the corrector electrostatic prism 700 across a range of prism angles, such as across a substantially full angular extent of the corrector electrostatic prism 700 and/or at locations away from the electrostatic multipole elements within the corrector electrostatic prism 700. Accordingly, in some examples, a magnitude of the electrostatic deflection field and/or of the prism hexapole field component thereof within the electrode gap 716 may be constant in the prism angle $\phi$. Stated differently, in some examples, the coefficients $a_k$ and $b_k$ in Equation (37) are independent of the prism angle $\phi$, at least away from the prism exit and entrance and ignoring field contributions from any electrostatic multipole elements associated with the corrector electrostatic prism. In some examples, this is true of prism angles in substantially a full range of prism angles from zero to $\phi_{max}$ and/or at prism angles that do not correspond to the locations of electrostatic multipole elements.

Figure 8:
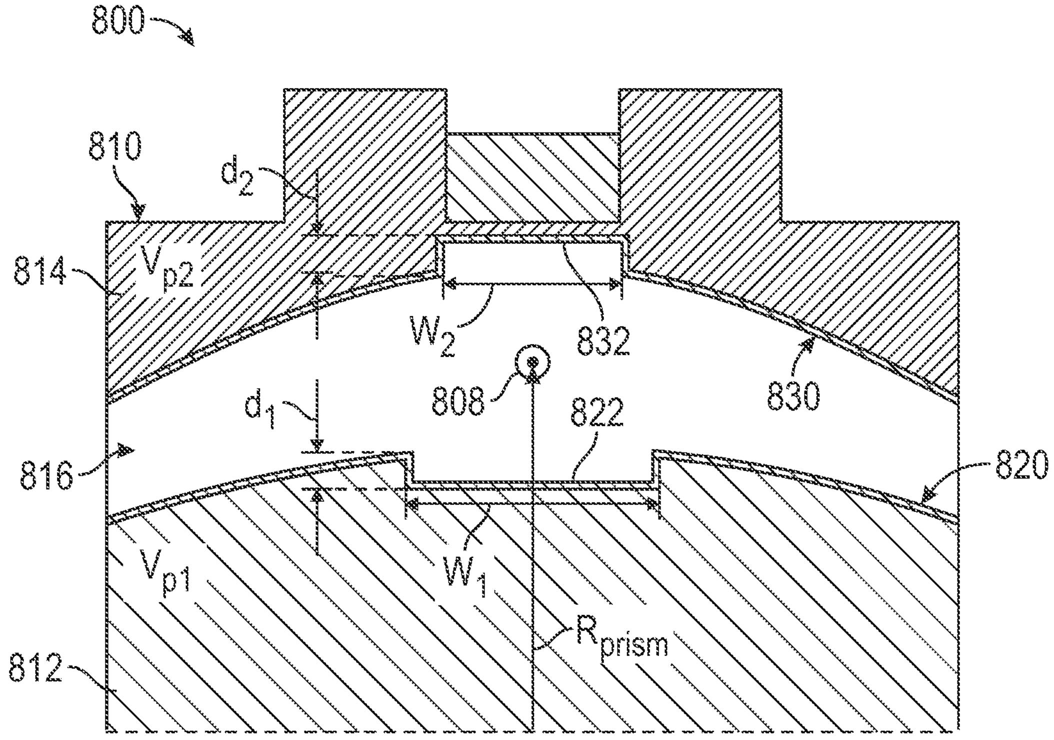
FIG. 8 is another fragmentary cross-sectional side elevation view of a corrector electrostatic prism according to an example.

FIG. 8 is a cross-sectional view of another example of a corrector electrostatic prism 800, which may represent the corrector electrostatic prism 312 of FIG. 3, the corrector electrostatic prism 416 of FIG. 4, and/or the corrector electrostatic prism 500 of FIG. 5. In particular, FIG. 8 represents a view of a cross-sectional plane that is spaced apart from any electrostatic multipole elements of the corrector electrostatic prism 800, such as a view along the line A-A in FIG. 3. The corrector electrostatic prism 800 includes a corrector prism body 810 with a first corrector prism electrode 812 and a second corrector prism electrode 814 spaced apart from the first corrector prism electrode 812 to define an electrode gap 816 therebetween.

The corrector prism body 810, the first corrector prism electrode 812, the second corrector prism electrode 814, and the electrode gap 816 can represent and/or be the corrector prism body 510, the first corrector prism electrode 512, the second corrector prism electrode 514, and the electrode gap 516 of FIG. 5, respectively.

In FIG. 8, the first electrode voltage applied to the first corrector prism electrode 812 is denoted $V_{p1}$, and the second electrode voltage applied to the second corrector prism electrode 814 is denoted $V_{p2}$.

As shown, the cross-sectional view of FIG. 8 may be described as being viewed along a direction parallel to a deflector optical axis 808 within the electrode gap 816. The deflector optical axis 808 shown in FIG. 8 can include and/or be at the deflector optical axis 508 of FIG. 5 and/or the deflector optical axis 308 of FIG. 3. Additionally, FIG. 8 may be described as being viewed along a plane that does not intersect any of the multipole elements of the deflector assembly.

Similar to the corrector electrostatic prism 700 of FIG. 7, the first corrector prism electrode 812 of FIG. 8 includes a first electrode exterior surface 820 that faces the second corrector prism electrode 814, and the second corrector prism electrode 814 includes a second electrode interior surface 830 that faces the first corrector prism electrode 812. In this example, however, the first electrode exterior surface 820 defines a first electrode groove 822 that extends along a direction parallel to the deflector optical axis 808. Similarly, the second electrode interior surface 830 defines a second electrode groove 832 that extends along a direction parallel to the deflector optical axis 808.

In some examples, the first electrode groove 822 and/or the second electrode groove 832 can be sized, shaped, and/or otherwise configured to produce a desired auxiliary electrostatic field within the electrode gap 816. For example, the first electrode groove 822 and/or the second electrode groove 832 can generate a hexapole field within the corrector electrostatic prism 800 when respective voltages are applied to the first corrector prism electrode 812 and the second corrector prism electrode 814.

In some examples, the hexapole field generated by the first electrode groove 822 and/or the second electrode groove 832 varies along the deflector optical axis 808. This auxiliary hexapole field can scale linearly with the first electrode voltage and the second electrode voltage, which in turn can be related to the energy of the charged particles that are deflected by the first corrector prism electrode 812 and the second corrector prism electrode 814; thus, for a given charged particle energy, these groove-induced hexapole fields can be fixed.

Each of the first electrode groove 822 and the second electrode groove 832 can have any suitable dimensions, such as may correspond to the desired electrostatic field within the electrode gap 816. As shown in FIG. 8, the corrector electrostatic prism can be characterized by a corrector prism beam radius $R_{prism}$, as measured between a central axis of the first corrector prism electrode 812 (e.g., the central axis 301 of FIG. 3 and/or the central axis 501 of FIG. 5) and the deflector optical axis 808. The first electrode groove 822 can be characterized by a first electrode groove depth $d_1$, as measured along a radial direction parallel to the corrector prism beam radius. Similarly, the second electrode groove 832 can be characterized by a second electrode groove depth $d_2$, as measured along the radial direction. In some examples, each of the first electrode groove depth $d_1$ and the second electrode groove depth $d_2$ can be at most 1/50 of the corrector prism beam radius $R_{prism}$.

In some examples, one or more dimensions of the first electrode groove 822 and/or the second electrode groove 832 (e.g., the first electrode groove depth $d_1$ and/or the second electrode groove depth $d_2$) can vary with a prism angle of the corrector electrostatic prism 800 (e.g., the prism angle <p discussed above in the context of FIG. 3). In such examples, the auxiliary prism multipole fields also vary with the prism angle. In particular, with reference to Equation (37), varying one or more dimensions of the first electrode groove 822 and/or the second electrode groove 832 with the prism angle can result in the coefficients $a_k$ and $b_k$ also varying with the prism angle. In some examples, the first electrode groove 822 and/or the second electrode groove 832 can be configured such that the axial potential (corresponding to $\alpha_0$) and the dipole field (corresponding to $\alpha_1$) remain constant, or approximately constant, with the prism angle while the prism hexapole field (corresponding to $\alpha_3$) follows a desired profile. In some examples, the first electrode groove 822 and/or the second electrode groove 832 can be configured such that an auxiliary octupole field (corresponding to $\alpha_4$) also varies with the prism angle.

Additionally or alternatively, one or more dimensions of the first electrode groove 822 and/or the second electrode groove 832 (e.g., the first electrode groove depth $d_1$ and/or the second electrode groove depth $d_2$) can be constant across an angular extent (e.g., a full angular extent) of the corrector electrostatic prism 800.

Figure 9:
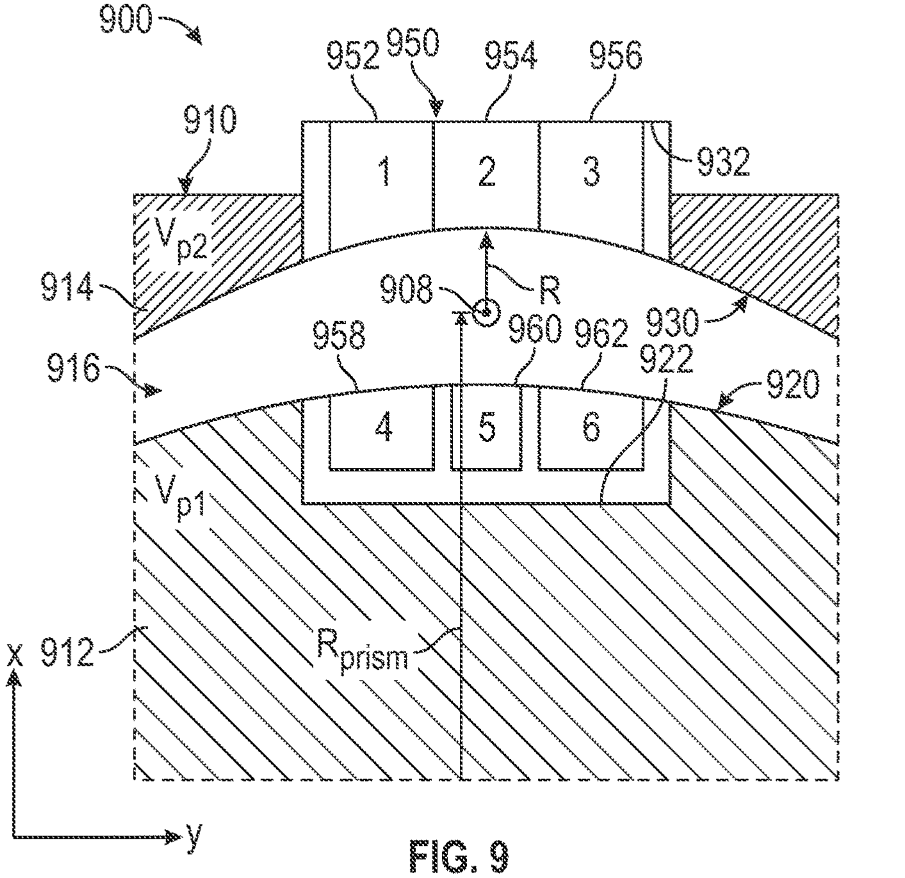
FIG. 9 is another fragmentary cross-sectional side elevation view of a corrector electrostatic prism according to an example.

As discussed above in the context of FIG. 3, one or more electrostatic multipole elements may be positioned and/or incorporated within a corrector electrostatic prism. As an example, FIG. 9 is a cross-sectional view of a corrector electrostatic prism 900 with an electrostatic multipole element 950 positioned therein. In particular, FIG. 9 represents a view of a cross-sectional plane that intersects the electrostatic multipole element 950, such as a view along the line B-B in FIG. 3.

The corrector electrostatic prism 900 may represent the corrector electrostatic prism 312 of FIG. 3, the corrector electrostatic prism 416 of FIG. 4, the corrector electrostatic prism 500 of FIG. 5, the corrector electrostatic prism 700 of FIG. 7, and/or the corrector electrostatic prism 800 of FIG. 8. The corrector electrostatic prism 900 includes a corrector prism body 910 with a first corrector prism electrode 912 and a second corrector prism electrode 914 spaced apart to define an electrode gap 916 therebetween. The corrector prism body 910, the first corrector prism electrode 912, the second corrector prism electrode 914, and the electrode gap 916 can represent and/or be the corresponding structures shown in any of FIGS. 5-8. In FIG. 9, the first electrode voltage applied to the first corrector prism electrode 912 is denoted $V_{p1}$, and the second electrode voltage applied to the second corrector prism electrode 914 is denoted $V_{p2}$.

As shown, the cross-sectional view of FIG. 9 may be described as being viewed along a direction parallel to a deflector optical axis 908 within the electrode gap 916. The deflector optical axis 908 shown in FIG. 9 can include and/or be at the deflector optical axis of any of FIGS. 3-8.

The first corrector prism electrode 912 can include a first electrode exterior surface 920 that faces the second corrector prism electrode 914, and the first electrode exterior surface 920 can define a first electrode recess 922 that extends partially along a direction parallel to the deflector optical axis 908. Similarly, the second corrector prism electrode 914 can include a second electrode interior surface 930 that faces the first corrector prism electrode 912, and the second electrode interior surface 930 can define a second electrode recess 932 that extends partially along a direction parallel to the deflector optical axis 908.

In the example of FIG. 9, the electrostatic multipole element 950 is an electrostatic hexapole-generating element that includes a first hexapole electrode 952, a second hexapole electrode 954, a third hexapole electrode 956, a fourth hexapole electrode 958, a fifth hexapole electrode 960, and a sixth hexapole electrode 962. Applying respective voltages to each of the hexapole electrodes of the electrostatic multipole element 950 thus may operate to generate dipole and quadrupole electrostatic fields of any orientation in the xy-plane and/or a hexapole field of fixed orientation in a similar manner as the hexapole-generating element 200 of FIG. 2. Such a configuration is not required of all examples, however, and it additionally is within the scope of the present disclosure that an electrostatic multipole element configured to produce a hexapole field can include more than six electrodes. In particular, in some examples, configuring a hexapole-generating element with more than six electrodes can enable generation of multiple multipole fields, such as a rotatable hexapole field.

As shown in FIG. 9, the first hexapole electrode 952, the second hexapole electrode 954, and the third hexapole electrode 956 can be at least partially received within the second corrector prism electrode 914 (e.g., within the second electrode recess 932), while the fourth hexapole electrode 958, the fifth hexapole electrode 960, and the sixth hexapole electrode 962 can be at least partially received within the first corrector prism electrode 912 (e.g., within the first electrode recess 922).

In some examples, the electrodes of an electrostatic multipole element positioned within a corrector electrostatic prism can be configured such that interior surface defining an electrode gap within the corrector electrostatic prism remain substantially smooth. For example, in the example of FIG. 9, the first hexapole electrode 952, the second hexapole electrode 954, and the third hexapole electrode 956 are positioned to be flush with and/or smoothly connected to the second electrode interior surface 930 outside the second electrode recess 932 to collectively define a smoothly varying profile. Similarly, in this example, the fourth hexapole electrode 958, the fifth hexapole electrode 960, and the sixth hexapole electrode 962 are positioned to be flush with and/or smoothly connected to the first electrode exterior surface 920 outside the first electrode recess 922 to collectively define a smoothly varying profile. As a result, the axial potential ($a_0$ in Equation 37) and the dipole field ($a_1$ in Equation 37) remain (almost) constant inside the prism.

In this manner, the profiles collectively formed by the first electrode exterior surface 920, the second electrode interior surface 930, and the hexapole electrodes of the electrostatic multipole element 950 can be substantially similar in shape to those shown in FIG. 8 and/or can correspond to equipotential lines of Equation (37) as discussed above. Additionally or alternatively, in some such examples, a magnitude of the electrostatic deflection field and/or of the prism hexapole field component thereof within the electrode gap 916 can be described by Equation (37) with coefficients $a_k$ and $b_k$ that are independent of the prism angle $\phi$, at least away from the prism exit and entrance and ignoring field contributions from any electrostatic multipole elements 950 associated with the corrector electrostatic prism 500. In some examples, this is true of prism angles in substantially a full range of prism angles from zero to $\phi_{max}$ and/or at prism angles that do not correspond to the locations of electrostatic multipole elements 950.

Figure 10:
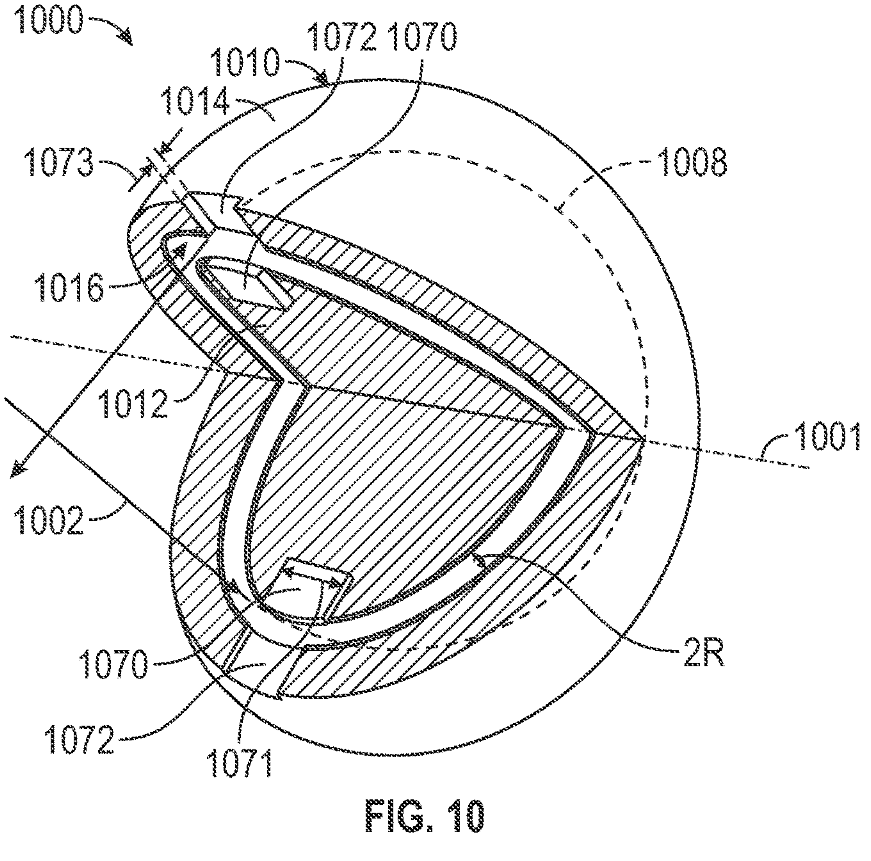
FIG. 10 is another fragmentary cross-sectional side elevation view of a corrector electrostatic prism according to an example.

As discussed above in the context of FIG. 3, one or more electrostatic multipole elements may be at least partially formed by portions of the corrector electrostatic prism that are shaped to produce the desired auxiliary multipole fields. As an example, FIG. 10 is a cross-sectional view of a corrector electrostatic prism 1000 that at least partially defines an electrostatic multipole element 1050. In particular, FIG. 10 represents a view taken along the line C-C in FIG. 3, representing an exit plane of the corrector electrostatic prism 1000.

The corrector electrostatic prism 1000 may represent the corrector electrostatic prism 312 of FIG. 3, the corrector electrostatic prism 416 of FIG. 4, the corrector electrostatic prism 500 of FIG. 5, the corrector electrostatic prism 700 of FIG. 7, the corrector electrostatic prism 800 of FIG. 8, and/or the corrector electrostatic prism 900 of FIG. 9. The corrector electrostatic prism 1000 includes a corrector prism body 1010 with a first corrector prism electrode 1012 and a second corrector prism electrode 1014 spaced apart to define an electrode gap 1016 therebetween. The corrector prism body 1010, the first corrector prism electrode 1012, the second corrector prism electrode 1014, and the electrode gap 1016 can represent and/or be the corresponding structures shown in any of FIGS. 5-9. In FIG. 10, the first electrode voltage applied to the first corrector prism electrode 1012 is denoted $V_{p1}$, and the second electrode voltage applied to the second corrector prism electrode 1014 is denoted $V_{p2}$.

As shown, the cross-sectional view of FIG. 10 may be described as being viewed along a direction parallel to a deflector optical axis 1008 within the electrode gap 1016. The deflector optical axis 1008 shown in FIG. 10 can include and/or be at the deflector optical axis of any of FIGS. 3-9.

In the example of FIG. 10, the first corrector prism electrode 1012 includes a first electrode bump 1070 extending toward the deflector optical axis 1008, and the second corrector prism electrode 1040 includes a second electrode groove 1072 that is recessed away from the deflector optical axis 1008. The first electrode bump 1070 and the second electrode groove 1072 can be configured (e.g., shaped and/or dimensioned) such that, when the first electrode voltage is applied to the first corrector prism electrode 1012 and the second electrode voltage is applied to the second corrector prism electrode 1014, the first electrode bump 1070 and the second electrode groove 1072 operate as the electrostatic multipole element 1050 to produce an auxiliary quadrupole field.

The first electrode bump 1070 and/or the second electrode groove 1072 can be localized within the corrector electrostatic prism 1000, such as in a region proximate to the entry and/or exit of the corrector electrostatic prism. The first electrode bump 1070 and the second electrode groove 1072 can have any suitable dimensions, such as relative to one or more other dimensions of the corrector electrostatic prism 1000. For example, with reference to the gap radius R indicated in FIG. 10, the first electrode bump 1070 and/or the second electrode groove 1072 can have a depth 1073, as measured along a direction parallel to the deflector optical axis 1008, that is approximately equal to and/or less than R and/or less than 2R. Additionally or alternatively, the first electrode bump 1070 and/or the second electrode groove can have a width 1071, as measured along a direction perpendicular to the deflector optical axis 1008 and parallel to the central axis 1001, that is approximately equal to R and/or less than 3R.

Figure 11:
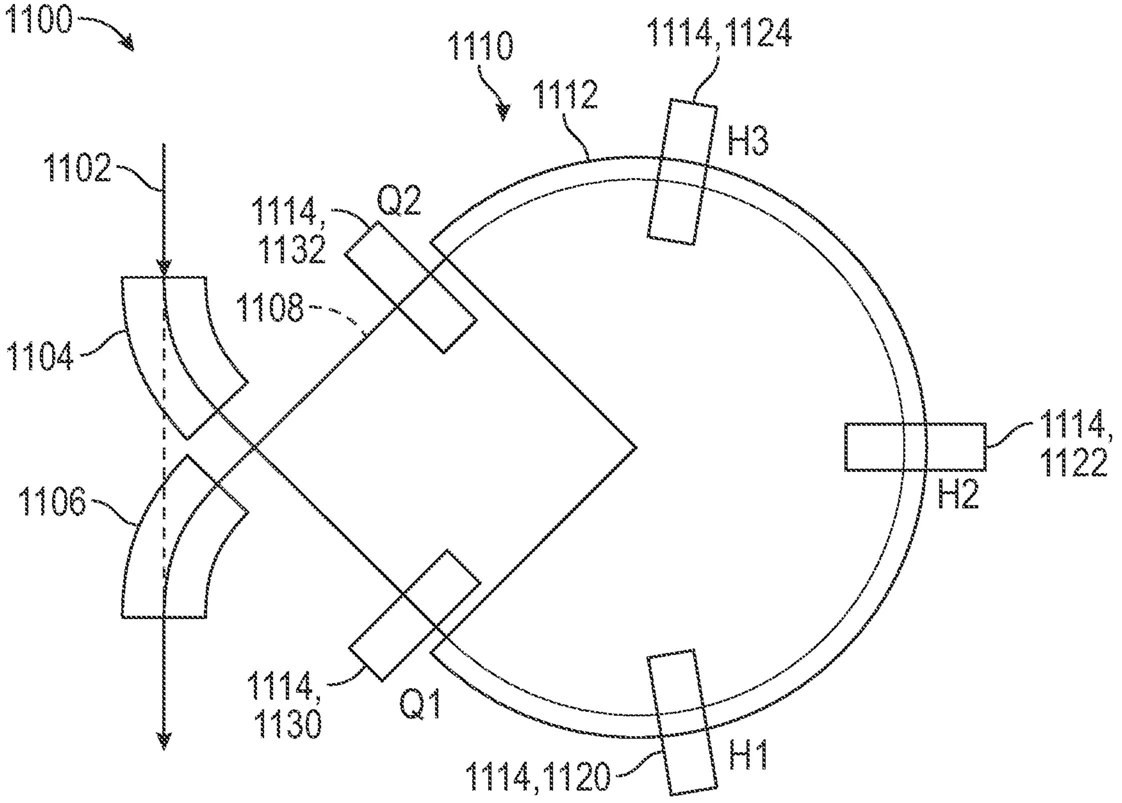
FIG. 11 is a schematic side elevation view of an aberration correction system according to another example.

FIG. 11 illustrates another example of an aberration correction system 1100 for at least partially correcting an axial chromatic aberration of a charged particle beam 1102. The aberration correction system 1100 may be described as representing an example of the aberration correction system 120 of FIG. 1. Similarly, the charged particle beam 1102 can include and/or be the charged particle beam 104 of FIG. 1.

The aberration correction system 1100 of FIG. 11 is similar to the aberration correction system 300 of FIG. 3. For example, and as shown in FIG. 11, the aberration correction system 1100 includes a deflector assembly 1110 that includes a corrector electrostatic prism 1112 and a plurality of electrostatic multipole elements 1114. Except as discussed below, all illustrated components of the aberration correction system 1100, labeled or unlabeled, can share any suitable features, characteristics, attributes, etc. with the corresponding components of the aberration correction system 300. For those components labeled in FIG. 11, components labeled with a reference numeral of the form "11XX" are intended to correspond with the components labeled with a reference numeral of the form "3XX" in FIG. 3. For example, the entry electrostatic prism 1104 of FIG. 11 corresponds to, and may be at least substantially identical to, the entry electrostatic prism 304 of FIG. 3. Additionally, the fundamental rays of the charged particle beam 1102 traversing the aberration correction system 1100 can be substantially similar to the fundamental rays 402, 404, and 406 shown in FIG. 4.

Similar to the aberration correction system 300 of FIG. 3, the aberration correction system 1100 of FIG. 11 includes a first hexapole-generating element 1120, a second hexapole-generating element 1122, a third hexapole-generating element 1124, a first quadrupole-generating element 1130, and a second quadrupole-generating element 1132. The first hexapole-generating element 1120, the second hexapole-generating element 1122, and the third hexapole-generating element 1124 can be configured and/or positioned (e.g., relative to the corrector electrostatic prism 1112) in a substantially similar manner as the corresponding electrostatic multipole elements 314 of FIG. 3. In contrast with the aberration correction system 300 of FIG. 3, however, each of the first quadrupole-generating element 1130 and the second quadrupole-generating element 1132 is a tunable multipole element that is spaced apart from the corrector electrostatic prism 1112. In particular, the first quadrupole-generating element 1130 and the second quadrupole-generating element 1132 can be positioned such that the respective quadrupole electrostatic fields generated by the first quadrupole-generating element 1130 and the second quadrupole-generating element 1132 overlap with the deflection electrostatic field generated by the corrector electrostatic prism 1112 only minimally and/or negligibly.

In other examples, an aberration correction system (e.g., similar to the aberration correction system 300 of FIG. 3 or the aberration correction system 1100 of FIG. 11) can include a first quadrupole-generating element and/or a second quadrupole-generating element in the form of a tunable element that is at least partially received within the corrector electrostatic prism. For example, such an aberration correction system can include one or more quadrupole-generating elements that are configured similar to the electrostatic multipole element 950 of FIG. 9 but with fewer than three (e.g., one or two) electrodes coupled to each of the first prism electrode and the second prism electrode.

As discussed above with reference to Equation (39), the dimensionless parameter p for a fixed hexapole field in a corrector electrostatic prism can be defined via $\alpha_3=pK^3U$. For a spherical prism, p=−5/4. For each of the entry and exit electrostatic prisms disclosed herein (e.g., for the entry electrostatic prisms 304 and/or 1104 and/or for the exit electrostatic prisms 306 and/or 1106), the hexapole parameter can be denoted $p_1$. For each of the corrector electrostatic prisms 300, 500, 700, 800, 900, and/or 1100, the hexapole parameter can be denoted $p_2$.

For a tunable hexapole field, it is convenient to define the hexapole excitation parameter h (with units of $m^{-2}$) as $$h=\frac{3L\alpha_3}{2U},\tag{41}$$

such that Equation (24) becomes $\theta_x=h(x^2-y^2)$ and $\theta_y=-2hxy$. Referring to the examples of FIGS. 3 and 11, the hexapole excitation parameters corresponding to the first hexapole-generating element 320/1120 (H1), the second hexapole-generating element 322/1122 (H2), and the third hexapole-generating element 334/1124 (H3) can be denoted $h_1$, $h_2$, and $h_3$, respectively. Aberrations in the corrector exit focus (e.g., at the corrector exit focus 410 shown in FIG. 4) depend upon these parameters as follows:

$$C_{cx} = 14.8h_1R_{prism}^3 + R_{prism}(72.0 + 1.13p_1 + 33.8p_2),$$
$$C_{cy} = -13.6h_2R_{prism}^3 - R_{prism}(65.8 + 1.13p_1 + 33.5p_2),$$
$$\langle x \mid \alpha x_S \rangle = 2.70h_1R_{prism}^2 - 8.68 - 13.6p_1 + 3.98p_2,$$
$$\langle y \mid \beta x_S \rangle = -3.87h_2R_{prism}^2 - 0.85 + 13.6p_1 - 6.90p_2,$$
$$\langle x \mid \beta y_S \rangle = 6.81 + 8.32p_1 - 1.10p_2. \quad (42)$$

In this manner, the hexapole excitations $h_1$ and $h_2$ enable chromatic aberration correction; that is, a negative $C_{cx}=C_{cy}$ can be set such that the axial chromatic aberration of the total optical column is nullified. One favorable choice of fixed hexapole parameters can be $p_1=-1.084$ and $p_2=-2.012$, in which case $$C_{cx} = 14.8h_1R_{prism}^3 + 2.74R_{prism},$$
$$C_{cy} = -13.6h_2R_{prism}^3 + 2.77R_{prism},$$
$$\langle x \mid \alpha x_S \rangle = 2.70h_1R_{prism}^2 - 1.99,$$
$$\langle y \mid \beta x_S \rangle = -3.87h_2R_{prism}^2 - 1.69,$$
$$\langle x \mid \beta y_S \rangle = 0. \quad (43)$$

While these equations assume that the radius $R_{prism}$ is the same for all three electrostatic prisms of the aberration correction system (e.g., the entry electrostatic prism 304/1104, the exit electrostatic prism 306/1106, and the corrector electrostatic prism 142/1112), this is not required of all examples. In some examples, however, it may be preferable that all such electrostatic prisms share a common value of the quantity $R/R_{prism}$ (with R representing the distance as illustrated in FIGS. 7-9), which can strongly relax the corresponding voltage stability requirements for the voltages applied to each such prism. In particular, in an example in which each electrostatic prism is characterized by the same value of $R/R_{prism}$, only two voltages (e.g., V and −V) need to be generated and applied to the various prism electrodes appropriately in order to define the deflector optical axis.

Figure 12:
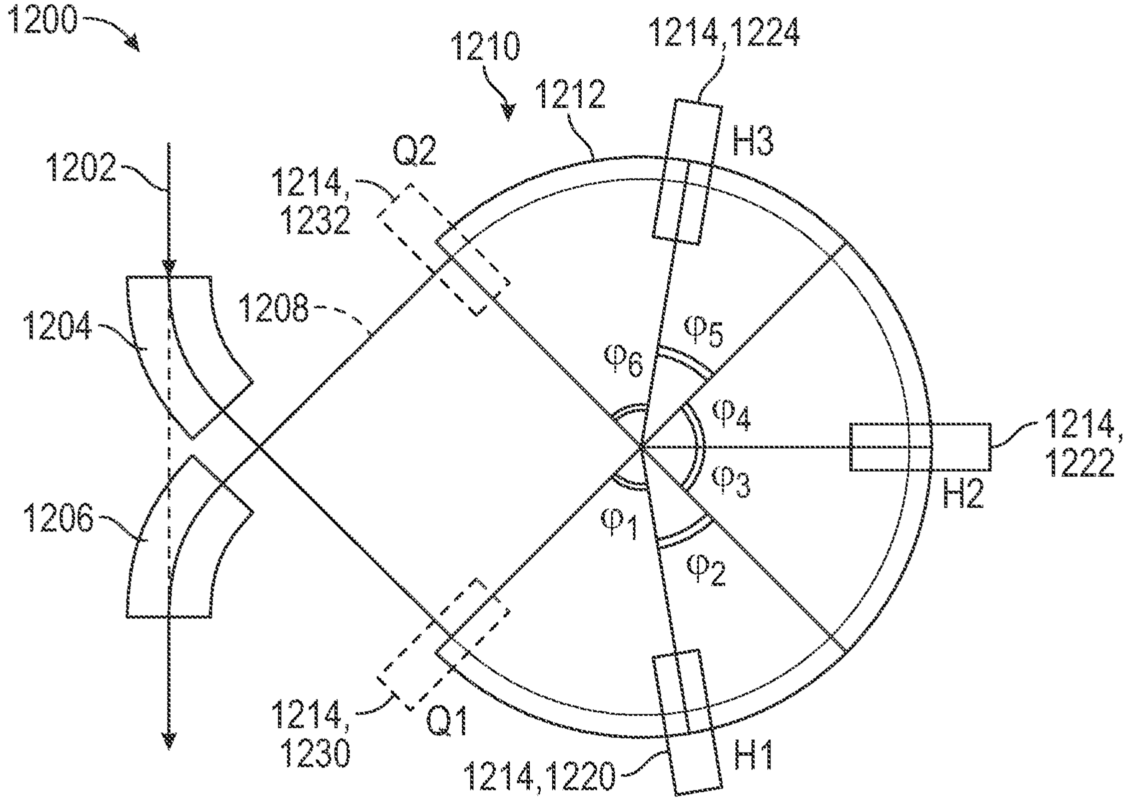
FIG. 12 is a schematic side elevation view of an aberration correction system according to another example.

FIG. 12 illustrates another example of an aberration correction system 1200 for at least partially correcting an axial chromatic aberration of a charged particle beam 1202. The aberration correction system 1200 may be described as representing an example of the aberration correction system 120 of FIG. 1. Similarly, the charged particle beam 1202 can include and/or be the charged particle beam 104 of FIG. 1.

The aberration correction system 1200 of FIG. 12 is similar to the aberration correction system 300 of FIG. 3 and the aberration correction system 1100 of FIG. 11. For example, and as shown in FIG. 12, the aberration correction system 1200 includes a deflector assembly 1210 that includes a corrector electrostatic prism 1212 and a plurality of electrostatic multipole elements 1214. Except as discussed below, all illustrated components of the aberration correction system 1200, labeled or unlabeled, can share any suitable features, characteristics, attributes, etc. with the corresponding components of the aberration correction system 300 and/or of the aberration correction system 1100. For those components labeled in FIG. 12, components labeled with a reference numeral of the form "12XX" are intended to correspond with the components labeled with a reference numeral of the form "3XX" in FIG. 3 and/or with the components labeled with a reference numeral of the form "11XX" in FIG. 11. For example, the entry electrostatic prism 1204 of FIG. 12 corresponds to, and may be at least substantially identical to, the entry electrostatic prism 304 of FIG. 3 and/or the entry electrostatic prism 1104 of FIG. 11.

FIG. 12 illustrates an example in which the magnitude of the prism hexapole field within the corrector electrostatic prism 1212 varies with the prism angle $\phi$. In particular, in this example, the hexapole parameter p defined via Equation (39) is a function of the prism angle.

In the example of FIG. 12, the angular extent of the corrector electrostatic prism 1200 can be partitioned into six sub-sectors $\varphi_1$, $\varphi_2$, $\varphi_3$, $\varphi_4$, $\varphi_5$, and $\varphi_6$. Such sub-sectors can be related to corresponding prism angle intervals as $$\varphi_1\colon\ 0 < \phi \le \phi_1;$$
$$\varphi_2\colon\ \phi_1 < \phi \le \phi_2;$$
$$\varphi_3\colon\ \phi_2 < \phi \le \phi_3;$$
$$\varphi_4\colon\ \phi_3 < \phi \le \phi_4;$$
$$\varphi_5\colon\ \phi_4 < \phi \le \phi_5;\ \text{and}$$
$$\varphi_6\colon\ \phi_5 < \phi \le \phi_6,$$

with $\phi_6=\phi_{max}$ and $\phi_3=\phi_6/2$.

In the example of FIG. 12, the hexapole parameters corresponding to the six sub-sectors $\varphi_1$, $\varphi_2$, $\varphi_3$, $\varphi_4$, $\varphi_5$, and $\varphi_6$ can be denoted $p_2$, $p_3$, $p_4$, $p_4$, $p_3$, and $p_2$, respectively; that is, the hexapole parameters maintain mid-plane symmetry. As discussed above with reference to FIGS. 3 and 11, the hexapole parameter $p_1$ can correspond to each of the entry electrostatic prism 1204 and the exit electrostatic prism 1206.

The hexapole parameters can be chosen such that the corrector electrostatic prism 1212 is free of axial chromatic aberration for $h_1=h_2=0$:

$$C_{cx} = 14.8h_1R_{prism}^3,$$
$$C_{cy} = -13.6h_2R_{prism}^3,$$
$$\langle x \mid \alpha x_S \rangle = 2.70h_1R_{prism}^2,$$
$$\langle y \mid \beta x_S \rangle = -3.87h_2R_{prism}^2,$$
$$\langle x \mid \beta y_S \rangle = 0.16. \quad (43)$$

Alternatively, one can use the additional degrees of freedom associated with the sub-sector hexapole parameters to minimize geometric combination aberrations of order>2, potentially violating mid-plane symmetry.

The piecewise-constant hexapole parameter of the example of FIG. 12 can be achieved in any of a variety of manners, such as by introducing corresponding variations in the contours of the first prism electrode and the second prism electrode of the corrector electrostatic prism 1212. This in turn can be accomplished, for example, by introducing correspondingly shaped shallow grooves in the manner shown in FIG. 7.

While FIG. 12 illustrates an example in which the hexapole parameter is piecewise constant with the prism angle, this is not required of all examples. For example, the corrector electrostatic prism alternatively can be configured such that the hexapole parameter is smoothly varying, such as by smoothly varying groove dimensions (e.g., dimensions of the first electrode groove 822 and/or the second electrode groove 832 of FIG. 8) with the prism angle. In practice, such dimensions can be selected such that $\alpha_0$ and $\alpha_1$ of FIG. (37) are constant, or nearly constant, in the prism angle, such that the electrostatic potential and dipole field as measured on the deflector optical axis are correspondingly constant in the prism angle.

Figure 13:
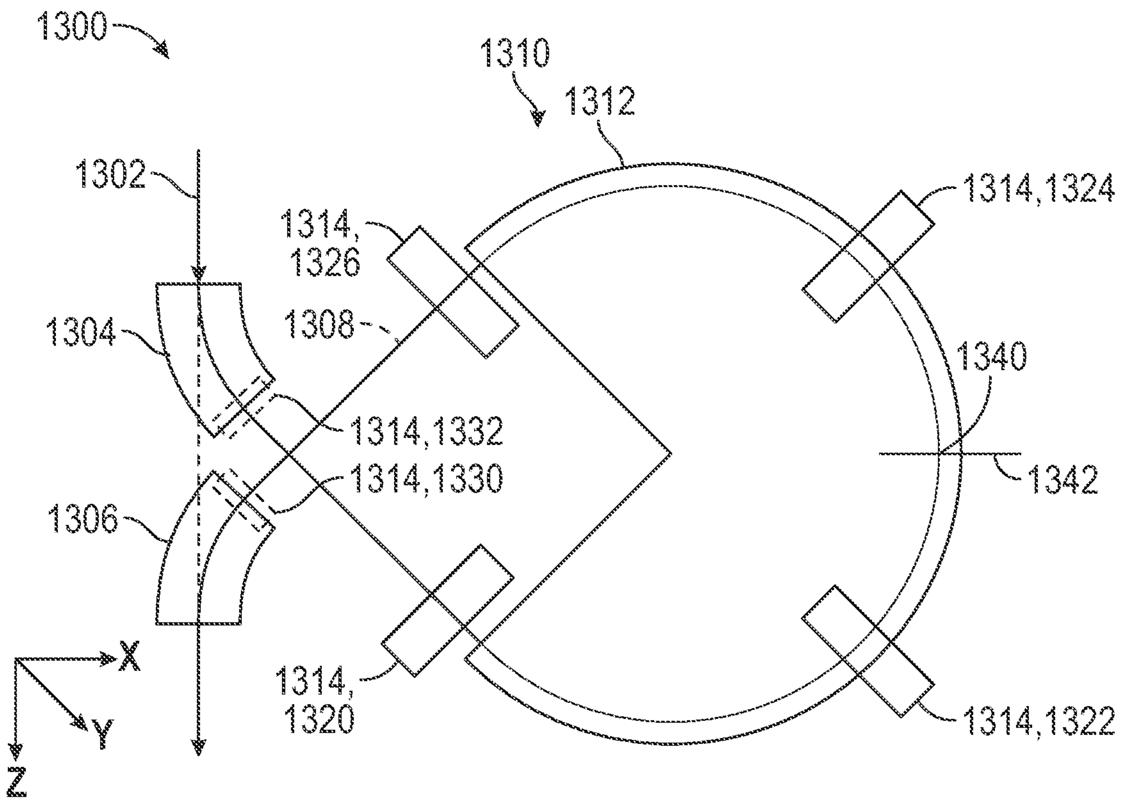
FIG. 13 is a schematic side elevation view of an aberration correction system according to another example.

FIG. 13 illustrates another example of an aberration correction system 1300 for at least partially correcting an axial chromatic aberration of a charged particle beam 1302. The aberration correction system 1300 may be described as representing an example of the aberration correction system 120 of FIG. 1. Similarly, the charged particle beam 1302 can include and/or be the charged particle beam 104 of FIG. 1.

The aberration correction system 1300 of FIG. 13 is similar to the aberration correction system 300 of FIG. 3, the aberration correction system 1100 of FIG. 11, and the aberration correction system 1200 of FIG. 12. For example, and as shown in FIG. 13, the aberration correction system 1300 includes a deflector assembly 1310 that includes a corrector electrostatic prism 1312 and a plurality of electrostatic multipole elements 1314. Except as discussed below, all illustrated components of the aberration correction system 1300, labeled or unlabeled, can share any suitable features, characteristics, attributes, etc. with the corresponding components of the aberration correction system 300, of the aberration correction system 1100, and/or of the aberration correction system 1200. For those components labeled in FIG. 13, components labeled with a reference numeral of the form "13XX" are intended to correspond with the components labeled with a reference numeral of the form "3XX" in FIG. 3, with the components labeled with a reference numeral of the form "11XX" in FIG. 11, and/or with the components labeled with a reference numeral of the form "12XX" in FIG. 12. For example, the entry electrostatic prism 1304 of FIG. 13 corresponds to, and may be at least substantially identical to, the entry electrostatic prism 304 of FIG. 3, the entry electrostatic prism 1104 of FIG. 11, and/or the entry electrostatic prism 1204 of FIG. 12.

Similar to the previously discussed examples, the plurality of electrostatic multipole elements 1314 of the aberration correction system 1300 includes a first hexapole-generating element 1320, a second hexapole-generating element 1322, and a third hexapole-generating element 1324. In the example of FIG. 13, the plurality of electrostatic multipole elements further includes a fourth hexapole-generating element 1326 configured to generate a fourth hexapole field (e.g., as a primary or sole multipole field). In particular, in this example, at least four hexapole-generating elements may be needed to fully correct for axial chromatic aberration while not generating second order aberrations.

As shown in FIG. 13, the second hexapole-generating element 1322 and the third hexapole-generating element 1324 are positioned within the corrector electrostatic prism 1312, while the first hexapole-generating element 1320 and the fourth hexapole-generating element 1326 are positioned exterior of and spaced apart from the corrector electrostatic prism 1312. In other examples, however, the first hexapole-generating element 1320 and the fourth hexapole-generating element 1326 can be positioned within the corrector electrostatic prism 1312.

Similar to the previously discussed examples, and as shown in FIG. 13, the plurality of electrostatic multipole elements 1314 additionally includes a first quadrupole-generating element 1330 and a second quadrupole-generating element 1332. In the example of FIG. 13, each of the first quadrupole-generating element 1330 and the second quadrupole-generating element 1332 is configured to generate a respective auxiliary quadrupole field (e.g., as a primary or sole multipole field). In particular, in this example, the first quadrupole-generating element is integrated into and/or at least partially defined by the exit electrostatic prism 1306, similar to the first quadrupole-generating element 1230 and/or the second quadrupole-generating element 1232 of FIG. 12. Similarly, the second quadrupole-generating element is integrated into and/or at least partially defined by the entry electrostatic prism 1304, similar to the first quadrupole-generating element 1230 and/or the second quadrupole-generating element 1232 of FIG. 12. In such examples, the first quadrupole-generating element 1330 and/or the second quadrupole-generating element 1332 can correspond to portions of the respective electrostatic prisms that are shaped to produce the corresponding auxiliary quadrupole fields.

This is not required, however, and it additionally is within the scope of the present disclosure that the first quadrupole-generating element 1330 and/or the second quadrupole-generating element 1332 can include a corresponding plurality of poles for generating the corresponding (non-auxiliary) quadrupole field. In such examples, each of the first quadrupole-generating element 1330 and/or the second quadrupole-generating element 1332 can be positioned within or spaced apart from the exit electrostatic prism 1306 and the entry electrostatic prism 1304, respectively.

Figure 14:
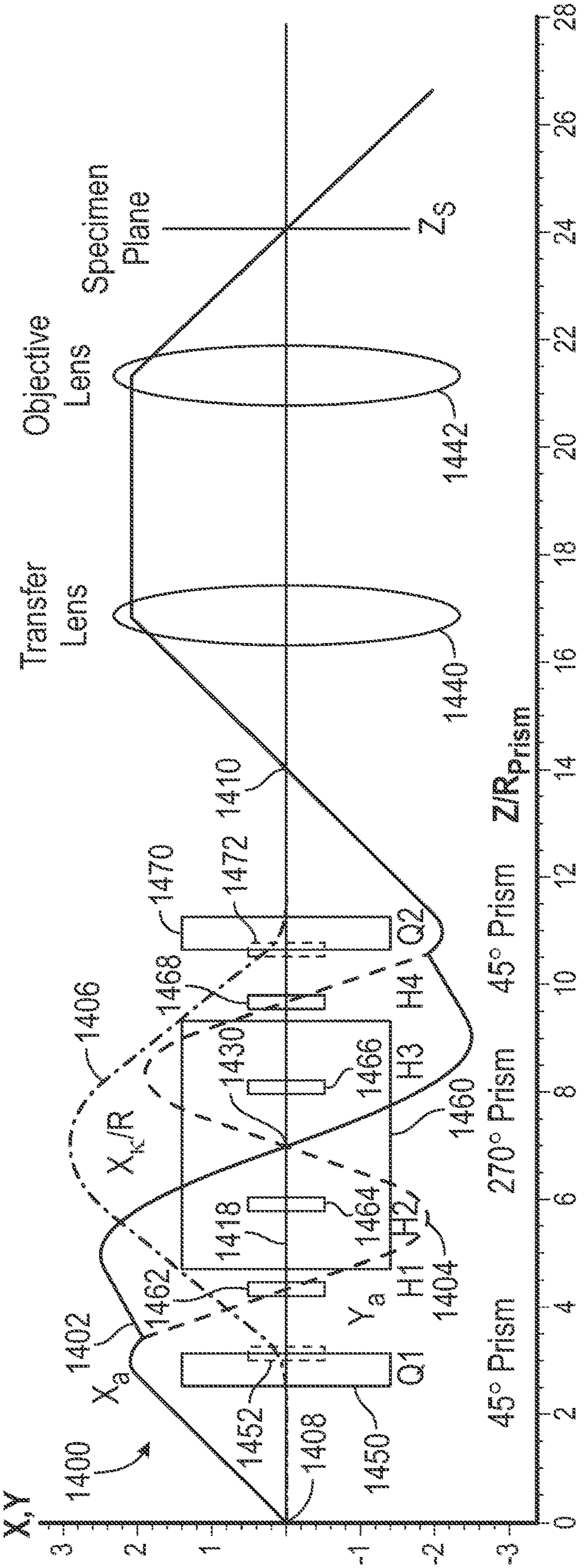
FIG. 14 is an illustration of the fundamental rays of a charged particle beam traversing the aberration correction system of FIG. 13 according to an example.

FIG. 14 illustrates examples of the fundamental rays $x_\alpha(z)$, $y_\alpha(z)$, and $x'(z)$, respectively labeled 1402, 1404, and 1406, of a charged particle beam 1400 that traverses an aberration correction system such as the aberration correction system 1300 of FIG. 13. Stated differently, the charged particle beam 1400 of FIG. 14 can include and/or be at least a portion of the charged particle beam 1302 of FIG. 13. FIG. 14 shows the fundamental rays along a straightened optical axis 1418 corresponding to the deflector optical axis 1308 and/or the z-axis of FIG. 13. As shown in FIG. 14, a charged particle source generating the charged particle beam 1400 (e.g., the charged particle source 102 of FIG. 1) is imaged onto a corrector entrance 1408, while a corrector exit focus 1410 is imaged onto a specimen or sample in a specimen plane $z_S$ (e.g., the sample 132 of FIG. 1) via suitable optics. In the example of FIG. 14, such optics include a transfer lens 1440 and an objective lens 1442, which can be similar to the transfer lenses 122 and/or the objective lens 128 of FIG. 1, respectively.

FIG. 14 additionally shows the locations of a first quadrupole-generating element 1452, a second quadrupole-generating element 1472, a first hexapole-generating element 1462, a second hexapole-generating element 1464, a third hexapole-generating element 1466, and a fourth hexapole-generating element 1468 relative to the straightened optical axis 1418 and relative to the fundamental rays 1402, 1404, and 1406. The first quadrupole-generating element 1452 and the second quadrupole-generating element 1472 of FIG. 14 correspond to the first quadrupole-generating element 1330 and the second quadrupole-generating element 1332 of FIG. 13, respectively. The first hexapole-generating element 1462, the second hexapole-generating element 1464, the third hexapole-generating element 1466, and the fourth hexapole-generating element 1468 correspond to the first hexapole-generating element 1320, the second hexapole-generating element 1322, the third hexapole-generating element 1324, and the fourth hexapole-generating element 1326 of FIG. 13, respectively. FIG. 14 further shows the locations of an entry electrostatic prism 1450, an exit electrostatic prism 1470, and a corrector electrostatic prism 1460, which correspond to the entry electrostatic prism 1304, the exit electrostatic prism 1306, and the corrector electrostatic prism 1312 of FIG. 13, respectively.

As shown in FIG. 14, the charged particle beam 1400 (and thus the charged particle beam 1302 of FIG. 13) exhibits a point focus at a midplane location 1340/1430 of the deflector optical axis 1308/1418 within the corrector electrostatic prism 1312. Accordingly, and as shown in FIG. 13, an energy-selecting slit 1342 can be positioned at the midplane location 1340 to monochromatize the charged particle beam 1302. As a result, the aberration correction system 1300 of FIG. 13 can be used as a Cc-corrector and/or as a monochromator. Other aberration correction systems disclosed herein that yield a line focus at a midplane location also can be used as monochromators; however, the point focus generated by the aberration correction system 1300 can render this system particularly favorable for use in this manner.

As additionally shown in FIG. 14, the charged particle beam 1400 (and thus the charged particle beam 1302 of FIG. 13) exhibits a line focus at locations on either side of the midplane location 1430. In some examples, each of the second hexapole-generating element 1322 and the third hexapole-generating element 1324 can be positioned at or proximate to a position along the deflector optical axis 1308 corresponding to such line focus locations.

In the above examples, the aberration correction systems 300/1000/1100/1200/1300 are configured such the corresponding deflector optical axis 308/1008/1108/1208/1308 traversing the deflector assembly 310/1110/1210/1310 is α-shaped. This is not required, however, and it additionally is within the scope of the present disclosure that the deflector optical axis can traverse the deflector assembly via a path that is Ω-shaped (that is, shaped in a similar manner to the Greek letter Omega). This can be accomplished, for example, by using a plurality of (e.g., four) 90-degree electrostatic prisms to direct the deflector optical axis through a generally Ω-shaped path, though other configurations (e.g., electrostatic prism deflection angles) also can be used. In the present disclosure, any example of an aberration correction system and/or of a deflector assembly thereof that is characterized by a deflector optical axis that is generally Ω-shaped can be referred to as an "omega-type" system or assembly.

Figure 15:
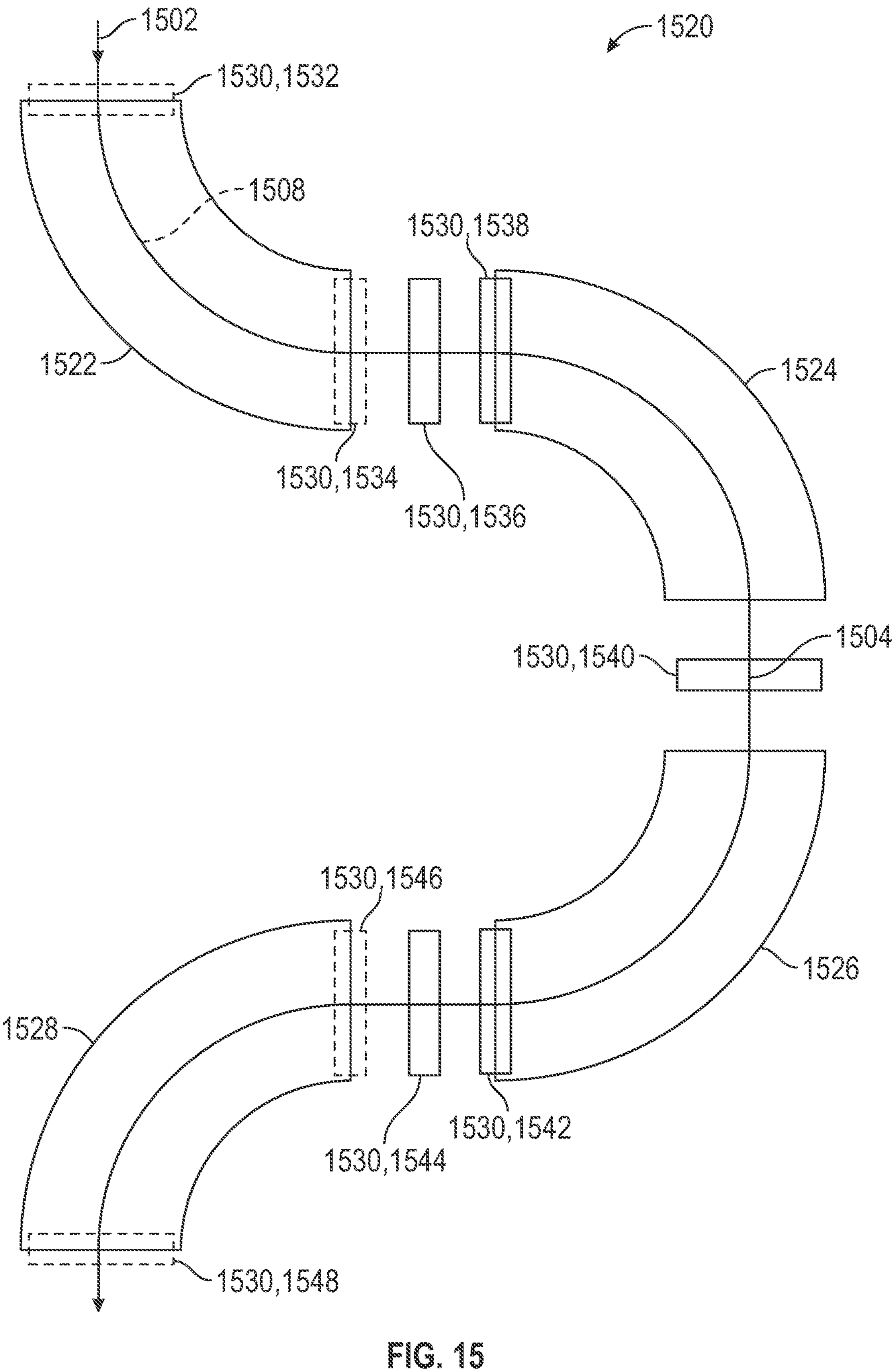
FIG. 15 is a schematic side elevation view of an aberration correction system according to another example.

FIG. 15 illustrates aspects of another example of an aberration correction system 1500 that includes four 90-degree electrostatic prisms 1522, 1524, 1526, and 1528 configured to direct a charged particle beam 1502 along a deflector optical axis 1508 that follows a generally Ω-shaped path. The aberration correction system 1500 may be described as representing an example of the aberration correction system 120 of FIG. 1. Similarly, the charged particle beam 1502 can include and/or be the charged particle beam 104 of FIG. 1.

As shown in FIG. 15, the aberration correction system 1500 includes a deflector assembly 1520 with a first electrostatic prism 1522, a second electrostatic prism 1524, a third electrostatic prism 1526, and a fourth electrostatic prism 1528.

The first electrostatic prism 1522, the second electrostatic prism 1524, the third electrostatic prism 1526, and the fourth electrostatic prism 1528 can be arranged and/or coupled to one another in any suitable configuration. For example, at least the second electrostatic prism 1524 and the third electrostatic prism 1526 can be fixedly coupled to one another, and/or can represent respective components and/or portions of a single monolithic device. Additionally or alternatively, at least the first electrostatic prism 1522 and the fourth electrostatic prism 1528 can be fixedly coupled to one another, and/or can represent respective components and/or portions of a single monolithic device.

In the example of FIG. 15, each of the first electrostatic prism 1522, the second electrostatic prism 1524, the third electrostatic prism 1526, and the fourth electrostatic prism 1528 is configured to deflect the charged particle beam 1510 through an angle that is equal, or approximately equal, to 90 degrees. This is not required, however, and it additionally is within the scope of the present disclosure that each electrostatic prism of the deflector assembly 1520 can deflect the charged particle beam 1510 through any suitable angle. In some examples, one or more of the first electrostatic prism 1522, the second electrostatic prism 1524, the third electrostatic prism 1526, and/or the fourth electrostatic prism 1528 is a double-focusing prism.

Each electrostatic prism of the deflector assembly 1520 also can be characterized by a corresponding multipole strength and/or quadrupole parameter. In particular, with reference to Equation (37), each of the first electrostatic prism 1522 and the fourth electrostatic prism 1528 can be characterized by a quadrupole strength $a_2=K^2U$, and each of the second electrostatic prism 1524 and the third electrostatic prism 1526 can be characterized by a quadrupole strength $$a_2 = \frac{3}{2}K^2U.$$

In this manner, each of the second electrostatic prism 1526 can be characterized by a quadrupole strength electrostatic prism 1526 can have a quadrupole strength of the same form as in a spherical deflector (but with a different hexapole strength $\alpha_3$ than that of the spherical deflector).

As shown in FIG. 15, the deflector assembly 1520 additionally includes a plurality of electrostatic multipole elements 1530. Specifically, in the example of FIG. 15, the plurality of electrostatic multipole elements 1530 includes a first multipole element 1538 configured to generate a first hexapole field, a second multipole element 1540 configured to generate a second hexapole field, and a third multipole element 1542 configured to generate a third hexapole field.

In some examples, the deflector assembly 1520 also can include one or more multipole elements configured to generate quadrupole fields. For example, and as shown in FIG. 15, the plurality of electrostatic multipole elements further can include a fourth multipole element 1536 configured to generate a fourth element quadrupole field, a fifth multipole element 1544 configured to generate a fifth element quadrupole field, a sixth multipole element 1532 configured to generate a sixth element quadrupole field, a seventh multipole element 1534 configured to generate a seventh element quadrupole field, an eighth multipole element 1546 configured to generate an eighth element quadrupole field, and a ninth multipole element 1548 configured to generate a ninth element quadrupole field.

Additionally, in this example, the first multipole element 1538 also can be configured to generate a first element quadrupole field, and the third multipole element 1542 also can be configured to generate a third element quadrupole field. In this manner, each of the first multipole element 1538 and the third multipole element 1542 may be described as representing each of a hexapole-generating element and a quadrupole-generating element.

The first element hexapole field and the first element quadrupole field generated by the first multipole element 1538 can be at least partially overlapping (e.g., in space and/or along the deflector optical axis 1508. For example, the first hexapole field and the first element quadrupole field may correspond to and/or be respective components of an electrostatic multipole field generated by the first multipole element 1538.

The first multipole element 1538 can have any suitable structure for generating the first hexapole field and the first element quadruple field. For example, the first multipole element 1538 can include and/or be a hexapole-generating element that is configured to generate each of the first hexapole field and the first element quadrupole field when suitable voltages are applied to the six electrodes of the hexapole-generating element. Additionally or alternatively, the first multipole element 1538 can include each of a quadrupole-generating element with four electrodes and a distinct hexapole-generating element with six electrodes respectively configured to generate the first hexapole field and the first element quadrupole field.

Similarly, the third hexapole field and the third element quadrupole field generated by the third multipole element 1542 can be at least partially overlapping (e.g., in space and/or along the deflector optical axis 1508. For example, the third hexapole field and the third element quadrupole field may correspond to and/or be respective components of an electrostatic multipole field generated by the third multipole element 1542.

The third multipole element 1542 can have any suitable structure for generating the third hexapole field and the third element quadrupole field. For example, the third multipole element 1542 can include and/or be a hexapole-generating element that is configured to generate each of the third hexapole field and the third element quadrupole field when suitable voltages are applied to the six electrodes of the hexapole-generating element. Additionally or alternatively, the third multipole element 1542 can include each of a quadrupole-generating element with four electrodes and a distinct hexapole-generating element with six electrodes respectively configured to generate the third hexapole field and the third element quadrupole field.

Similar to the examples discussed above, each electrostatic multipole element 1530 illustrated in dashed lines in FIG. 15 represents an electrostatic multipole element that is configured to generate a corresponding auxiliary multipole field with one or more properties that are fixed by the multipole geometry, while each electrostatic multipole element illustrated in solid lines in FIG. 15 represents an electrostatic multipole element that is configured to generate a corresponding multipole field that is independently tunable (e.g., in orientation and/or magnitude). Thus, in the example of FIG. 15, each of the sixth multipole element 1532, the seventh multipole element 1534, the eighth multipole element 1546, and the ninth multipole element 1548 is configured to generate an auxiliary multipole field, while all other electrostatic multipole elements 1530 are configured to generate a tunable multipole field.

In some examples, the first electrostatic prism 1522 can include and/or define at least a portion of each of the sixth multipole element 1532 and the seventh multipole element 1534. For example, the entry and/or exit of the first electrostatic prism 1522 can be shaped and/or otherwise configured to produce the sixth element quadrupole field and/or the seventh element quadrupole field, respectively, upon application of a deflecting voltage to the first electrostatic prism 1522. In other examples, the sixth multipole element 1532 and/or the seventh multipole element 1534 can be fixedly coupled to the first electrostatic prism 1522.

Similarly, in some examples, the fourth electrostatic prism 1528 can include and/or define at least a portion of each of the eighth multipole element 1546 and the ninth multipole element 1548. For example, the entry and/or exit of the fourth electrostatic prism 1528 can be shaped and/or otherwise configured to produce the eighth element quadrupole field and/or the ninth element quadrupole field, respectively, upon application of a deflecting voltage to the fourth electrostatic prism 1528. In other examples, the eighth multipole element 1546 and/or the ninth multipole element 1548 can be fixedly coupled to the fourth electrostatic prism 1528.

In the example of FIG. 15, the plurality of electrostatic multipole elements 1530 are arranged in a mirror symmetric configuration about a midplane location 1504 of the deflector optical axis 1508 within the deflector assembly 1520. For example, and as shown in FIG. 15, the second multipole element 1540 can be positioned proximate to the midplane location 1504, and the fourth multipole element 1536, the first multipole element 1538, the third multipole element 1542, and the fifth multipole element 1544 can be arranged in a mirror symmetric configuration about the second multipole element 1540.

Figure 16:
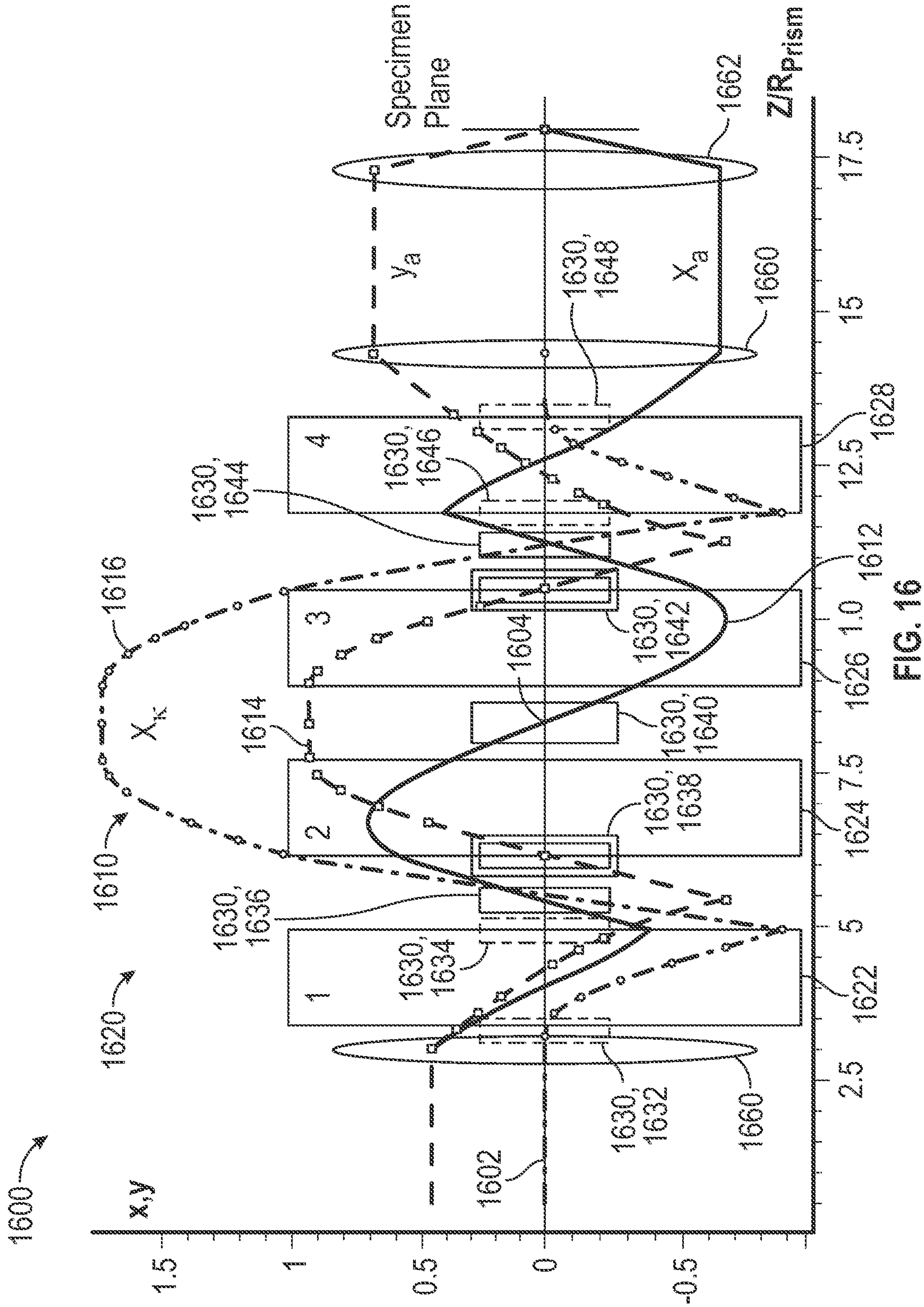
FIG. 16 is a schematic representation of an aberration correction system and of the fundamental rays of a charged particle beam traversing the aberration correction system of FIG. 15 according to an example.

Similar to FIGS. 4 and 14, FIG. 16 illustrates the fundamental rays $x_a(z)$, $y_a(z)$, and $x_\kappa(z)$, respectively labeled 1612, 1614, and 1616, of a charged particle beam 1610 that traverses an aberration correction system 1600. The aberration correction system 1600 of FIG. 16 may represent an example of the aberration correction system 1500 of FIG. 15. For example, the charged particle beam 1610 of FIG. 16 can include and/or be at least a portion of the charged particle beam 1502 of FIG. 15. In FIG. 16, the deflector optical axis 1602 is straightened for clarity, though it is to be understood that the deflector optical axis 1602 can be at least partially curved.

FIG. 16 additionally illustrates various structural components of the aberration correction system 1600 in representative positions along the deflector optical axis 1602. As shown in FIG. 16, the aberration correction system 1600 includes a deflector assembly 1620 with a first electrostatic prism 1622, a second electrostatic prism 1624, a third electrostatic prism 1626, and a fourth electrostatic prism 1628. The first electrostatic prism 1622, the second electrostatic prism 1624, the third electrostatic prism 1626, and the fourth electrostatic prism 1628 may represent and/or correspond to the first electrostatic prism 1522, the second electrostatic prism 1524, the third electrostatic prism 1526, and the fourth electrostatic prism 1528 of FIG. 15, respectively. Similarly, FIG. 16 illustrates plurality of multipole elements 1630 including a first multipole element 1638, a second multipole element 1640, a third multipole element 1642, a fourth multipole element 1636, a fifth multipole element 1644, a sixth multipole element 1632, a seventh multipole element 1634, an eighth multipole element 1646, and a ninth multipole element 1648, which may represent and/or correspond to the first multipole element 1538, the second multipole element 1540, the third multipole element 1542, the fourth multipole element 1536, the fifth multipole element 1544, the sixth multipole element 1532, the seventh multipole element 1534, the eighth multipole element 1546, and the ninth multipole element 1548 of FIG. 15, respectively.

In FIG. 16, various multipole elements are illustrated as two solid overlapping rectangles to represent the multiple multipole fields that may be generated by such multipole elements. For example, the two solid overlapping rectangles associated with each of the first multipole element 1638 and the third multipole element 1642 may be understood as representing the respective hexapole field and quadrupole field generated by each element.

As shown in FIG. 16, the deflector assembly 1620 operates to generate a line focus of the charged particle beam 1610 at the midplane location 1604, such that the second multipole element 1640 is positioned proximate to a position along the deflector optical axis 1602 corresponding to this line focus position.

As further shown in FIG. 16, the deflector assembly 1620 additionally can include one or more round lens elements 1660 and an objective lens element 1662. Each round lens element 1660 can include and/or be any suitable electrostatic round lenses. In some examples, the round lens elements 1660 can correspond to and/or be the condenser optics 108 and/or the transfer lens 122 of FIG. 1. Similarly, the objective lens element 1662 shown in FIG. 16 can correspond to and/or be the objective lens 128 of FIG. 1.

Figure 17:
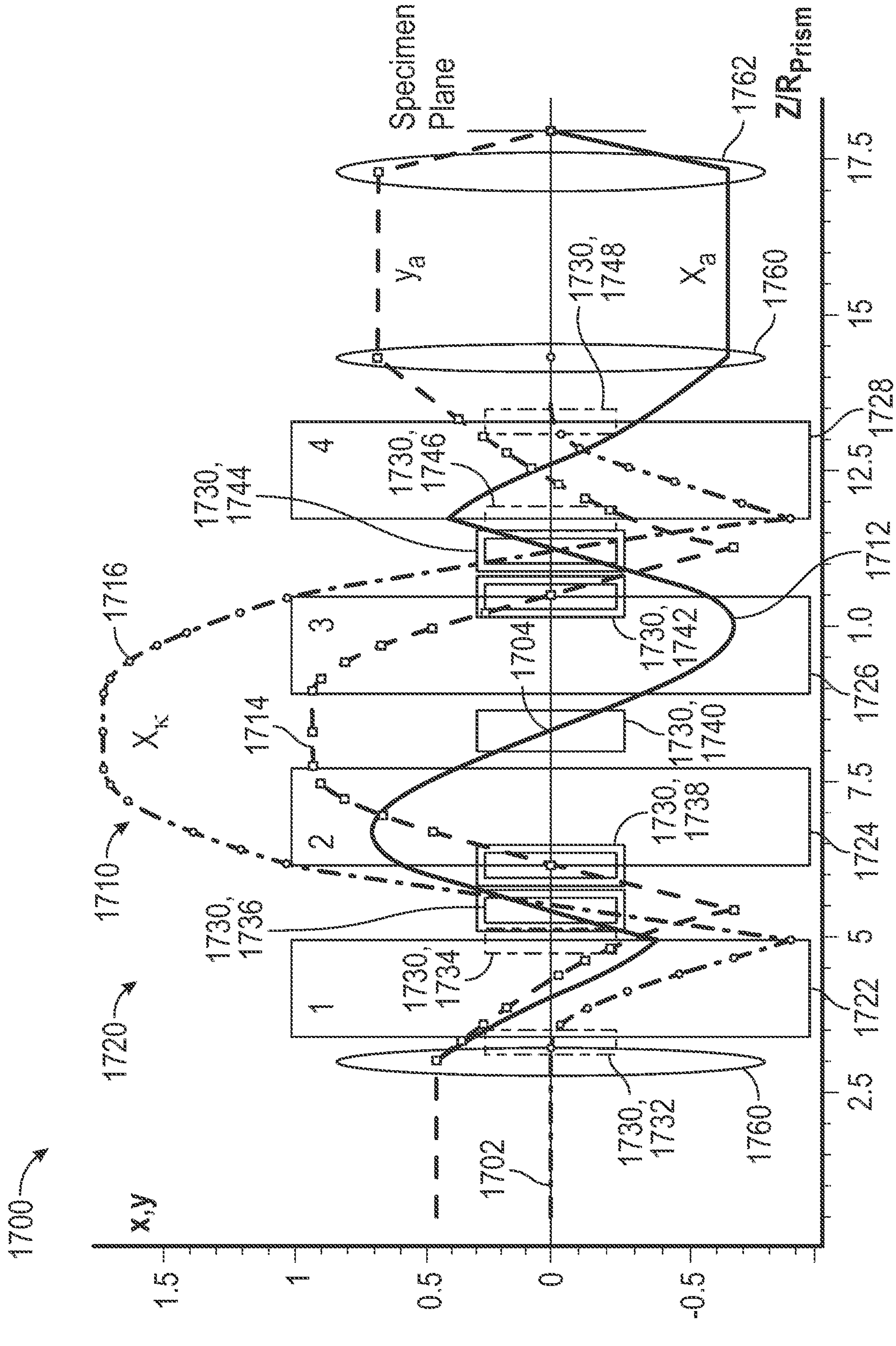
FIG. 17 is a schematic representation of an aberration correction system and of the fundamental rays of a charged particle beam traversing the aberration correction system of FIG. 15 according to another example.

FIG. 17 illustrates aspects of another example of an aberration correction system 1700 that includes four 90-degree electrostatic prisms to direct a charged particle beam 1710 along a deflector optical axis 1702 that follows a generally Ω-shaped path. In particular, similar to FIGS. 4, 14, and 16, FIG. 17 illustrates the fundamental rays $x_\alpha(z)$, $y_\alpha(z)$, and $x_\kappa(z)$, respectively labeled 1712, 1714, and 1716, of the charged particle beam 1710 that traverses an aberration correction system 1700. In FIG. 17, the deflector optical axis 1702 is straightened for clarity, though it is to be understood that the deflector optical axis 1702 can be at least partially curved.

The aberration correction system 1700 of FIG. 17 may represent another example of the aberration correction system 1500 of FIG. 15. For example, the charged particle beam 1710 of FIG. 17 can include and/or be at least a portion of the charged particle beam 1502 of FIG. 15.

The aberration correction system 1700 of FIG. 17 is similar to the aberration correction system 1600 of FIG. 16. For example, and as shown in FIG. 17, the aberration correction system 1700 includes a deflector assembly 1720 that includes four 90-degree electrostatic prisms and a plurality of electrostatic multipole elements 1730. Unless otherwise stated, all illustrated components of the aberration correction system 1700, labeled or unlabeled, can share any suitable features, characteristics, attributes, etc. with the corresponding components of the aberration correction system 1500 of FIG. 15 and/or the aberration correction system 1600 of FIG. 16. For those components labeled in FIG. 17, components labeled with a reference numeral of the form "17XX" are intended to correspond with the components labeled with a reference numeral of the form "15XX" in FIG. 15 and/or "16XX" in FIG. 16. For example, the first electrostatic prism 1722 corresponds to, and may be at least substantially identical to, the first electrostatic prism 1522 of FIG. 15 and/or the first electrostatic prism 1622 of FIG. 16.

Compared to the deflector assembly 1620 of FIG. 16, the fourth multipole element 1636 of the deflector assembly 1720 additionally is configured to generate a fourth hexapole field (in addition to the fourth element quadrupole field), while the fifth multipole element 1744 additionally is configured to generate a fifth hexapole field (in addition to the fifth element quadrupole field). Accordingly, in this example, the fourth hexapole field and the fourth element quadrupole field are at least partially overlapping, and the fifth hexapole field and the fifth element quadrupole field are at least partially overlapping.

Similar to the first multipole element 1638 and the third multipole element 1742, each of the fourth multipole element 1636 and the fifth multipole element 1744 can be configured to generate corresponding quadrupole and hexapole fields in any suitable manner, such as with a single multipole (e.g., hexapole) element or with a hexapole-generating element in combination with a quadrupole-generating element.

Relative to the aberration correction system 1600 of FIG. 16, the inclusion of two additional hexapole fields of the aberration correction system 1700 of FIG. 17 (viz., the fourth hexapole field and the fifth hexapole field) can reduce off-axial aberrations, thus rendering the aberration correction system 1600 less sensitive to beam drift.

Figure 18:
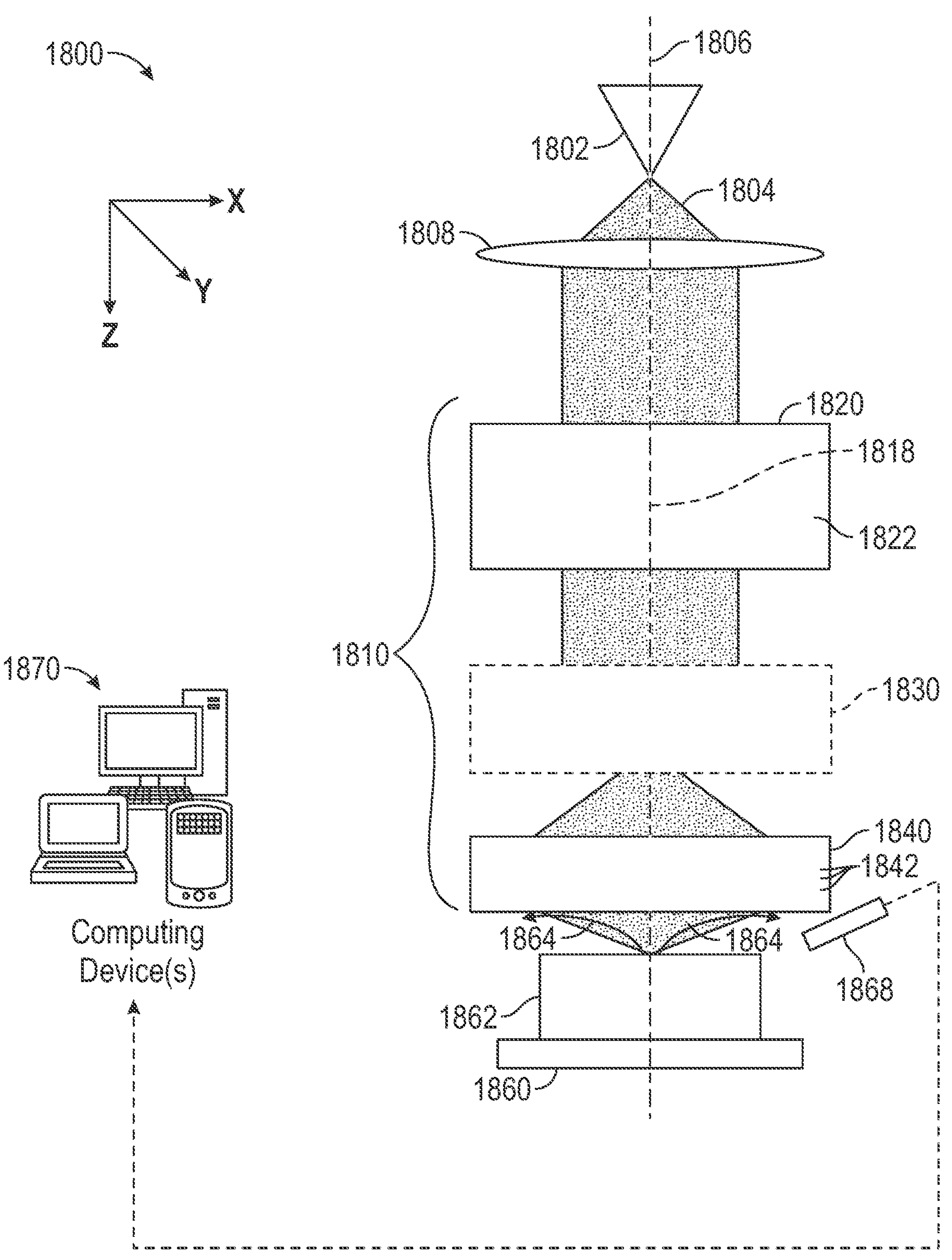
FIG. 18 is a schematic side elevation view of a charged particle microscope system according to an example.

FIG. 18 illustrates another example of a charged particle microscope system 1800 that can include and/or utilize aberration correction systems as disclosed herein. In particular, and as described in more detail below, the charged particle microscope system 1800 can include a plurality of quadrupole and octupole electrostatic elements that collectively operate to strongly reduce or nullify the spherical aberration $C_S$ of a charged particle beam. Such a configuration can produce a large source demagnification in a relatively short optical column, which may be particularly beneficial for chromatic and/or spherical aberration corrected FIB systems and/or for plasma-FIB systems, because the focused probe is less blurred by Coulomb interactions in a shorter column.

The charged particle microscope system 1800 of FIG. 18 is similar to the charged particle microscope system 100 of FIG. 1. For example, the charged particle microscope system 1800 includes a charged particle source 1802 that emits a charged particle beam 1804 along an emission axis 1806 and toward a focusing column 1810 (which also may be referred to herein as an optical column 1810). The charged particle beam 1804 travels along an optical axis 1818 through the focusing column 1810. The optical axis 1818 can include and/or be a curved optical axis, such as any of the deflector optical axes 308/518/618/708/808/908/1008/1108/1208/1308/1418/1602/1702 disclosed herein. As shown in FIG. 18, the charged particle microscope system 1800 can include condenser optics 1808 that accelerate/decelerate, focus, and/or direct the charged particle beam 1804 toward the focusing column 1810.

Downstream of the focusing column 1810, the charged particle microscope system 1800 includes a sample holder 1860 that holds a sample 1862 and a detector 1868 that is configured to detect charged particles 1864 that are discharged from the sample 1862 as a result of the charged particle beam 1804 being incident upon the sample 1862. The charged particle microscope system 1800 further can include one or more computing devices 1870 programmed and/or configured to control operation of one or more aspects of the charged particle microscope system 1800.

Except as discussed below, all illustrated components of the charged particle microscope system 1800, labeled or unlabeled, can share any suitable features, characteristics, attributes, etc. with the corresponding components of the charged particle microscope system 100 of FIG. 1. Additionally, the charged particle microscope system 1800 can include any suitable components and/or exhibit any suitable functionality disclosed herein with reference to the charged particle microscope system 100 of FIG. 1.

In the example of FIG. 18, the optical column 1810 can be configured to at least partially correct an axial spherical aberration and/or an axial chromatic aberration of the charged particle beam 1804. As shown in FIG. 18, the optical column 1810 includes a multipole condenser 1820 and a multipole objective 1840 downstream of the multipole condenser 1820. The multipole condenser 1820 includes one or more condenser quadrupole-generating elements 1822, while the multipole objective 1840 includes a plurality of objective multipole elements 1842. In some examples, one or more beam limiting apertures can be positioned upstream of the multipole condenser 1820.

The plurality of objective multipole elements 1842 can have any of a variety of configurations, examples of which are discussed in more detail below. In general, the plurality of objective multipole elements 1842 includes at least three quadrupole-generating elements as well as at least three octupole-generating elements that are configured to at least partially correct a spherical aberration of the charged particle beam 1804. In some examples, and as described in more detail below, one or more of the objective multipole elements 1842 can operate to generate a quadrupole field as well as an octupole field, and thus may be described as representing both a quadrupole-generating element and an octupole-generating element.

In some examples, and as shown in FIG. 18, the optical column additionally includes a chromatic aberration corrector 1830 positioned between the multipole condenser 1820 and the multipole objective 1840. In such examples, the chromatic aberration corrector 1830 can include and/or be any suitable apparatus for at least partially correcting an axial chromatic aberration of the charged particle beam 1804. Examples of the chromatic aberration corrector 1830 include any of the aberration correction systems 300, 1100, 1200, 1300, 1600, and/or 1700, and/or any suitable portions and/or components thereof. In other examples, chromatic aberration in the charged particle beam 1804 can be at least partially corrected by an emitter corrector.

Similar to the charged particle microscope system 100 of FIG. 1, the charged particle microscope system 1800 can include and/or be one or more different types of EM and/or charged particle microscopes, examples of which include a scanning electron microscope (SEM), a scanning transmission electron microscope (STEM), a transmission electron microscope (TEM), a charged particle microscope (CPM), dual beam microscopy system, etc. Accordingly, the charged particle source 1802 can be configured to emit the charged particle beam 1804 with any suitable accelerating voltage, such as an accelerating voltage that corresponds to the type of microscopy being performed. As examples, the charged particle source 1802 can be configured to emit the charged particle beam 1804 with an accelerating voltage that is at least 200 volts (V), at least 1,000 V, at least 5,000 V, at least 10,000 V, at least 20,000 V, at least 50,000 V, at most 100,000 V, at most 30,000 V, at most 15,000 V, at most 7,000 V, at most 2,000 V, and/or at most 500 V.

Figure 19:
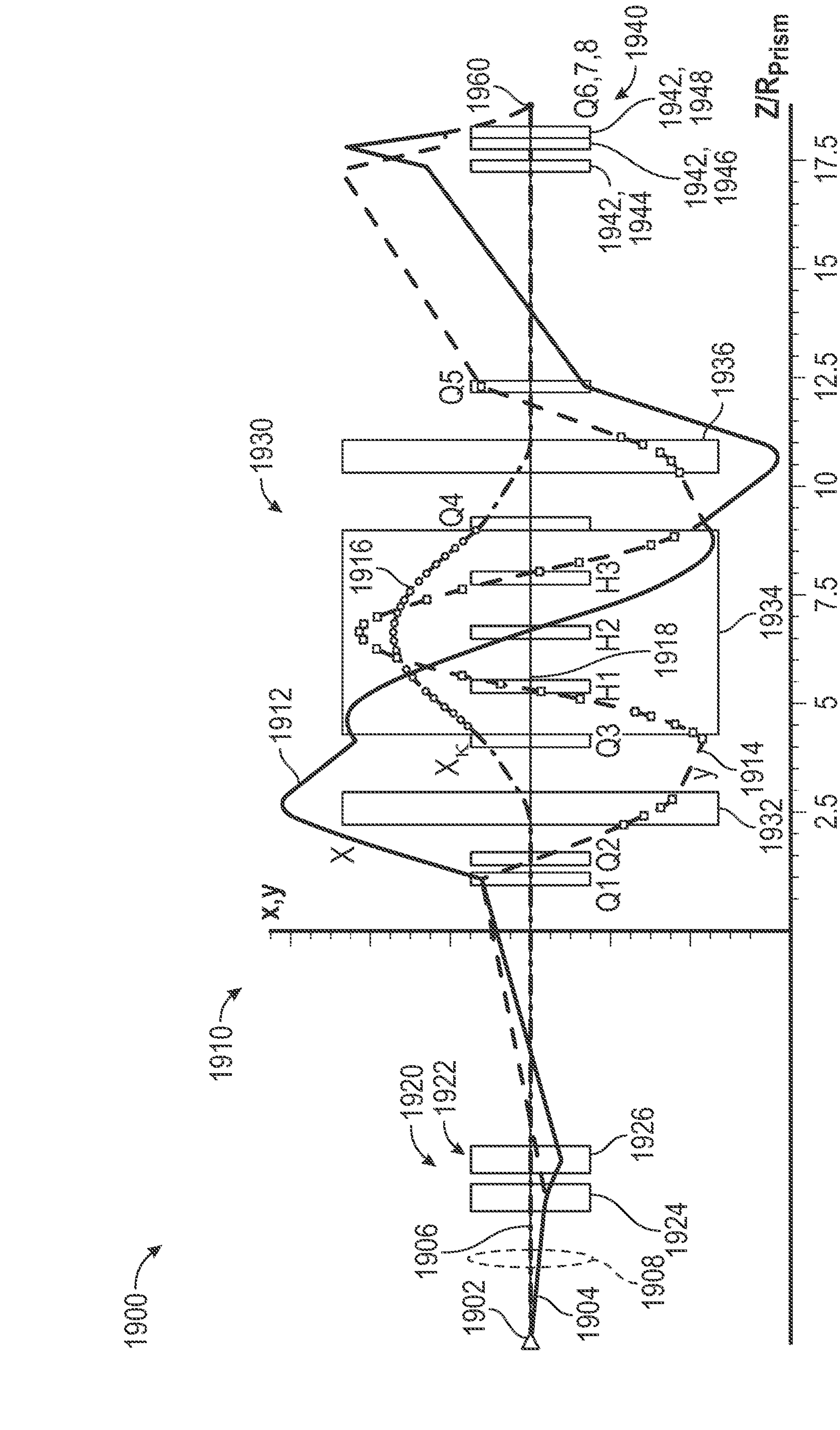
FIG. 19 is a schematic representation of a charged particle microscope system and of the fundamental rays of a charged particle beam traversing the charged particle microscope system, in which chromatic and third order aberrations are corrected, according to an example.

FIG. 19 illustrates aspects of another example of a charged particle microscope system 1900, which may be described as representing an example of the charged particle microscope system 1800 of FIG. 18. The charged particle microscope system 1900 of FIG. 19 includes a charged particle source 1902 that emits a charged particle beam 1904 and an optical column 1910 that directs the charged particle beam 1904 toward a sample 1960. The charged particle beam 1904 travels along an optical axis 1918 through the optical column 1910. FIG. 19 additionally illustrates examples of the fundamental rays x(z), y(z), and $x_\kappa(z)$, respectively labeled 1912, 1914, and 1916, of the charged particle beam 1904 as it traverses the optical column 1910.

Unless otherwise specified, all illustrated components of the charged particle microscope system 1900, labeled or unlabeled, can share any suitable features, characteristics, attributes, etc. with the corresponding components of the charged particle microscope system 1800 of FIG. 18.

For those components labeled in FIG. 19, components labeled with a reference numeral of the form "19XX" are intended to correspond with the components labeled with a reference numeral of the form "18XX" in FIG. 18. For example, the condenser optics 1908 of FIG. 19 correspond to, and may be at least substantially identical to, the condenser optics 1808 of FIG. 18.

As shown in FIG. 19, the charged particle microscope system 1900 includes a chromatic aberration corrector 1930, which may be described as an example of the chromatic aberration corrector 1830 of FIG. 18. As shown in FIG. 19, the chromatic aberration corrector 1930 includes an entry electrostatic prism 1932, a corrector electrostatic prism 1934, and an exit electrostatic prism 1936, as well as a plurality of electrostatic quadrupole-generating elements labeled Q1, . . . , Q4 and a plurality of electrostatic hexapole-generating elements labeled H1, . . . , H3.

The chromatic aberration corrector 1930 may be similar to the aberration correction system 300 of FIG. 3 and/or the aberration correction system 1100 of FIG. 11. For example, the entry electrostatic prism 1932 and the exit electrostatic prism 1936 can share any suitable features, characteristics, attributes, etc. with the entry electrostatic prisms 304/1104 and/or the entry electrostatic prisms 306/1106, respectively. Similarly, the corrector electrostatic prism 1934 can share any suitable features, characteristics, attributes, etc. with the corrector electrostatic prisms 312/1112.

As shown in FIG. 19, the charged particle microscope system 1900 includes a multipole condenser 1920 that includes a quadrupole doublet 1922. Specifically, the quadrupole doublet 1922 includes a first condenser quadrupole-generating element 1924 and a second condenser quadrupole-generating element 1926 positioned downstream of the first condenser quadrupole-generating element 1924. The first condenser quadrupole-generating element 1924 is configured to generate a first condenser quadrupole field, while the second condenser quadrupole-generating element 1926 is configured to generate a second condenser quadrupole field. In other examples, the multipole condenser 1920 can include a single quadrupole-generating element.

Additionally, in the example of FIG. 19, the charged particle microscope system 1900 includes a multipole objective 1940 with a plurality of objective multipole elements 1942.

Specifically, in the example of FIG. 19, the plurality of objective multipole elements 1942 includes a first objective multipole element 1944, a second objective multipole element 1946 positioned downstream of the first objective multipole element 1944, and a third objective multipole element 1948 positioned downstream of the second objective multipole element 1946. The first objective multipole element 1944, the second objective multipole element 1946, and the third objective multipole element 1948 are configured to generate a first objective multipole field, a second objective multipole field, and a third objective multipole field, respectively.

Figure 20:
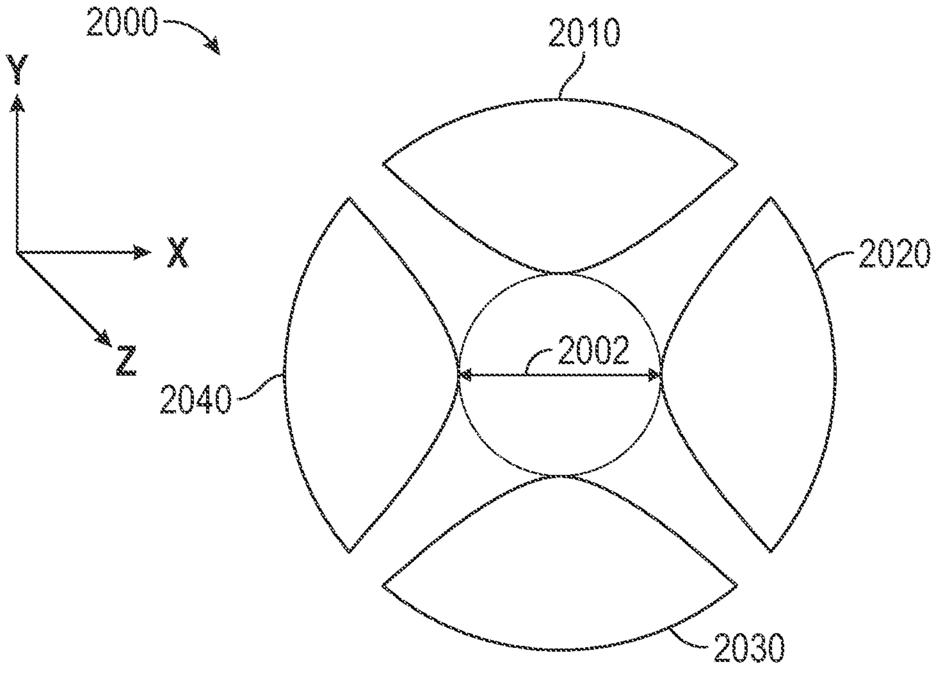
FIG. 20 is a front elevation view of an electrostatic multipole element with four electrodes according to an example.

Each electrostatic multipole element of the charged particle microscope system 1800 and/or of the charged particle microscope system 1900 can have any suitable configuration for generating the corresponding multipole fields. As an example, FIG. 20 illustrates an example of a multipole element 2000 that includes a first electrode 2010, a second electrode 2020, a third electrode 2030, and a fourth electrode 2040, each configured to receive a corresponding voltage to generate a respective component of the corresponding multipole field. Accordingly, the multipole element 2000 may be referred to as a quadrupole-generating element 2000 and/or may be configured to generate a quadrupole field. Stated differently, the multipole element 2000 can be configured such that the multipole field generated by the multipole element 2000 includes a quadrupole field as a primary constituent multipole field.

In some examples, however, the multipole element 2000 also can be configured such that the multipole field generated by the multipole element 2000 further includes additional multipole field components, such as an octupole field component. In particular, each of the first electrode 2010, the second electrode 2020, the third electrode 2030, and the fourth electrode 2040 can be configured (e.g., shaped) such that the total multipole field generated by the multipole element 2000 includes a quadrupole field component and an octupole field component. In some examples, the relative magnitudes and/or respective configurations of the quadrupole and octupole fields generated by the multipole element 2000 can be controlled via application of appropriate respective voltages to the electrodes of the multipole element 2000 and/or via suitable shaping of the electrodes of the multipole element 2000.

As shown in FIG. 20, the multipole element 2000 can be characterized by a multipole element inner diameter 2002 that represents a minimum separation distance between opposed electrodes, as measured along a direction perpendicular to the z-axis in FIG. 20. The multipole element inner diameter 2002 additionally or alternatively may be described as representing a maximum diameter of a charged particle beam that passes through the multipole element 2000.

The multipole element inner diameter 2002 can assume any of a variety of values, such as a value in the range of about 1-5 millimeters (mm).

Figure 21:
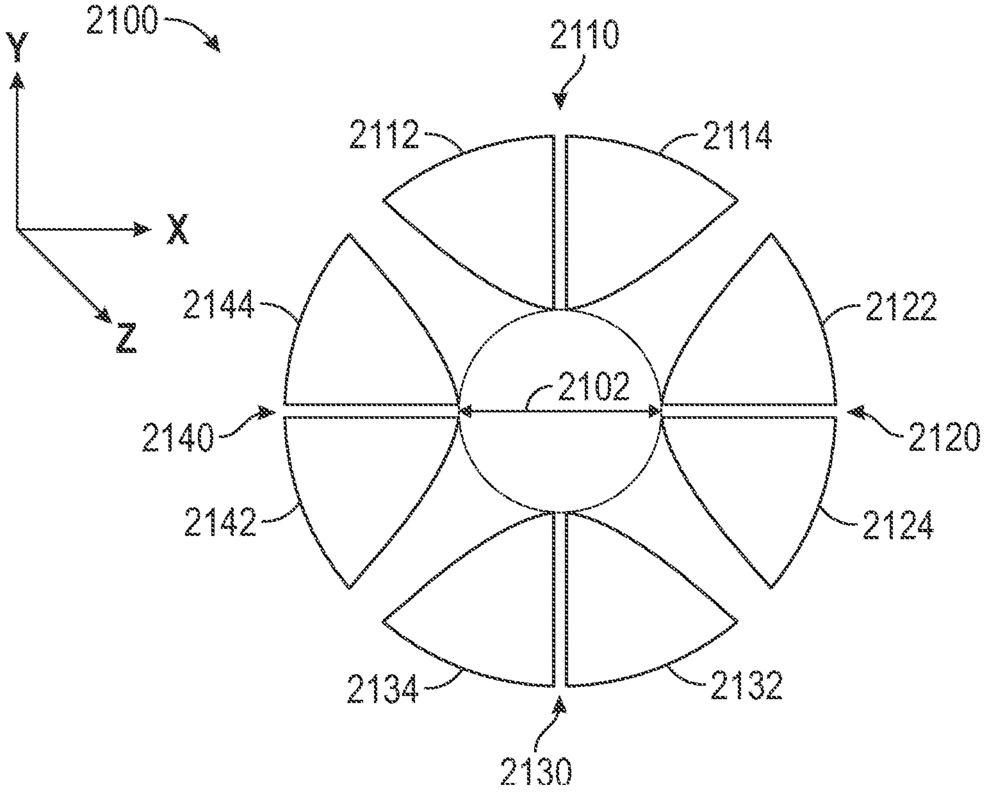
FIG. 21 is a front elevation view of an electrostatic multipole element with eight electrodes according to an example.

FIG. 21 illustrates another example of a multipole element 2100 that can represent any suitable multipole element of the charged particle microscope system 1800 and/or of the charged particle microscope system 1900. In the example of FIG. 21, the multipole element 2100 includes a first electrode pair 2110, a second electrode pair 2120, a third electrode pair 2130, and a fourth electrode pair 2140. The first electrode pair 2110 includes a first electrode 2112 and a second electrode 2114; the second electrode pair 2120 includes a third electrode 2122 and a fourth electrode 2124; the third electrode pair 2130 includes a fifth electrode 2132 and a sixth electrode 2134; and the fourth electrode pair 2140 includes a seventh electrode 2142 and an eighth electrode 2144.

In some examples, the multipole element 2100 of FIG. 21 may be configured to generate a quadrupole field as a primary multipole field. For example, the multipole element 2100 can be configured such that each of the first electrode pair 2110, the second electrode pair 2120, the third electrode pair 2130, and the fourth electrode pair 2140 can receive a respective voltage for generating a corresponding quadrupole field. Accordingly, in such examples, the multipole element 2100 may be described as representing a quadrupole-generating element.

Additionally or alternatively, the multipole element 2100 can be configured such that each of the first electrode 2112, the second electrode 2114, the third electrode 2122, the fourth electrode 2124, the fifth electrode 2132, the sixth electrode 2134, the seventh electrode 2142, and the eighth electrode 2144 can receive a respective voltage for generating the corresponding multipole field. In such examples, the multipole element 2100 may be configured to operate as a quadrupole-generating element for aberration correction as described herein, as well as to generate small deflection fields superimposed on the quadrupole field to scan a charged particle beam relative to a sample. In particular, configuring the multipole element 2100 such that different deflection voltages may be applied to each electrode of each electrode pair an facilitate generating such deflection fields while minimizing the generation of undesirable multipole fields (e.g., hexapole fields) that can introduce additional aberrations.

In some examples, the multipole element 2100 additionally or alternatively may be configured to generate an octupole field (e.g., as a primary or sole multipole field). In some examples, the relative magnitudes and/or respective configurations of the octupole and quadrupole fields generated by the multipole element 2100 can be controlled via application of appropriate respective voltages to the electrodes of the multipole element 2100 and/or via suitable shaping of the electrodes of the multipole element 2100.

As shown in FIG. 21, the multipole element 2000 can be characterized by a multipole element inner diameter 2102 that represents a minimum separation distance between opposed electrodes, as measured along a direction perpendicular to the z-axis in FIG. 21. The multipole element inner diameter 2102 additionally or alternatively may be described as representing a maximum diameter of a charged particle beam that passes through the multipole element 2100.

The multipole element inner diameter 2102 can assume any of a variety of values, such as a value in the range of about 1-5 mm.

FIGS. 22-25 illustrates aspects of additional examples of charged particle microscope systems, respectively labeled 2200, 2300, 2400, and 2500. Each of the charged particle microscope system 2200, the charged particle microscope system 2300, the charged particle microscope system 2400, and the charged particle microscope system 2500 can be described as representing an example of the charged particle microscope system 1800 of FIG. 18.

Figure 22:
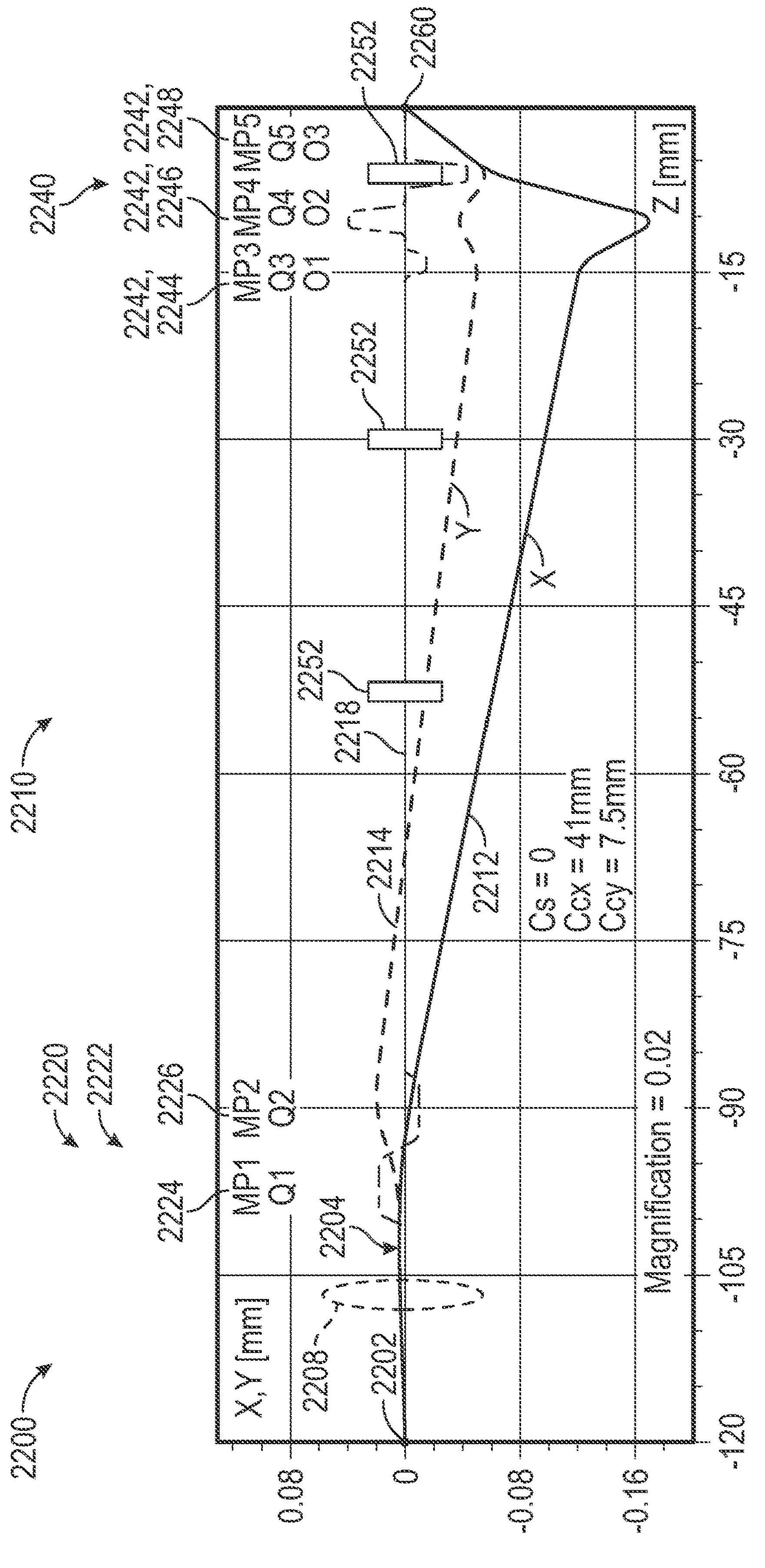
FIG. 22 is a schematic representation of a charged particle microscope system and of the fundamental rays of a charged particle beam traversing the charged particle microscope system, in which third order aberrations are corrected and the charged particle microscope system operates with a first magnification, according to an example.
Figure 23:
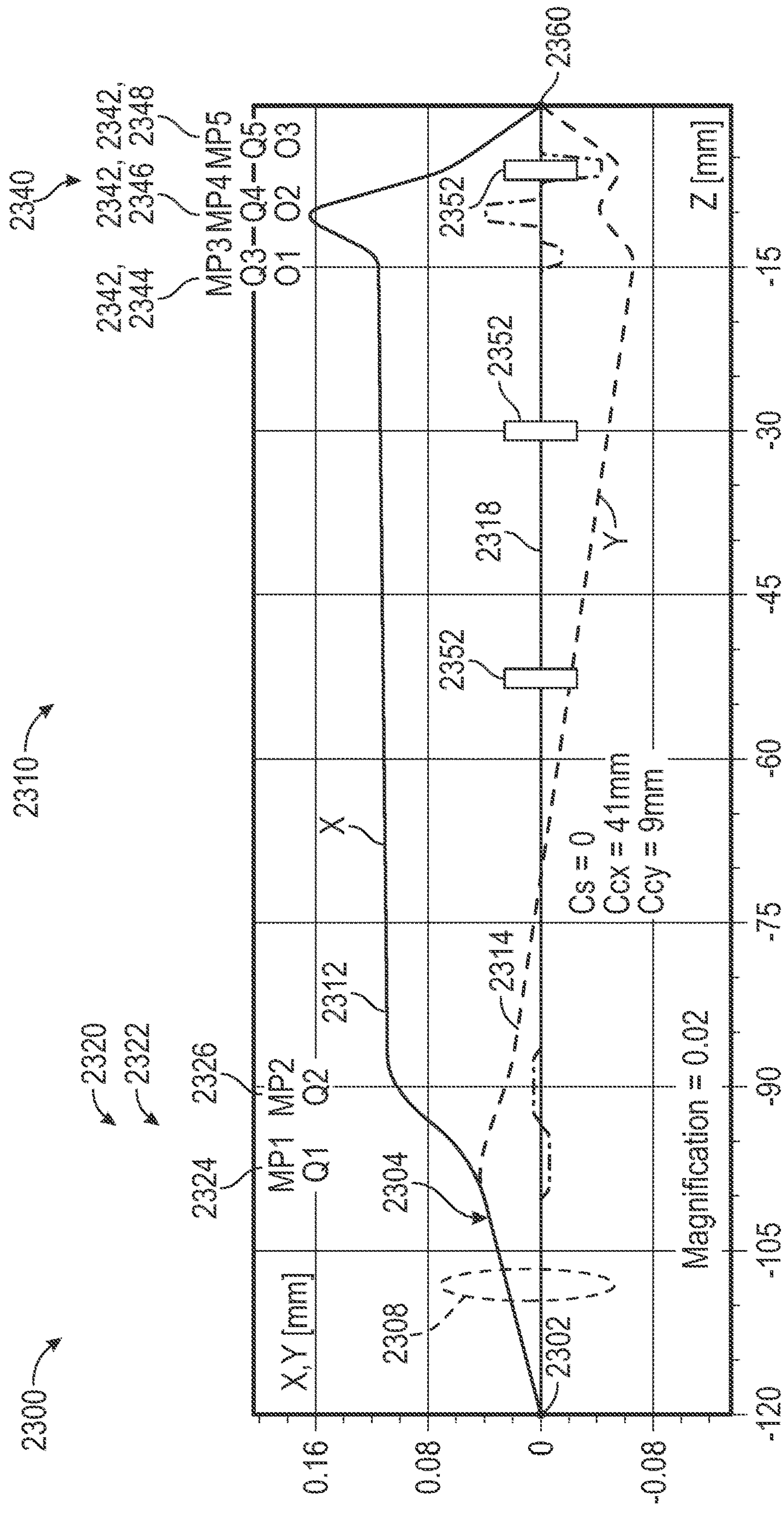
FIG. 23 is a schematic representation of the charged particle microscope system of FIG. 22 and of the fundamental rays of a charged particle beam traversing the charged particle microscope system, in which third order aberrations are corrected and the charged particle microscope system operates with a second magnification, according to an example.

The charged particle microscope system 2200 of FIG. 22 and the charged particle microscope system 2300 of FIG. 23 may be described as representing similar charged particle microscope systems, or the same charged particle microscope system, under different operational conditions (namely, under different magnifications of the charged particle beam).

Accordingly, all illustrated components of the charged particle microscope system 2300 of FIG. 23, labeled or unlabeled, can share any suitable features, characteristics, attributes, etc. with the corresponding components of the charged particle microscope system 2200 of FIG. 22.

For those components labeled in FIG. 23, components labeled with a reference numeral of the form "23XX" are intended to correspond with the components labeled with a reference numeral of the form "22XX" in FIG. 22.

Additionally, unless otherwise specified, all illustrated components of the charged particle microscope systems 2200 or 2300, labeled or unlabeled, can share any suitable features, characteristics, attributes, etc. with the corresponding components of the charged particle microscope system 1800 of FIG. 18. For those components labeled in FIGS. 22-23, components labeled with a reference numeral of the form “22XX” or “23XX” are intended to correspond with the components labeled with a reference numeral of the form “18XX” in FIG. 18.

Though not specifically illustrated in any of FIGS. 22-25, it is to be understood that any of the charged particle microscope systems 2200/2300/2400/2500 can include and/or be used in conjunction with any of the chromatic aberration correction systems disclosed herein and/or any suitable components thereof. For example, any of the aberration correction systems 300/1100/1200/1300/1500/1600/1700/1800 and/or any suitable portion thereof can be positioned along the optical axis 2218/2318/2418/2518 in a manner similar to the chromatic aberration corrector 1830 of FIG. 18.

Figure 24:
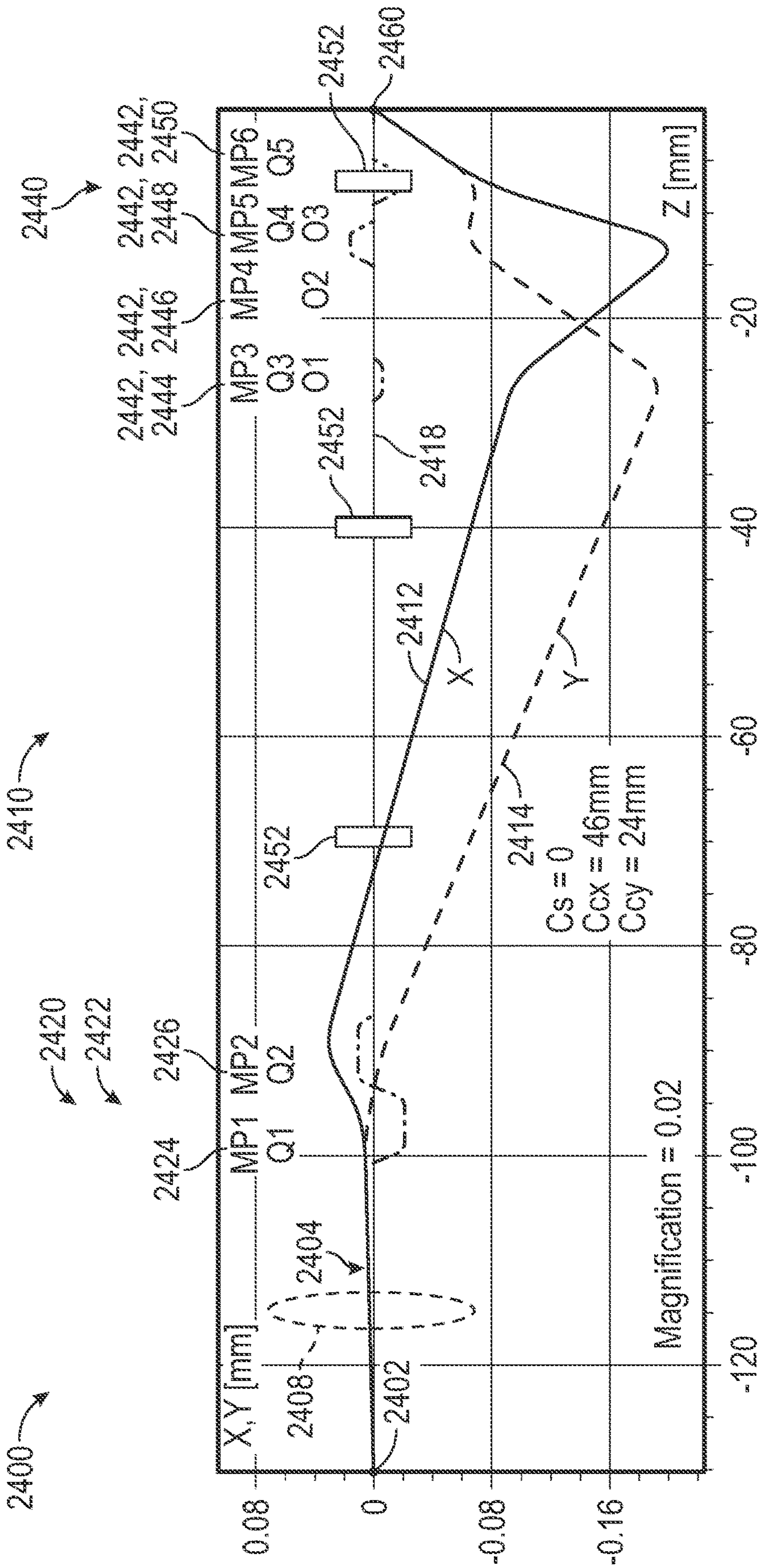
FIG. 24 is a schematic representation of another charged particle microscope system and of the fundamental rays of a charged particle beam traversing the charged particle microscope system, in which third order aberrations are corrected and the charged particle microscope system operates with a first magnification, according to an example.
Figure 25:
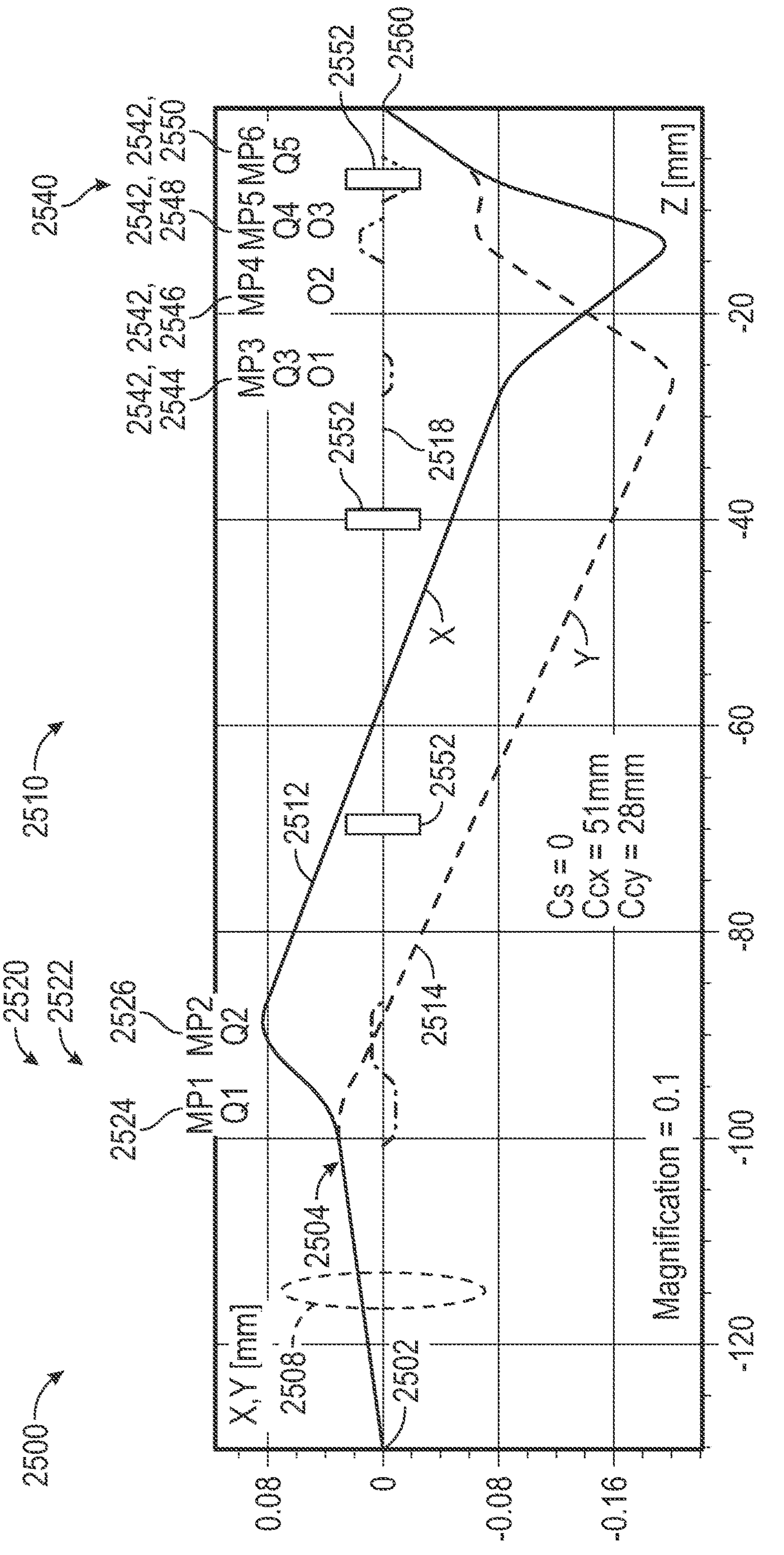
FIG. 25 is a schematic representation of the charged particle microscope system of FIG. 24 and of the fundamental rays of a charged particle beam traversing the charged particle microscope system, in which third order aberrations are corrected and the charged particle microscope system operates with a second magnification, according to an example.

Similarly, the charged particle microscope system 2400 of FIG. 24 and the charged particle microscope system 2500 of FIG. 25 may be described as representing similar charged particle microscope systems, or the same charged particle microscope system, under different operational conditions (namely, under different magnifications of the charged particle beam).

Accordingly, all illustrated components of the charged particle microscope system 2500 of FIG. 25, labeled or unlabeled, can share any suitable features, characteristics, attributes, etc. with the corresponding components of the charged particle microscope system 2400 of FIG. 24. For those components labeled in FIG. 25, components labeled with a reference numeral of the form “25XX” are intended to correspond with the components labeled with a reference numeral of the form “24XX” in FIG. 24.

Additionally, unless otherwise specified, all illustrated components of the charged particle microscope systems 2400 or 2500, labeled or unlabeled, can share any suitable features, characteristics, attributes, etc. with the corresponding components of the charged particle microscope system 1800 of FIG. 18. For those components labeled in FIGS. 24-25, components labeled with a reference numeral of the form “24XX” or “25XX” are intended to correspond with the components labeled with a reference numeral of the form “18XX” in FIG. 18.

With reference to FIG. 22, the charged particle microscope system 2200 includes a charged particle source 2202 that emits a charged particle beam 2204 and an optical column 2210 that directs the charged particle beam 2204 toward a sample 2260. The charged particle beam 2204 travels along an optical axis 2218 through the optical column 2210. FIG. 22 additionally illustrates examples of the fundamental rays x(z) and y(z), respectively labeled 2212 and 2214, of the charged particle beam 2204 as it traverses the optical column 2210. In the example of FIG. 22, the charged particle microscope system 2200 additionally includes a plurality of beam deflectors 2252 positioned along the optical axis 2218. Such beam deflectors 2252 can be used to deflect the charged particle beam 2204 to scan the charged particle beam 2204 across the sample 2260.

As shown in FIG. 22, and similar to the charged particle microscope system 1900 of FIG. 19, the charged particle microscope system 2200 includes a multipole condenser 2220 with a quadrupole doublet 2222 that includes a first condenser quadrupole-generating element 2224 and a second condenser quadrupole-generating element 2226. In the example of FIG. 22, each of the first condenser quadrupole-generating element 2224 and the second condenser quadrupole-generating element 2226 is configured to generate a respective quadrupole field. In other examples, the multipole condenser 2220 can include a single quadrupole-generating element, such as the first condenser quadrupole-generating element 2224.

In further analogy to the charged particle microscope system 1900 of FIG. 19, the charged particle microscope system 2200 additionally includes a multipole objective 2240 with a plurality of objective multipole elements 2242. The plurality of objective multipole elements 2242 includes a first objective multipole element 2244, a second objective multipole element 2246 positioned downstream of the first objective multipole element 2244, and a third objective multipole element 2248 positioned downstream of the second objective multipole element 2246.

The first objective multipole element 2244, the second objective multipole element 2246, and the third objective multipole element 2248 are configured to generate a first objective multipole field, a second objective multipole field, and a third objective multipole field, respectively. In particular, in the example of FIG. 22, the first objective multipole field includes a first objective quadrupole field component and a first objective field octupole field component.

The second objective multipole field includes a second objective quadrupole field component and a second objective octupole field component. The third objective multipole field includes a third objective quadrupole field component and a third objective octupole field component. In this manner, the plurality of objective multipole elements 2242 may be described as including exactly three quadrupole-generating elements. Stated differently, in this example, exactly three objective multipole elements 2242 are configured to generate quadrupole field components.

Each of the objective multipole elements 2242 can have any suitable form and/or configuration for generating the corresponding objective multipole field. In some examples, each of the first objective multipole element 2244 and the second objective multipole element 2246 comprises four electrodes that are shaped to produce octupole fields in addition to quadrupole fields. As an example, one or both of the first objective multipole element 2244 and the second objective multipole element 2246 can be similar to, and/or can be, the multipole element 2000 of FIG. 20.

Additionally or alternatively, in some examples, the third objective multipole element 2248 can include eight electrodes for producing both quadrupole and octupole fields. As an example, the third objective multipole element 2248 can be similar to, and/or can be, the multipole element 2100 of FIG. 21. Such a configuration can be particularly beneficial in an example in which the third objective multipole element 2248 is used as a deflector for AC scanning of the charged particle beam 2204, possibly in combination with the beam deflectors 2252. In such examples, a large and unwanted auxiliary hexapole field may accompany the deflection field. Configuring the third objective multipole element 2248 to include eight distinct electrodes in the manner of the multipole element 2100 of FIG. 21 can enable applying eight respective deflection voltages to these electrodes configured with mutual ratios such that these unwanted hexapole fields are negated for deflection in the x- and/or y-direction. Alternatively, the third objective multipole element 2248 can include four electrodes in the manner of the multipole element 2000 of FIG. 20, and an additional multipole element can be introduced downstream of the third objective multipole element 2248 that is configured to perform the AC scanning. In such an example, this additional multipole element can include eight nominally identical electrodes for generating the corrective octupole field.

Such a configuration is not required of all examples, however. For example, it also is within the scope of the present disclosure that one or both of the first objective multipole element 2244 and the second objective multipole element 2246 can have eight electrodes in the manner of the multipole element 2100 of FIG. 21. Additionally or alternatively, the third objective multipole element 2248 can have four electrodes that are shaped to produce octupole fields in the manner of the multipole element 2000 of FIG. 20.

As discussed above, the charged particle microscope system 2200 of FIG. 22 and the charged particle microscope system 2300 of FIG. 23 are at least substantially identical aside from the magnification produced in the respective charted particle beams. Specifically, FIG. 22 illustrates an example in which the magnification is 0.02, while FIG. 23 illustrates an example in which the magnification is 0.2. In each case, it can be seen with reference to the fundamental rays x(z) 2212/2312 and y(z) 2214/2314 that the charged particle beam 2204/2304 lacks an intermediate point-crossover (at which x(z)=y(z)=0) between the multipole condenser 2220/2320 and the multipole objective 2240/2340. As a result, such a configuration can substantially reduce the undesirable Coulomb interactions between charged particles that can arise at such a point-crossover.

Additionally, with reference to the fundamental rays x(z) 2212/2312 and y(z) 2214/2314 shown in FIGS. 22-23, it can be seen that $|y(z)|\leq|x(z)|$ for a portion of the charged particle beam 2204/2304 extending through the multipole objective 2240/2340 (e.g., for the entirety of the beam length within the multipole objective). Moreover, in each example, charged particle beam 2204/2304 enters the multipole objective 2240/2340 with a non-circular beam profile (e.g., an elongated and/or elliptical beam profile) and maintains a non-circular beam profile through at least a portion of the multipole objective 2240/2340.

In the example of FIG. 22, the multipole condenser 2220 and the multipole objective 2240 are configured such that the axial spherical aberration of the charged particle beam 2204 at the sample 2260 is nullified. In this example, the transverse components of the axial chromatic aberration of the charged particle beam 2204 are $C_{cx}$=41 mm and $C_{xy}$=7.5 mm. Similarly, in the example of FIG. 23, the multipole condenser 2320 and the multipole objective 2340 are configured such that the axial spherical aberration of the charged particle beam 2304 at the sample 2360 is nullified. In this example, the transverse components of the axial chromatic aberration of the charged particle beam 2304 are $C_{cx}$=41 mm and $C_{cy}$=9 mm. Thus, in the examples of FIGS. 22-23, the axial chromatic aberration is nearly nullified in the yz-plane at multiple magnifications of the charged particle beam 2204/2304.

The charged particle microscope system 2400 of FIG. 24 is substantially similar to the charged particle microscope systems 2200/2300 of FIGS. 22-23. Unlike the examples of FIGS. 22-23, however, the charged particle microscope system 2400 includes a multipole objective 2440 that includes four objective multipole elements 23442. Specifically, in the example of FIG. 24, the multipole objective 2440 includes a first objective multipole element 2444, a second objective multipole element 2446 positioned downstream of the first objective multipole element 2444, a third objective multipole element 2448 positioned downstream of the second objective multipole element 2446, and a fourth objective multipole element 2450 positioned downstream of the third objective multipole element 2448.

The first objective multipole element 2444, the second objective multipole element 2446, the third objective multipole element 2448, and the fourth objective multipole element 2450 are configured to generate a first objective multipole field, a second objective multipole field, a third objective multipole field, and a fourth objective multipole field, respectively. In particular, in the example of FIG. 24, the first objective multipole field includes a first objective quadrupole field component and a first objective field octupole field component. The second objective multipole field includes a second objective octupole field component. The third objective multipole field includes a third objective quadrupole field component and a third objective octupole field component. The fourth objective multipole field includes a fourth objective quadrupole field component. In this manner, the plurality of objective multipole elements 23442 may be described as including exactly three quadrupole-generating elements. Stated differently, in this example, exactly three objective multipole elements 23442 are configured to generate quadrupole field components.

Each of the objective multipole elements 2442 can have any suitable form and/or configuration for generating the corresponding objective multipole field. In some examples, each of the first objective multipole element 2444 and the third objective multipole element 2448 comprises four electrodes that are shaped to produce octupole fields in addition to quadrupole fields. As an example, one or both of the first objective multipole element 2444 and the third objective multipole element 2448 can be similar to, and/or can be, the multipole element 2000 of FIG. 20.

Additionally or alternatively, in some examples, the second objective multipole element 2446 can include eight electrodes for producing octupole fields. As an example, the second objective multipole element 2446 can be similar to, and/or be, the multipole element 2800 of FIG. 28, described in more detail below.

Additionally or alternatively, in some examples, the fourth objective multipole element 2450 can include eight electrodes for producing both quadrupole and octupole fields. As an example, the fourth objective multipole element 2450 can be similar to, and/or can be, the multipole element 2100 of FIG. 21.

Such a configuration is not required of all examples, however. For example, it also is within the scope of the present disclosure that one or more of the first objective multipole element 2444, the second objective multipole element 2446, and/or the third objective multipole element 2448 can have eight electrodes in the manner of the multipole element 2100 of FIG. 21. Additionally or alternatively, the fourth objective multipole element 2450 can have four electrodes that are shaped to produce octupole fields in the manner of the multipole element 2000 of FIG. 20.

As discussed above, the charged particle microscope system 2400 of FIG. 24 and the charged particle microscope system 2500 of FIG. 25 are at least substantially identical aside from the magnification produced in the respective charted particle beams. Specifically, FIG. 24 illustrates an example in which the magnification is 0.02, while FIG. 25 illustrates an example in which the magnification is 0.1. In each case, it can be seen with reference to the fundamental rays x(z) 2412/2512 and y(z) 2414/2514 that the charged particle beam 2404/2504 lacks an intermediate point-crossover (at which x(z)=y(z)=0) between the multipole condenser 2420/2520 and the multipole objective 2440/2540. As a result, such a configuration can substantially reduce the undesirable Coulomb interactions between charged particles that can arise at such a point-crossover.

Additionally, with reference to the fundamental rays x(z) 2412/2512 and y(z) 2414/2514 shown in FIGS. 24-25, it can be seen that $|y(z)| \le |x(z)|$ for a portion of the charged particle beam 2404/2504 extending through the multipole objective 2440/2540 (e.g., for the entirety of the beam length within the multipole objective). Moreover, in each example, the charged particle beam 2404/2504 enters the multipole objective 2440/2540 with a non-circular beam profile (e.g., an elongated and/or elliptical beam profile) and maintains a non-circular beam profile through at least a portion of the multipole objective 2440/2540.

In the example of FIG. 24, the multipole condenser 2420 and the multipole objective 2440 are configured such that the axial spherical aberration of the charged particle beam 2404 at the sample 2460 is nullified. In this example, the transverse components of the axial chromatic aberration of the charged particle beam 2404 are $C_{cx}$=46 mm and $C_{cy}$=24 mm. Similarly, in the example of FIG. 25, the multipole condenser 2520 and the multipole objective 2540 are configured such that the axial spherical aberration of the charged particle beam 2504 at the sample 2560 is nullified. In this example, the transverse components of the axial chromatic aberration of the charged particle beam 2504 are $C_{cx}$=51 mm and $C_{cy}$=28 mm. Thus, in the examples of FIGS. 24-25, the axial chromatic aberration is significantly smaller the yz-plane than in the xz-plane at multiple magnifications of the charged particle beam 2404/2504.

Figure 26:
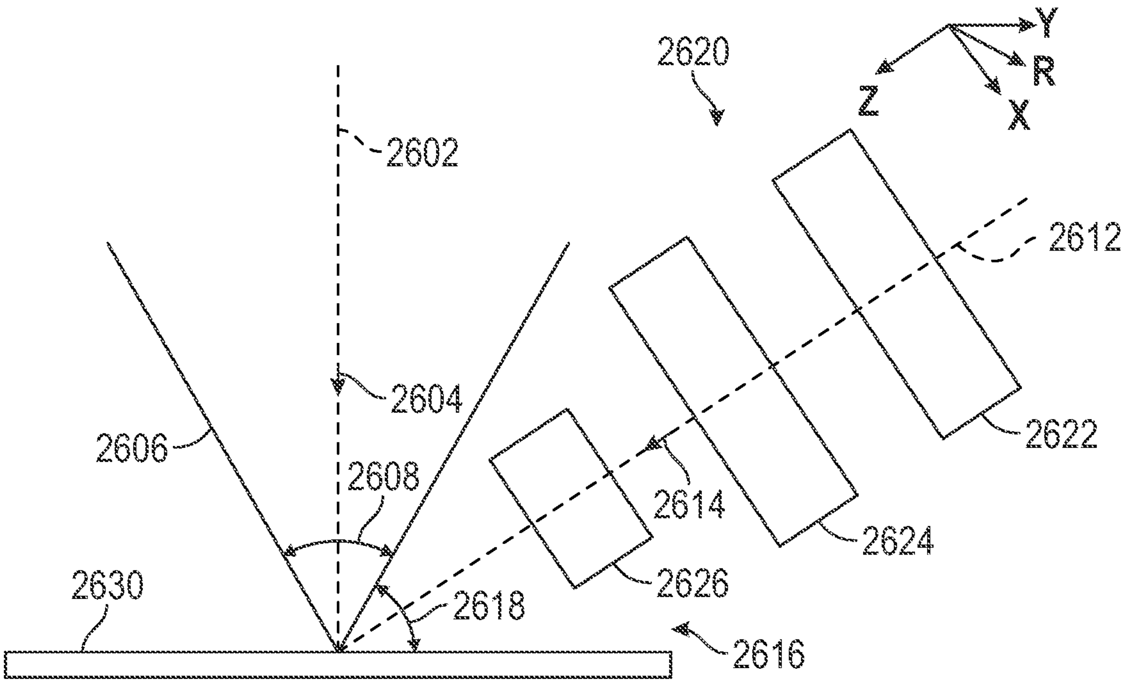
FIG. 26 is a side elevation view of a first charted particle beam and a second charged particle beam that are focused to a common location on a sample according to an example.

The apparatuses and systems of the present disclosure also may be particularly suitable for use in examples in which a charged particle microscope system directs a plurality of charged particle beams to a sample and/or target focus location. As an example, FIG. 26 illustrates a configuration in which each of a first charged particle beam 2604 (e.g., an SEM beam) and a second charged particle beam 2614 (e.g., a FIB beam) are focused to a common location on a sample 2630. In this example, the first charged particle beam 2604 travels along a first axis 23602, while the second charged particle beam 2614 travels along a second axis 2612.

As shown in FIG. 26, the first charged particle beam 2604 may be characterized by and/or associated with a first exclusion region 2606 that is characterized by a first exclusion region angular extent 2608. For example, the first exclusion region 2606 may represent a beam profile of the first charged particle beam 2604 approaching the sample 2630, or may represent a region associated with (e.g., occupied by) lens components directing the first charged particle beam 2604 to the sample 2630. In the example of FIG. 26, the first exclusion region 2606 is a conical region that terminates at the sample 2630.

The first exclusion region 2606 may represent a region that cannot be occupied by the second charged particle beam 2614 or by associated lens components. For example, as shown in FIG. 26, the second charged particle beam 2614 may be directed toward the sample 2630 by and/or via a multipole objective 2620 that includes a first objective multipole element 2622, a second objective multipole element 2624, and a third objective multipole element 2626, each of which must be positioned exterior to the first exclusion region 2606. The multipole objective 2620 can represent the multipole objectives 2240/2340 of FIGS. 22-23, or any other similarly configured multipole objective.

In the example of FIG. 26, the first axis 2602 is normal to the surface of the sample 2630, such that the first charged particle beam 2604 and the sample 2630 collectively confine the second charged particle beam 2614 and associated components to occupy a free space 2616 defined therebetween. This free space can be characterized, for example, by a free space angle 2618 as measured in the xz-plane in FIG. 26.

In some examples, the free space angle 2618 can represent a limit to the proximity with which the multipole elements of the multipole objective 2620 can be positioned relative to the sample 2630. In general, it can be desirable to position the multipole elements of the multipole objective 2620 as near as possible to the sample 2630 in order to minimize the chromatic aberration as well high order geometric aberrations, both inherent (i.e., excluding mechanical errors) and parasitic (i.e., aberrations due to mechanical errors). Accordingly, and as described in more detail below, the multipole objective 2620 may be configured such that the multipole objective 2620 may be positioned desirably close to the sample 2630 while maintaining components (e.g., multipole elements) of the multipole objective 2620 exclusively within the free space 172616 exterior of the first exclusion region 2606.

Figure 27:
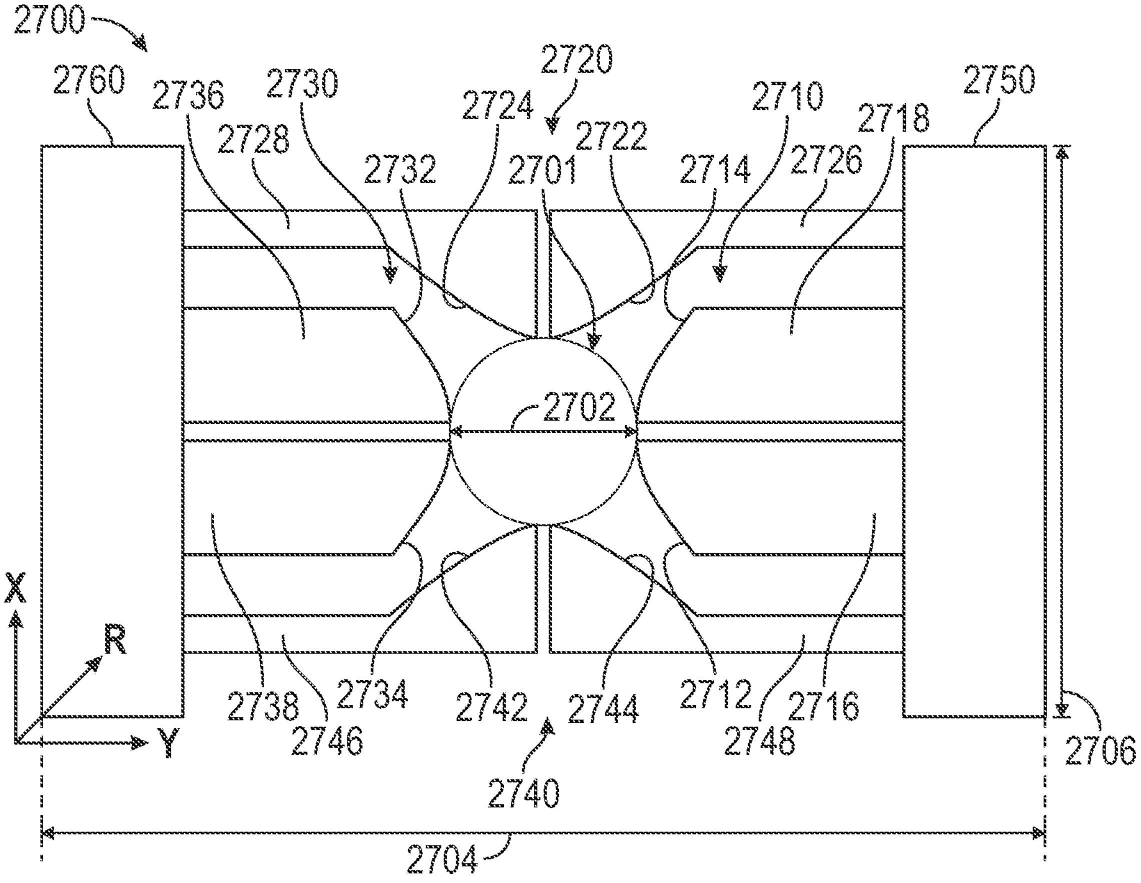
FIG. 27 is a front elevation view of an electrostatic multipole element with eight electrodes formed as microelectromechanical systems according to an example.

FIG. 27 illustrates an objective multipole element 2700 that is similar to the multipole element 2100 of FIG. 21. In particular, the objective multipole element 2700 includes a first electrode pair 2710, a second electrode pair 2720, a third electrode pair 2730, and a fourth electrode pair 2740. The first electrode pair 2710 includes a first electrode active surface 2712 and a first electrode extension 2716 extending away from the first electrode active surface 2712, as well as a second electrode active surface 2714 and a second electrode extension 2718 extending away from the second electrode active surface 2714. The second electrode pair 2720 includes a third electrode active surface 2722 and a third electrode extension 2726 extending away from the third electrode active surface 2722, as well as a fourth electrode active surface 2724 and a fourth electrode extension 2728 extending away from the fourth electrode active surface 2724. The third electrode pair 2730 includes a fifth electrode active surface 2732 and a fifth electrode extension 2736 extending away from the fifth electrode active surface 2732, as well as a sixth electrode active surface 2734 and a sixth electrode extension 2738 extending away from the sixth electrode active surface 2734. The fourth electrode pair 2740 includes a seventh electrode active surface 2742 and a seventh electrode extension 2746 extending away from the seventh electrode active surface 2742, as well as an eighth electrode active surface 2744 and an eighth electrode extension 2748 extending away from the eighth electrode active surface 2744.

In the example of FIG. 27, each of the first electrode active surface 2712, the second electrode active surface 2714, the third electrode active surface 2722, the fourth electrode active surface 2724, the fifth electrode active surface 2732, the sixth electrode active surface 2734, the seventh electrode active surface 2742, and the eighth electrode active surface 2744 faces a central bore 2701 of the multipole element 2700. The central bore 2701 can be characterized by a multipole element inner diameter 2702 that represents a minimum separation distance between opposed electrodes, as measured along a direction perpendicular to the z-axis in FIG. 27. In this manner, the objective multipole element 2700 can be described as representing an example of the multipole element 2100 of FIG. 21, of the third objective multipole element 2626 of FIG. 26, and/or of any other objective multipole element disclosed herein. Additionally or alternatively, the multipole element 2100 of FIG. 21 may be described as representing and/or illustrating a portion of the objective multipole element 2700 of FIG. 27.

In the example of FIG. 27, each of the electrodes of the objective multipole element 2700 are formed as MEMS devices. In particular, in this example, each of the first electrode extension 2716, the second electrode extension 2718, the third electrode extension 2726, and the eighth electrode extension 2748 is supported by a first electrode support 2750, while each of the fourth electrode extension 2728, the fifth electrode extension 2736, the sixth electrode extension 2738, and the seventh electrode extension 2746 is supported by a second electrode support 2760.

Configuring the electrodes of the objective multipole element 2700 to be formed as MEMS devices can facilitate forming the objective multipole element 2700 such that the multipole element inner diameter 2702 is significantly smaller than in conventional electrode designs, thereby further facilitating positioning the objective multipole element 2700 proximate to the sample. Such a configuration also can facilitate producing the objective multipole element 2700 with reduced mechanical errors and/or to tighter dimensional tolerances relative to non-MEMS systems. It is to be understood that any multipole element disclosed herein, including any multipole element including more or fewer than eight electrodes, also can be formed as a MEMS device in the manner of the objective multipole element 2700.

The objective multipole element 2700 also may be characterized with reference to one or more linear dimensions thereof (e.g., as measured in the x-y plane illustrated in FIG. 27). For example, and as shown in FIG. 27, the objective multipole element 2700 has a first dimension 2706 as measured along the x-direction that is smaller than a second dimension 2704 as measured along the y-direction. As discussed in more detail below, such a configuration may facilitate positioning such an objective multipole element 2700 in a region that is spatially constrained in a dimension corresponding to the x-direction in FIG. 27.

Figure 28:
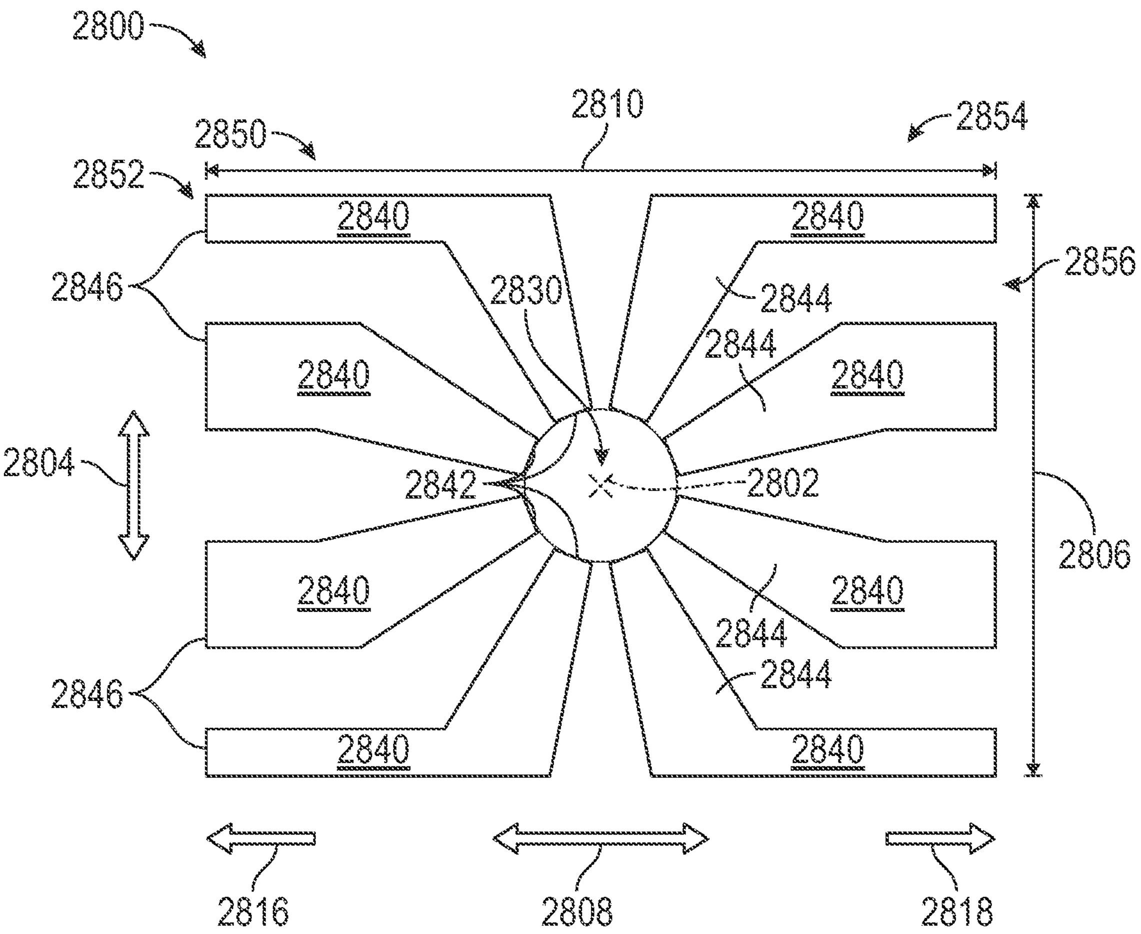
FIG. 28 is a front elevation view of an electrostatic multipole element with eight electrodes with electrode extensions extending along a first lateral direction or a second lateral direction according to an example.

FIG. 28 illustrates another example of a multipole element 2800 that may be used in a spatially constrained dual-beam system such as that of FIG. 26. The multipole element 2800 includes a plurality of electrodes 2840 defining a central bore 2830 therebetween. The central bore 2830 extends at least partially along a beam axis 2802, such as the second axis 2612 of FIG. 26 and/or another axis along which a charged particle beam (e.g., the charged particle beam 2614 of FIG. 26) can travel. Specifically, FIG. 28 represents a view of the multipole element 2800 in which the beam axis 2802 extends into the page. It is to be understood that each electrode 2840 can have a thickness along a direction parallel to the beam axis 2802 such that the central bore 2830 defined by the electrodes 2840 may be described as extending along the beam axis 2802.

Similar to the electrostatic hexapole-generating element 200 of FIG. 2, the multipole element 2800 can be configured to produce an electrostatic multipole field by applying respective voltages to the electrodes 2840. In the example of FIG. 28, the multipole element 2800 includes eight electrodes 2840 and thus may be configured to generate an octupole electrostatic field. In such examples, the multipole element 2800 thus may be described as representing an octupole-generating element. Additionally or alternatively, the multipole element 2800 may be configured to generate any of a variety of other multipole fields, such as a quadrupole electrostatic field, a hexapole electrostatic field, etc. via application of appropriate voltages to the eight electrodes 2840 thereof. Accordingly, the multipole element 2800 additionally or alternatively may be referred to as an electrostatic multipole element 2800.

In the example of FIG. 28, each electrode 2840 includes a respective electrode active surface 2842 that faces and/or partially defines the central bore 2830 and a respective electrode extension 2844 that extends away from the electrode active surface 2842. Each electrode extension 2844 can include and/or define a respective electrical contact location 2846 that is configured to be electrically coupled to another component (e.g., an electrical lead) to supply a voltage to the electrode. In this manner, each electrode active surface 2842 can generate a respective electrostatic field component based upon the voltage that is supplied to the corresponding electrical contact location 2846 that is spaced apart from the electrode active surface 2842.

In the example of FIG. 28, each electrode extension 2844 (or at least a portion thereof) extends away from the corresponding electrode active surface 2842 at least partially along a lateral direction. Specifically, the plurality of electrodes 2840 includes a first side subset of electrodes 2852 generally positioned on the left side of FIG. 28 and a second side subset of electrodes 2856 generally positioned on the right side of FIG. 28.

As shown in FIG. 28, for each electrode 2840 of the first side subset of electrodes 2852, the electrode extension 2844 extends away from the electrode active surface 2842 along a first lateral direction 2816 perpendicular to the beam axis 2802. Similarly, for each electrode 2840 of the second side subset of electrodes 2856, the electrode extension 2844 extends away from the electrode active surface 2842 along a second lateral direction 2818 that is perpendicular to the beam axis 2802 and opposed to the first lateral direction 2816.

As shown in FIG. 28, the electrode extensions 2844 of the electrodes 2840 of the first side subset of electrodes 2852 may be described as extending to and terminating in a first side region 2850 of the multiple element 2800. Similarly, the electrode extensions 2844 of the electrodes 2840 of the second side subset of electrodes 2856 may be described as extending to and terminating in a second side region 2854 of the multipole element 2800. The first side region 2850 and the second side region 2854 may correspond to spaced-apart regions of the multipole element 2800 that are positioned on opposite sides of the central bore 2830.

In some examples, the first lateral direction 2816 and the second lateral direction 2818 are coplanar and/or antiparallel to one another. In particular, in such examples, the electrodes 2840 and/or the electrode extensions 2844 thereof can extend away from the central bore 2830 in a common plane that is at least substantially perpendicular to the beam axis 2802. This is not required of all examples, however, and it also is within the scope of the present disclosure that at least a portion of the multipole element 2800 is non-planar. For example, in some examples, and as discussed in more detail below with reference to FIG. 31, each electrode extension 2844 can extend away from the electrode active surface 2842 along a direction that is angled relative to each of a radial direction perpendicular to the beam axis 2802 and an axial direction parallel to the beam axis 2802.

Additionally, in the example of FIG. 28, the multipole element 2800 has different linear dimensions along directions perpendicular to the beam axis 2802. In particular, in this example, the electrodes 2840 extend away from the central bore 2830 such that the multipole element 2800 has a first dimension 2806, as measured along a first direction 2804 perpendicular to the beam axis 2802, that is smaller than a second dimension 2810 of the multipole element 2800, as measured along a second direction 2808 perpendicular to each of the beam axis 2802 and the first direction

2804. Such a configuration may facilitate positioning the multipole element 2800 proximate to a target focus location when a free region around the target focus location in which the multipole element 2800 may be positioned is constrained in at least one dimension. For example, with reference to FIG. 26, for a given position of a multipole element (e.g., the third objective multipole element 2626) along the second axis 2612, the free space 2616 in which the multipole element is positioned may have a greater angular extent in the y-direction than in the x-direction, such that the multipole element correspondingly may have a greater extent along the y-direction than along the x-direction. Correspondingly, in an example in which the multipole element 2800 of FIG. 28 represents the third objective multipole element 2626 of FIG. 26, the first direction 2804 of FIG. 28 may represent the x-direction of FIG. 26, while the second direction 2808 of FIG. 28 may represent the y-direction of FIG. 26.

The first dimension 2806 and the second dimension 2810 of the multipole element 2800 can have any of a variety of relative extents. As examples, a ratio of the second dimension 2810 to the first dimension 2806 may be at least 1.2:1, at least 1.5:1, at least 2:1, at least 2.5:1, at least 3:1 at most 4:1, at most 2.7:1, at most 2.3:1, at most 1.7:1, and/or at most 1.3:1.

While FIG. 28 is directed to an example in which the multipole element 2800 includes eight electrodes 2840, it is to be understood that the configurations and features described herein with reference to FIG. 28 also can apply to multipole elements including any other number of electrodes, such as four electrodes, six electrodes, 12 electrodes, 16 electrodes, etc. Similarly, the configurations and features described herein with reference to FIG. 28 also can apply to multipole elements configured to generate a quadrupole electrostatic field, a hexapole electrostatic field, an octupole electrostatic field, as 12-pole electrostatic field, etc.

Figure 29:
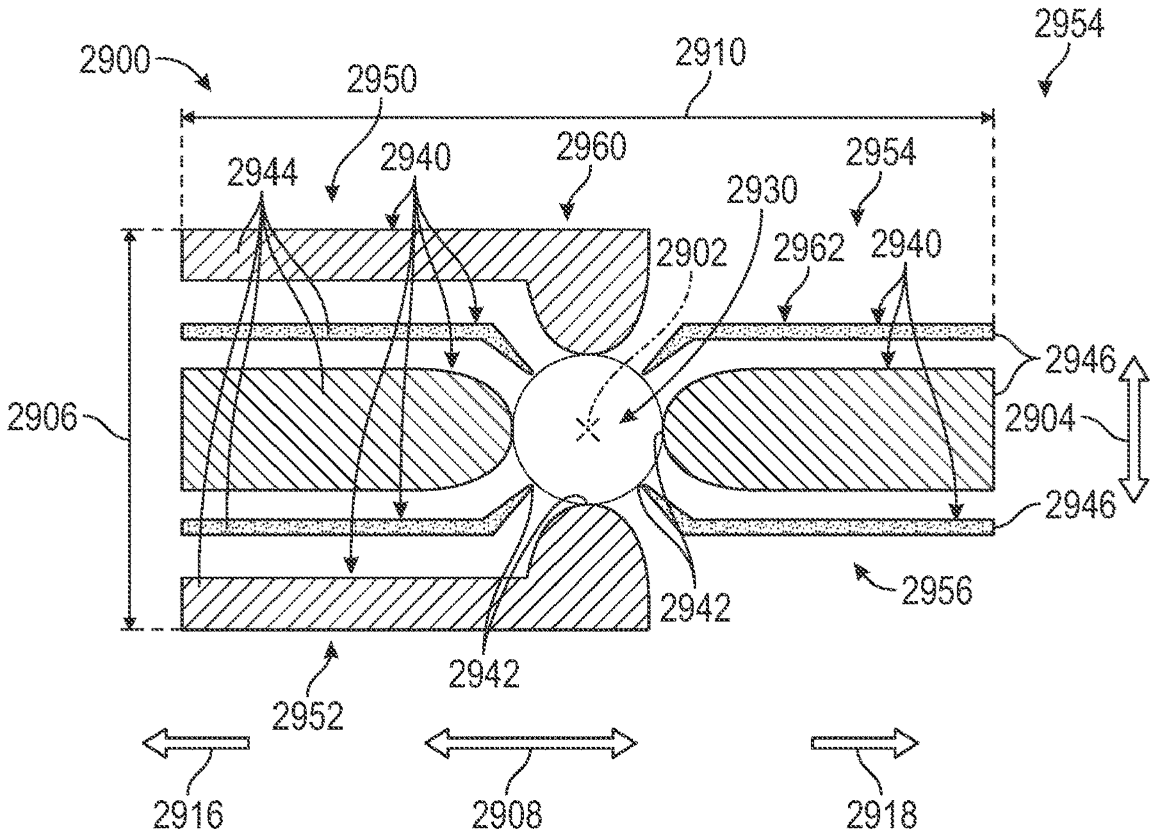
FIG. 29 is a front elevation view of an electrostatic multipole element with eight electrodes, each of which is a member of a first shape subset of electrodes or a second shape subset of electrodes, according to an example.

FIG. 29 illustrates another example of a multipole element 2900 that may be used in a spatially constrained application, such as in the dual-beam system of FIG. 26. Similar to the multipole element 2800 of FIG. 28, the multipole element 2900 includes a plurality of electrodes 2940 defining a central bore 2930 therebetween, each of which includes a respective electrode active surface 2942 and a respective electrode extension 2944.

The configuration of FIG. 29 may be particularly beneficial in examples in which it is desirable to produce an electrostatic multipole field with a multipole multiplicity that is different than the number of electrodes of the multipole element. As discussed above, a multipole element with eight electrodes can be configured to generate a quadrupole electrostatic field by applying appropriate voltages to the eight electrodes. In some cases, however, such a quadrupole field is accompanied by an undesirable parasitic 12-pole electrostatic field due to a large coupling between the quadrupole and 12-pole fields. Such parasitic fields may be described as an artifact of the electrode geometry. For example, such coupling may be particularly strong when all electrodes (or the active surfaces thereof) are identical in shape.

In various examples, such parasitic fields can be minimized and/or nullified by configuring a multipole element to include a number of electrodes that corresponds to the desired multiplicity of the generated multipole fields. For example, configuring a multipole element to include 12 electrodes can enable the multipole element to produce quadrupole fields with minimal parasitic 12-pole fields and to produce octupole fields with parasitic 16-pole fields of an acceptable magnitude. In some examples, however, spatial constraints and/or other practical considerations preclude the use of a 12-pole element to generate quadrupole and/or octupole fields, such as due to a lack of space in which to form and/or contain the required 12 distinct electrical connections. Configuring a multipole element to include eight electrodes of varying shapes, however, can enable the generation of both quadrupole and octupole electrostatic fields while restricting accompanying parasitic fields to acceptably small magnitudes.

As an example, FIG. 29 illustrates an example in which the electrodes 2940 are configured such that the active surfaces 2942 thereof are not all identical in shape. In particular, in this example, the plurality of electrodes 2940 includes a first shape subset of electrodes 2960 (indicated with hatch lines) and a second shape subset of electrodes 2962 (indicated with stippling). The electrode active surface 2942 of each electrode 2940 of the first shape subset of electrodes 2960 has a first active surface shape, while the electrode active surface 2942 of each electrode 2940 of the second shape subset of electrodes 2962 has a second active surface shape that is different than the first active surface shape. As used herein, each of the first active surface shape and the second active surface shape refers to a shape of the corresponding electrode active surface 2942 as viewed along a direction parallel to the beam axis 2930 (e.g., as illustrated in FIG. 29). For example, with reference to FIG. 29, the first active surface shape may be described as a rounded shape with a relatively large radius of curvature, while the second active surface shape may be described as a rounded shape with a relatively small radius of curvature.

Additionally or alternatively, the first active surface shape may be described as being wider than the second active surface shape.

In the example of FIG. 29, each of the first shape subset of electrodes 2960 and the second shape subset of electrodes 2962 includes an equal number of electrodes 2940 (namely, four electrodes 2940). Additionally, in this example, the electrodes 2940 of the first shape subset of electrodes 2960 are circumferentially interleaved with the electrodes 2940 of the second shape subset of electrodes 2962 in an alternating manner. Other configurations additionally are within the scope of the present disclosure.

FIG. 29 may represent an example of a multipole element 2900 that includes eight electrodes 2940 and that is configured to generate a quadrupole electrostatic field within the central bore 2930. In particular, via appropriate shaping of the active surfaces 2942 of the electrodes 2940 and via appropriate application of voltages to the active surfaces 2942, configuring the electrode active surfaces 2942 with alternating shapes can facilitate the generation of a quadrupole electric field while minimizing and/or negating associated parasitic 12-pole fields.

In some examples, properties of the multipole element 2900 can be characterized with reference to the relative magnitudes of multipole field components generated by the multipole element 2900. If fringe fields are ignored, the potential of a multipole field of multiplicity m can be expressed as $$\varphi_m(x, y) = \frac{1}{R^m} Re[V_m(x + iy)^m], \tag{43}$$

where m=2 for a quadrupole field, m=3 for a hexapole field, m=6 for a 12-pole field, etc., and R is an inner radius of the multipole element. Accordingly, the quadrupole field potential is given by $$\varphi_2(x, y) = \frac{V_2}{R^2}(x^2 - y^2), \tag{44}$$

while the 12-pole field potential is given by $$\varphi_6(x, y) = \frac{V_6}{R^6}(x^6 - 15x^4y^2 + 15x^2y^4 - y^6). \tag{45}$$

When a multipole element with eight identical electrodes arranged equidistant to an optical axis is excited to generate a quadrupole field as given by Equation (44), the multipole element also will generate an accompanying parasitic 12-pole field as given by Equation (45). In particular, in such an example, the quadrupole multipole component $V_2$ can be related to the 12-pole multipole component $V_6$ of the parasitic 12-pole field as $|V_6/V_2|\approx 0.25$.

By contrast, when the multipole element 2900 is excited to produce a quadrupole field, the quadrupole multipole component $V_2$ can be related to the 12-pole multipole component $V_6$ of the parasitic 12-pole field as $|V_6/V_2|\leq 0.1$. As used herein, the quantity $|V_6/V_2|$ characterizing the quadrupole and 12-pole multipole field components generated by a multipole element (e.g., the multipole element 2900) may be referred to as a 12-pole to quadrupole component ratio. The multipole element 2900 can be characterized by any of a variety of 12-pole to quadrupole component ratios, such as a 12-pole to quadrupole component ratio that is at most 0.1, at most 0.05, at most 0.01, and/or at least 0.001. In practice, the specific shapes of the electrodes 2940 of the first shape subset of electrodes 2960 and of the second shape subset of electrodes 2962 may be specifically selected and/or configured to mitigate and/or minimize parasitic aberrations and/or the 12-pole to quadrupole component ratio in this manner.

Similar to the multipole element 2800 of FIG. 28, the electrodes 2940 of the multipole element 2900 additionally may be partitioned into a first side subset of electrodes 2952 and a second side subset of electrodes 2956 as described above with reference to FIG. 28. As shown in FIG. 29, the first side subset of electrodes 2952 and the second side subset of electrodes 2956 can include different numbers of electrodes 2940. In particular, FIG. 29 illustrates an example in which the first side subset of electrodes 2952 includes five electrodes 2940 extending away from the central bore 2930 along the first lateral direction 2916 and in which the second side subset of electrodes 2956 includes three electrodes 2940 extending away from the central bore 2930 along the second lateral direction 2918. In this example, the multipole element 2900 exhibits a mirror symmetry about a plane that contains the beam axis 2930 and that is parallel to the second direction 2908.

Figure 30:
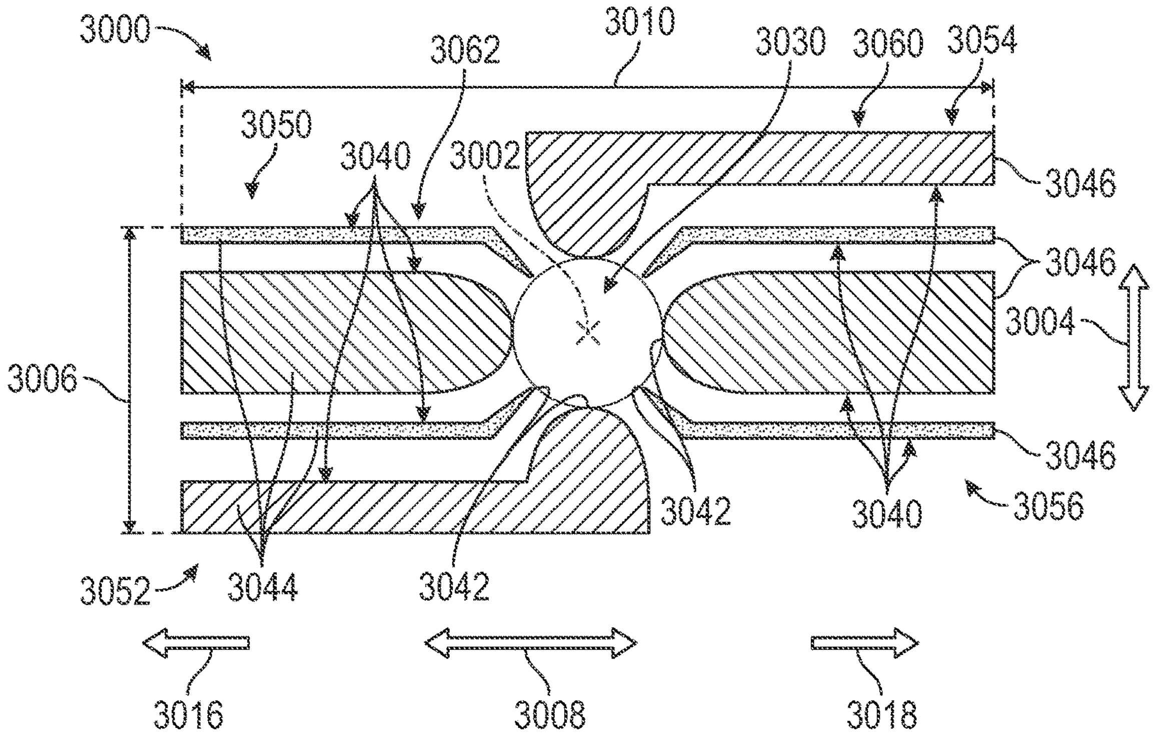
FIG. 30 is a front elevation view of an electrostatic multipole element with eight electrodes, each of which is a member of a first shape subset of electrodes or a second shape subset of electrodes, according to another example.

FIG. 30 illustrates an example of a multipole element 3000 that is substantially similar to the multipole element 2900 of FIG. 29 aside from the distribution of electrodes 3040 in the first side subset of electrodes 3052 and the second side subset of electrodes 3056. In particular, in the example of FIG. 30, each of the first side subset of electrodes 3052 and the second side subset of electrodes 3056 includes four electrodes 3040. In this example, the multipole element 3000 exhibits an axial symmetry about the beam axis 3002.

Unless otherwise specified, all illustrated components of the multipole element 2900 of FIG. 29 and the multipole element 3000 of FIG. 30, labeled or unlabeled, can share any suitable features, characteristics, attributes, etc. with the corresponding components of the multipole element 2800 of FIG. 28 and/or with corresponding components of one another. For example, for those components labeled in FIGS. 29-30, components labeled with a reference numeral of the form "29XX" or "30XX" are intended to correspond with the components labeled with a reference numeral of the form "28XX" in FIG. 28.

Figure 31:
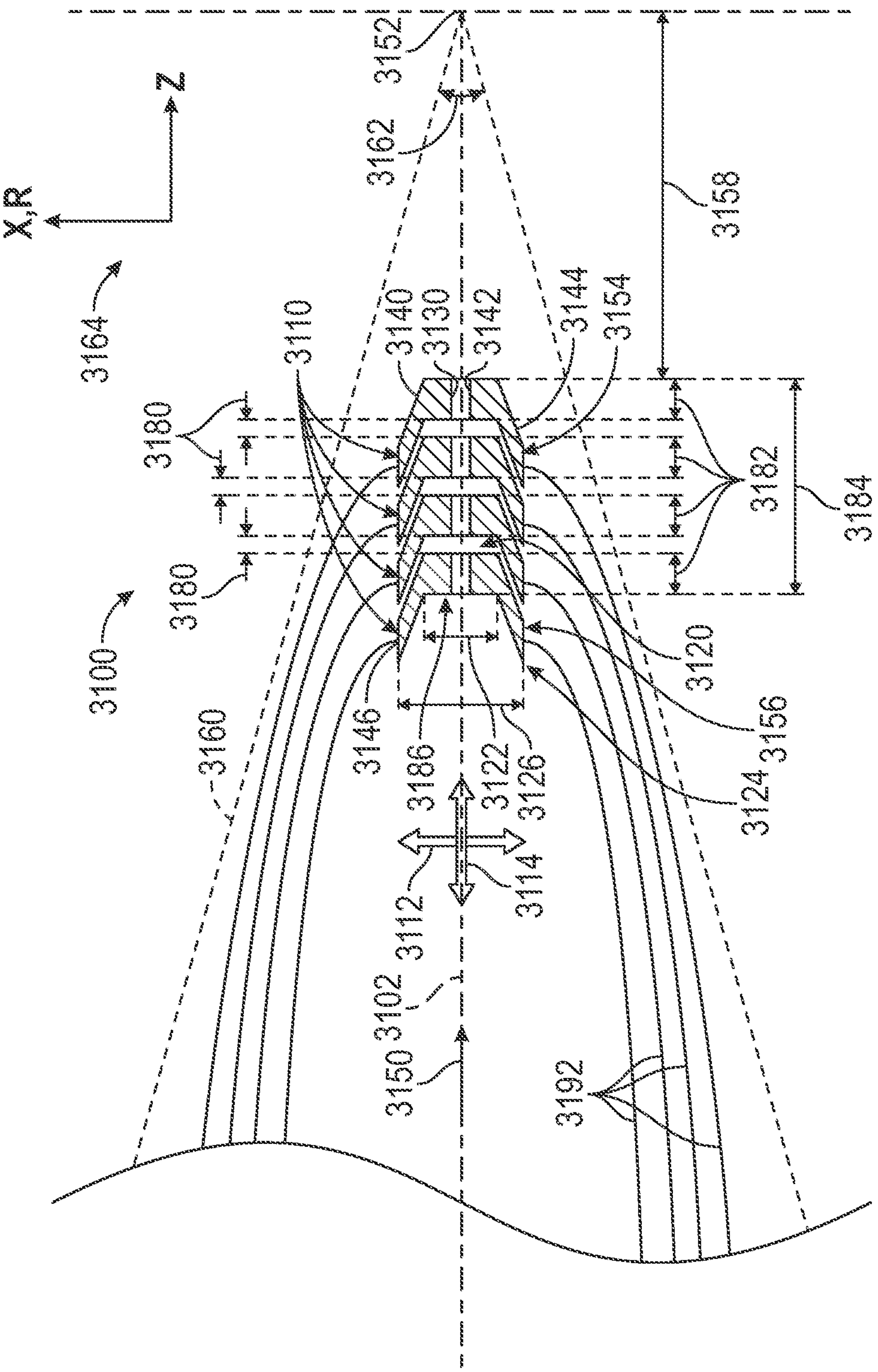
FIG. 31 is a cross-sectional side elevation view of an apparatus including a plurality of electrostatic multipole elements configured to be contained with a first angular envelope according to an example.

FIG. 31 illustrates an example of an assembly 3100 including a plurality of multipole elements 3110 axially aligned with respect to a beam axis 3102. Each multipole element 3110 of FIG. 31 can represent an example of any suitable multipole element disclosed herein, such as the multipole elements 2622, 2624, or 2626 of FIG. 26, the multipole element 2700 of FIG. 27, the multipole element 2800 of FIG. 28, the multipole element 2900 of FIG. 29, or the multipole element 3000 of FIG. 30.

In the example of FIG. 31, the multipole elements 3110 are configured to focus a charged particle beam 3150 traveling along the beam axis 3102 to a target focus location 3152, such as a location of interest on a sample (e.g., the sample 2630 of FIG. 26). In this example, the assembly 3100 and/or the plurality of multipole elements 3110 may be referred to as a multipole objective. As examples, the plurality of multipole elements 3110 may correspond to and/or represent the objective multipole elements 2242/2342 of the multipole objective 2240/2340 of FIGS. 22-23 or the objective multipole elements 2442/2542 of the multipole objective 2440/2540 of FIGS. 24-25. While FIG. 31 illustrates the assembly 3100 as including four multipole elements 3110, this is not required, and it is to be understood that the features and characteristics described herein with reference to FIG. 31 also can apply to analogous and/or otherwise identical assemblies including more than four multipole elements 3110 or fewer than four multipole elements 3110.

As shown in FIG. 31, the multipole objective lens may be characterized by a working distance 3158 separating a proximal multipole element 3154 and the target focus location 3152 (e.g., as measured along the beam axis 3102). Specifically, the proximal multipole element 3154 may refer to the multipole element 3110 that is positioned proximate to the target focus location 3152 relative to the remaining multipole elements 3110 of the multipole objective 3100. For example, the proximal multipole element 3154 may correspond to and/or represent the third objective multipole element 2248/2348 of FIGS. 22-23 or the fourth objective multipole element 2450/2550 of FIGS. 24-25. Additionally or alternatively, the proximal multipole element 3154 may correspond to and/or represent a multipole element that is configured for scanning and/or astigmatism correction of the charged particle beam 3150.

The multipole objective lens of FIG. 31 additionally may be characterized by an angular region, or envelope, defined relative to the beam axis 3102 and/or the target focus location 3152 and within which the multipole elements 3110 are spatially contained. For example, FIG. 31 illustrates a side view of the multipole objective as projected onto an x-z plane (e.g., with reference to the coordinate system of FIG. 26) that contains the beam axis 3102, which may be referred to herein as a first plane 3164. As shown in FIG. 31, the plurality of multipole elements 3110 are fully contained within a first angular envelope 3160 defined in the first plane 3164. Specifically, the first angular envelope 3160 represents a region of the first plane 3164 between two lines in the first plane 3164 that intersect one another and the beam axis 3102 at the target focus location 3152 and that subtend (e.g., are angled relative to one another by) a first angle 3162.

With reference to FIGS. 26 and 31, the first angle 3162 of FIG. 31 may be understood as representing and/or corresponding to the free space angle 2618 of FIG. 26. For example, the value of the free space angle 2618 may represent a maximum value of the first angle 3162 characterizing a region (e.g., the first angular envelope 3160) in which the plurality of multipole elements 3110 must fit in order to be received between the sample 2630 and the first exclusion region 2606 of FIG. 26.

In general, for a given value of the first angle 3162, a multipole element 3110 of any dimension (e.g., as measured in the x-direction of FIG. 31) may be accommodated within the first angular envelope 3160 when spaced apart from the target focus location 3152 by a sufficiently large working distance 3158. In various examples, however, an aberration (e.g., a spherical aberration) of the charged particle beam 3150 at the target focus location 3152 is related to (e.g., proportional to) the working distance 3158. Accordingly, it may be desirable to minimize the working distance 3158 to the extent permitted by other spatial constraints.

In particular examples, the multipole elements 3110 may be fully contained within the first angular envelope 3160 when the first angle 3162 is at least 25 degrees, at least 35 degrees, at least 45 degrees, at least 55 degrees, at most 60 degrees, at most 50 degrees, at most 40 degrees, and/or at most 30 degrees while the working distance 3158 is at least 2 mm, at least 5 mm, at least 10 mm, at least 20 mm, at most 30 mm, at most 15 mm, at most 10 mm, at most 7 mm, and/or at most 3 mm. In a specific example, the multipole elements 3110 may be fully contained within the first angular envelope 3160 when the first angle is at most 50 degrees and the working distance is at most 10 mm. One or more characteristics of the assembly 3100 of FIG. 31 additionally or alternatively may be characterized by and/or with reference to an aberration (e.g., a spherical aberration) of the charged particle beam 3150 at the target focus location 3152. As examples, the plurality of multipole elements 3110 may be configured to operate as an objective lens to focus the charged particle beam 3150 to the target focus location 3152 with a third order spherical aberration that is one or more of at most 5 mm, at most 3 mm, at most 2 mm, at most 1 mm, and/or at least 0.1 mm.

The multipole elements 3110 thus may have any of a variety of features as disclosed herein to facilitate positioning the multipole elements 3110 (e.g., at least the proximal multipole element 3154) close to the target focus location 3152 while maintaining the multipole elements 3110 within the first angular envelope 3160. For example, each multipole element 3110 may have a linear dimension along the x-direction of FIG. 31 that is sufficiently small to allow for positioning each multipole element 3110 desirably proximate to the target focus location 3152 while maintaining each multipole element 3110 within the first angular envelope 3160.

In various examples, this may be accomplished by configuring the multipole element 3110 with one or more structural features extending along a direction other than along the x-direction of FIG. 31. For example, the multipole element 3110 may be characterized by a first dimension as measured along the x-direction (e.g., the first dimension 2706/2806/2906/3006 of FIGS. 27-30) and a second dimension as measured along a y-direction transverse to the x- and z-directions (e.g., the second dimension 2704/2810/2910/3010 of FIGS. 27-30) such that the second dimension is greater than the first dimension. Stated differently, configuring the multipole element 3110 such that portions thereof (e.g., the electrode extensions 2840/284/3040 of FIGS. 28-30) extend along the y-direction may facilitate minimizing a linear dimension of the multipole element 3110 along the x-direction.

Additionally or alternatively, and as shown in FIG. 31, each multipole element 3110 may have a non-planar configuration with portions thereof extending partially along an axial direction. In particular, FIG. 31 illustrates an example in which each multipole element 3110 incudes a plurality of electrode active surfaces 3142 facing a central bore 3130 and a plurality of electrode extensions 3144 extending away from corresponding electrode active surfaces 3142, as discussed above with reference to FIGS. 27-30. As shown in FIG. 31, each electrode extension 3144 may be described as extending along a direction that extends away from the central bore 3130 partially along a radial direction 3112 perpendicular to the beam axis 3102 and partially along an axial direction 3114 parallel to the beam axis 3102. Stated differently, each electrode extension 3144 may be described as extending away from the corresponding electrode active surface 3142 along a direction that is angled relative to each of the radial direction 3112 and the axial direction 3114. While FIG. 31 illustrates the radial direction 3112 as being parallel to the x-direction, it is to be understood that the radial direction 3112 also may be any other direction perpendicular to the beam axis 3102.

In various examples, the multipole elements 2700/2800/2900/3000 of FIGS. 27-30 may be partially angled away from a planar configuration in the manner shown in FIG. 31. For example, the electrode extensions of the multipole elements of any of FIGS. 27-30 may extend away from the corresponding electrode active surfaces along a direction that is not perpendicular to the beam axis, similar to the multipole elements 3110 of FIG. 31.

Additionally or alternatively, each multipole element 3110 may be characterized by different linear dimensions thereof at different axial locations thereof. For example, and as shown in FIG. 31, each multipole element 3110 may be described as extending along a direction parallel to the beam axis 3102 (e.g., along the axial direction 3114) between a proximal end region 3120 thereof and a distal end region 3124 thereof. In some examples, the proximal end region 3120 is a region proximate to the central bore 3130 and the distal end region 3124 is a region distal to the central bore 3130. In some examples, and as shown in FIG. 31, each multipole element 3110 may be characterized by a first diameter 3122 at the proximal end region 3120 and a second diameter 3126 at the distal end region 3124 such that the second diameter 3126 is greater than the first diameter 3122. Each of the first diameter 3122 and the second diameter 3126 may be measured along a direction perpendicular to the beam axis 3102 (e.g., along the radial direction 3112). In such examples, the first diameter 3122 and the second diameter 3126 may be related in any suitable manner, such as to facilitate accommodating the multipole element 3110 within the first angular envelope 3160. As examples a ratio of the second diameter 3126 to the first diameter 3122 may be at least 1.2:1, at least 1.5:1, at least 2:1, at least 2.5:1, at least 3:1 at most 4:1, at most 2.7:1, at most 2.3:1, at most 1.7:1, and/or at most 1.3:1.

The configurations illustrated in FIG. 31 also may facilitate forming electrical connections with each multipole element 3110, such as to supply appropriate voltages to the electrodes 3140 of each multipole element 3110. For example, and as discussed above with reference to FIGS. 28-30, the electrode extension 3144 of each electrode 3140 may include an electrical contact location 3146 configured to be coupled to an electrical lead 3192 (e.g., a wire) to supply an electrical voltage to the corresponding electrode active surface 3142.

In the example of FIG. 31, each electrode active surface 3142 is axially offset from the corresponding electrical contact location 3146 (e.g., spaced apart along the axial direction 3114). Such a configuration may facilitate forming electrical connections between the electrical leads 3192 and the electrical contact locations 3146 in a region that is less spatially constrained than the proximal end region 3120 of each multipole element 3110. Stated differently, because a linear extent of the first angular envelope 3160 as measured along the x-direction of FIG. 31 increases with increasing distance from the target focus location 3152, electrical connections may be formed with relaxed spatial constraints and/or tolerances when such connections are formed at locations farther from target focus location 3152 relative to the electrode active surfaces 3142.

The assembly 3100 of FIG. 31 also may be characterized with reference to one or more linear dimensions of the multipole elements 3110 and/or the relative positions thereof as measured along the axial direction 3114. For example, each pair of adjacent multipole elements 3110 may be separated by a respective multipole element gap 3180. As examples, each multipole element gap 3180 may be at least 0.2 mm, at least 0.5 mm, at least 1 mm, at most 1.5 mm, at most 0.7 mm, and/or at most 0.3 mm. In various examples, the multipole element gaps 3180 characterizing the plurality of multipole elements 3110 may be different from one another, and/or may be controlled and/or configured to limit an aberration of the charged particle beam 2050 at the target focus location 3152.

Additionally or alternatively, each multipole element 3110 may be characterized by a respective multipole element length 3182, as measured along the axial direction 3114. In particular, in some examples, each multipole element 3110 includes a central region 3186 that defines the central bore 3130 (e.g., excluding electrode extensions 3144 extending axially away from the central bore 3130), and the multipole element length 3182 is measured in the central region 3186 of the multipole element 3110. As examples, each multipole element length 3182 may be at least 2 mm, at least 5 mm, at least 10 mm, at most 15 mm, at most 10 mm, at most 7 mm, and/or at most 3 mm. In various examples, the multipole element lengths 3182 characterizing the plurality of multipole elements 3110 may be different from one another, and/or may be controlled and/or configured to control an aberration of the charged particle beam 2050 at the target focus location 3152.

Additionally or alternatively, the plurality of multipole elements 3110 may be characterized by a total stack length 3184 thereof. For example, and as shown in FIG. 31, the plurality of multipole elements 3110 may include a distal multipole element 3156 that is distal to the target focus location 3152 relative to the remaining multipole elements 3110, and the stack length 3184 may be measured along the axial direction 3114 between the proximal multipole element 3154 and the distal multipole element 3156 (e.g., between the central regions 3186 thereof). The stack length 3184 thus may be equal to the sum of the multipole element lengths 3182 of the multipole elements 3110 and the multipole element gaps 3180 separating each pair of adjacent multipole elements 3110. As examples, the stack length 3184 may be at least 15 mm, at least 20 mm, at least 25 mm, at least 30 mm, at least 35 mm, at least 40 mm, at most 50 mm, at most 37 mm, at most 32 mm, at most 27 mm, at most 22 mm, and/or at most 17 mm.

In various examples, the configuration of FIG. 31 may be characterized by a proportion of one or more dimensions of the plurality of multipole elements 3110 to the working distance 3358. For example, the plurality of multipole elements may be positioned and/or configured such that a ratio of the working distance 3158 to the multipole element length 3182 of each multipole element 3110 is at least 1:5, at least 1:2, at least 1:1, at least 2:1, at least 5:1, at least 10:1, at least 20:1, at most 30:1, at most 15:1, at most 7:1, at most 3:1, at most 1:1, and/or at most 1:3. Additionally or alternatively, the plurality of multipole elements may be positioned and/or configured such that a ratio of the stack length 3184 to the working distance 3158 is at least 1:1, at least 2:1, at least 5:1, at least 10:1, at most 20:1, at most 7:1, and/or at most 3:1.

Figure 32:
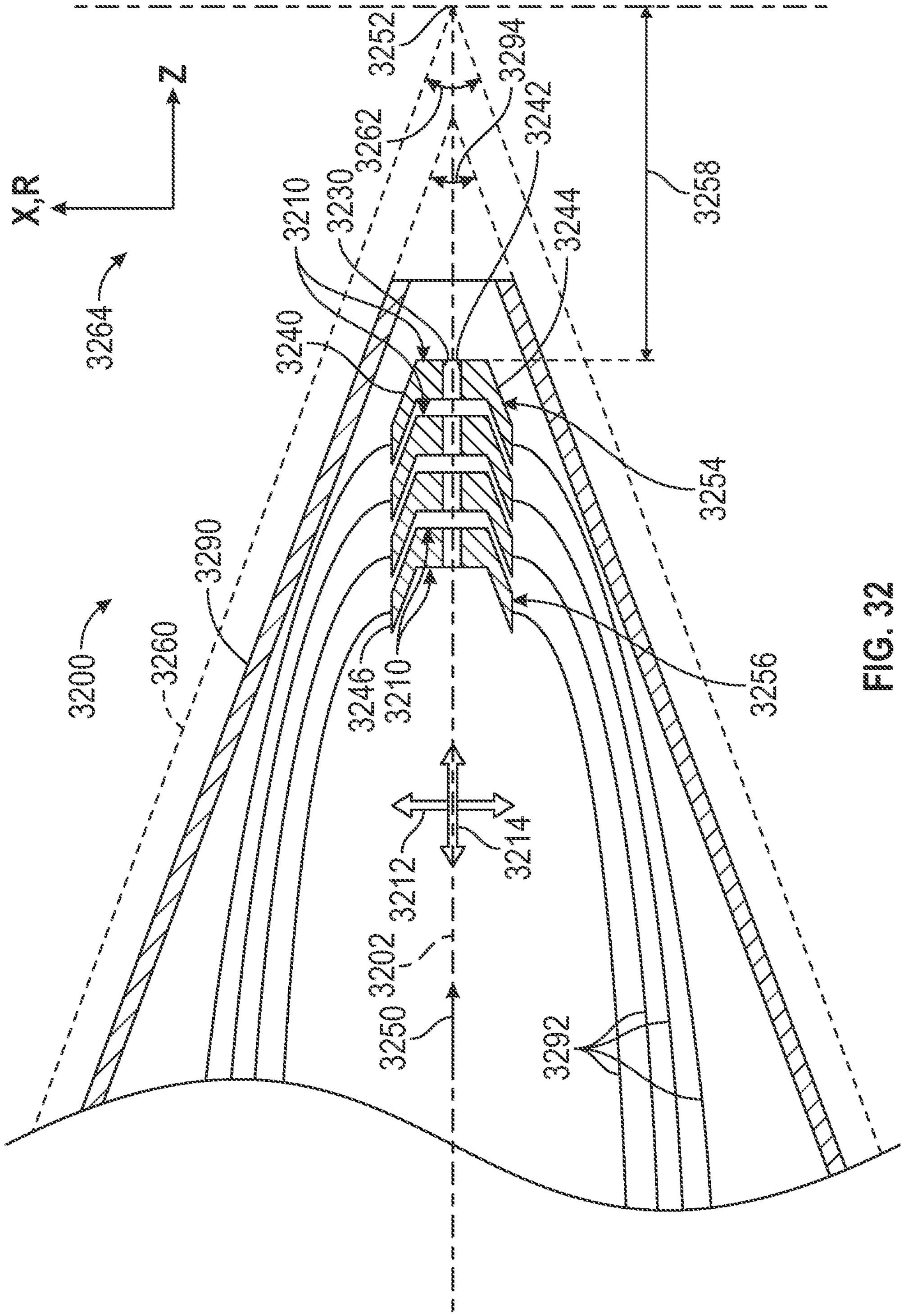
FIG. 32 is a cross-sectional side elevation view of an apparatus including a plurality of electrostatic multipole elements and a lens housing configured to be contained within a first angular envelope according to an example.

FIG. 32 illustrates an assembly 3200 including a plurality of multipole elements 3210 and a lens housing 3290 that encloses the plurality of multipole elements 3210. The assembly 3200 of FIG. 32 is substantially identical to the assembly 3100 of FIG. 31 aside from the presence of the lens housing 3290. Specifically, unless otherwise specified, all illustrated components of FIG. 32, labeled or unlabeled, can share any suitable features, characteristics, attributes, etc. with the corresponding components of FIG. 31. For example, for those components labeled in FIG. 32, components labeled with a reference numeral of the form "32XX" are intended to correspond with the components labeled with a reference numeral of the form "31XX" in FIG. 31.

The lens housing 3290 of FIG. 32 may be configured to shield, support, and/or otherwise assemble the plurality of multipole elements 3210, such as to position the multipole elements 3210 relative to the target focus location 3252. Accordingly, the lens housing 3290 may be conical and/or frusto-conical, and/or may be characterized by a taper angle 3294 such that the lens housing 3910 also is fully contained within the first angular envelope 3260 when the multipole elements 3210 are operatively positioned relative to the target focus location 3252. For example, the taper angle 3294 may be less than or equal to the first angle 3262.

Figure 33:
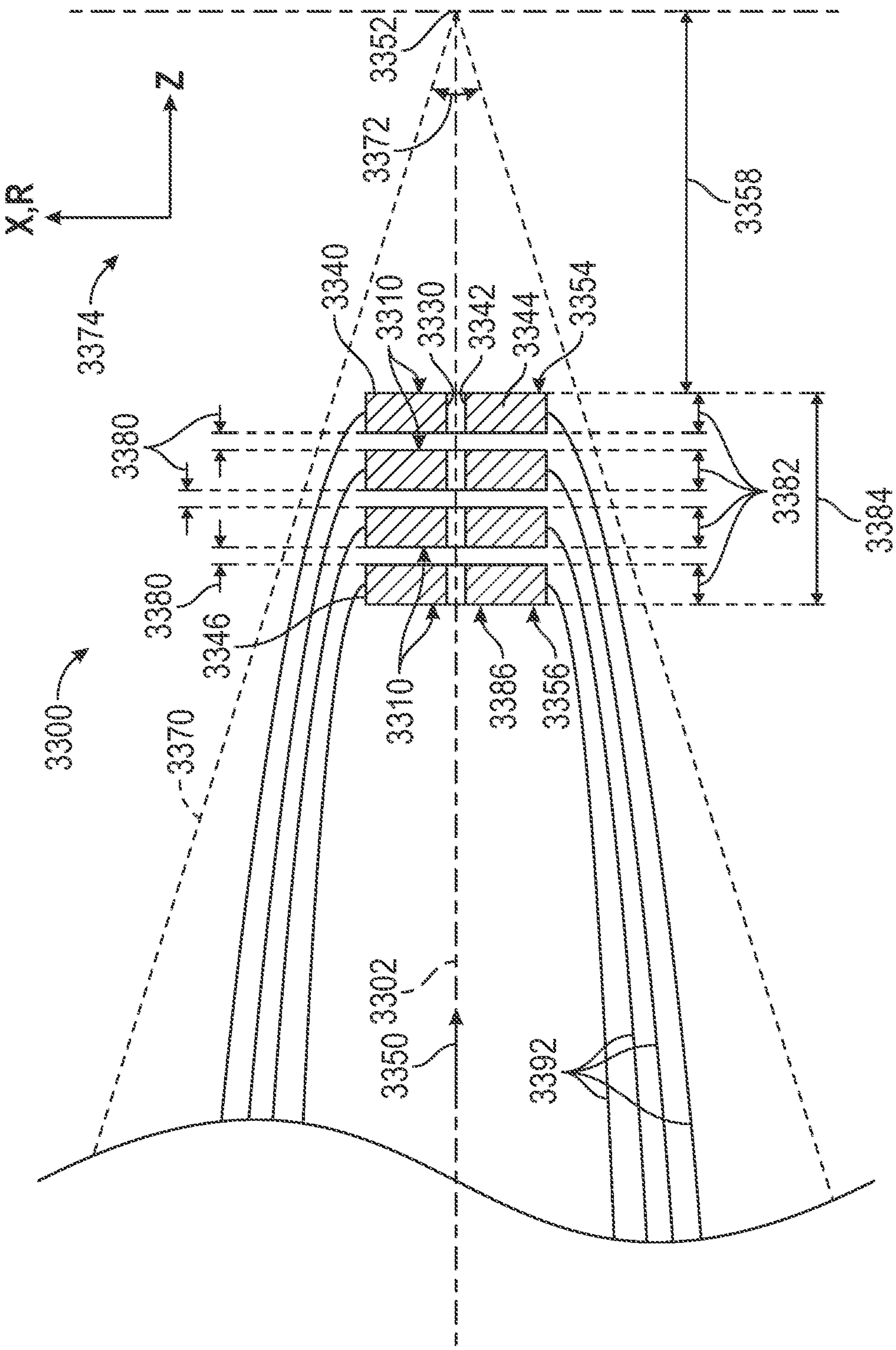
FIG. 33 is a cross-sectional side elevation view of an apparatus including a plurality of electrostatic multipole elements configured to be contained with a second angular envelope according to an example.

FIG. 33 illustrates an assembly 3300 including a plurality of multipole elements 3310 in a side view that projects the multipole elements 3310 onto a y-z plane (e.g., with reference to the coordinate systems of FIGS. 26 and/or 31) that contains the beam axis 3302. As shown in FIG. 33, the y-z plane additionally or alternatively may be referred to as a second plane 3374. Accordingly, the second plane 3374 of FIG. 33 is perpendicular to the first plane 3164 of FIG. 31. In this manner, FIG. 33 may be described as representing the assembly 3100 of FIG. 31 as viewed in a transverse plane.

Unless otherwise specified, all illustrated components of FIG. 33, labeled or unlabeled, can share any suitable features, characteristics, attributes, etc. with the corresponding components of FIG. 31. For example, for those components labeled in FIG. 33, components labeled with a reference numeral of the form "33XX" are intended to correspond with the components labeled with a reference numeral of the form "31XX" in FIG. 31.

In the example of FIG. 33, the multipole elements 3310 are fully contained within a second angular envelope 3370 that is defined in the second plane 3374. Similar to the first angular envelope 3160 of FIG. 31, the second angular envelope 3370 subtends a second angle 3372, as measured between lines that define the second angular envelope 3370 therebetween and that intersect at the target focus location 3352. In particular examples, the multipole elements 3310 may be fully contained within the second angular envelope 3370 when the second angle 3372 is at least 25 degrees, at least 35 degrees, at least 45 degrees, at least 55 degrees, at most 60 degrees, at most 50 degrees, at most 40 degrees, and/or at most 30 degrees while the working distance 3358 is at least 2 mm, at least 5 mm, at least 10 mm, at least 20 mm, at most 30 mm, at most 15 mm, at most 10 mm, at most 7 mm, and/or at most 3 mm.

In some examples, the second angle 3372 of FIG. 33 may be at least substantially equal to the first angle 3162 of FIG. 31. In such examples, the first angular envelope 3160 of FIG. 31 and the second angular envelope 3370 of FIG. 33 may be described as representing cross-sections of a conical envelope as viewed in transverse planes.

In other examples, the second angle 3727 of FIG. 33 may be greater than the first angle 3162 of FIG. 31. For example, with reference to FIG. 26, the constraint that the multipole elements (e.g., the third objective multipole element 2626) fit within the free space 2616 may correspond to a constraint on the dimensions of the multipole elements in the x-direction, while the dimensions of the multipole elements in the y-direction may be relatively (or wholly) unconstrained.

The increased second angle 3372 relative to the first angle 3162 may allow for the multipole elements 3310 to have an increased linear dimension along the y-direction of FIG. 33 relative to a linear dimension along the x-direction of FIG. 31. For example, for a given value of the working distance 3158/3358, an increase in the second angle 3372 characterizing the second angular envelope 3370 may correspond to an increase in the linear dimension of a multipole element 3310 that can be contained within the second angular envelope 3370.

In some examples, and as discussed above, the multipole elements 3310 of FIG. 33 may correspond to and/or represent the multipole elements 3110 of FIG. 31, such as portions of the multipole elements 3110/3310 projected onto and/or intersecting the second plane 3374. For example, the multipole elements 3110/3310 can include electrode extensions 3144 that are angled away from the radial direction 3112 of FIG. 31 as well as electrode extensions 3344 that extend perpendicular to the beam axis 3302. Alternatively, in some examples, the electrode extensions 3144/3344 can be bent away from the radial direction 3112 in the manner shown in FIG. 31 in each of the first plane 3164 and the second plane 3374. In other examples, the electrode extensions 3144/3344 can extend along the radial direction 3112 in the manner shown in FIG. 33 (e.g., along the y-direction of FIG. 33) in each of the first plane 3164 and the second plane 3374.

Figure 34:
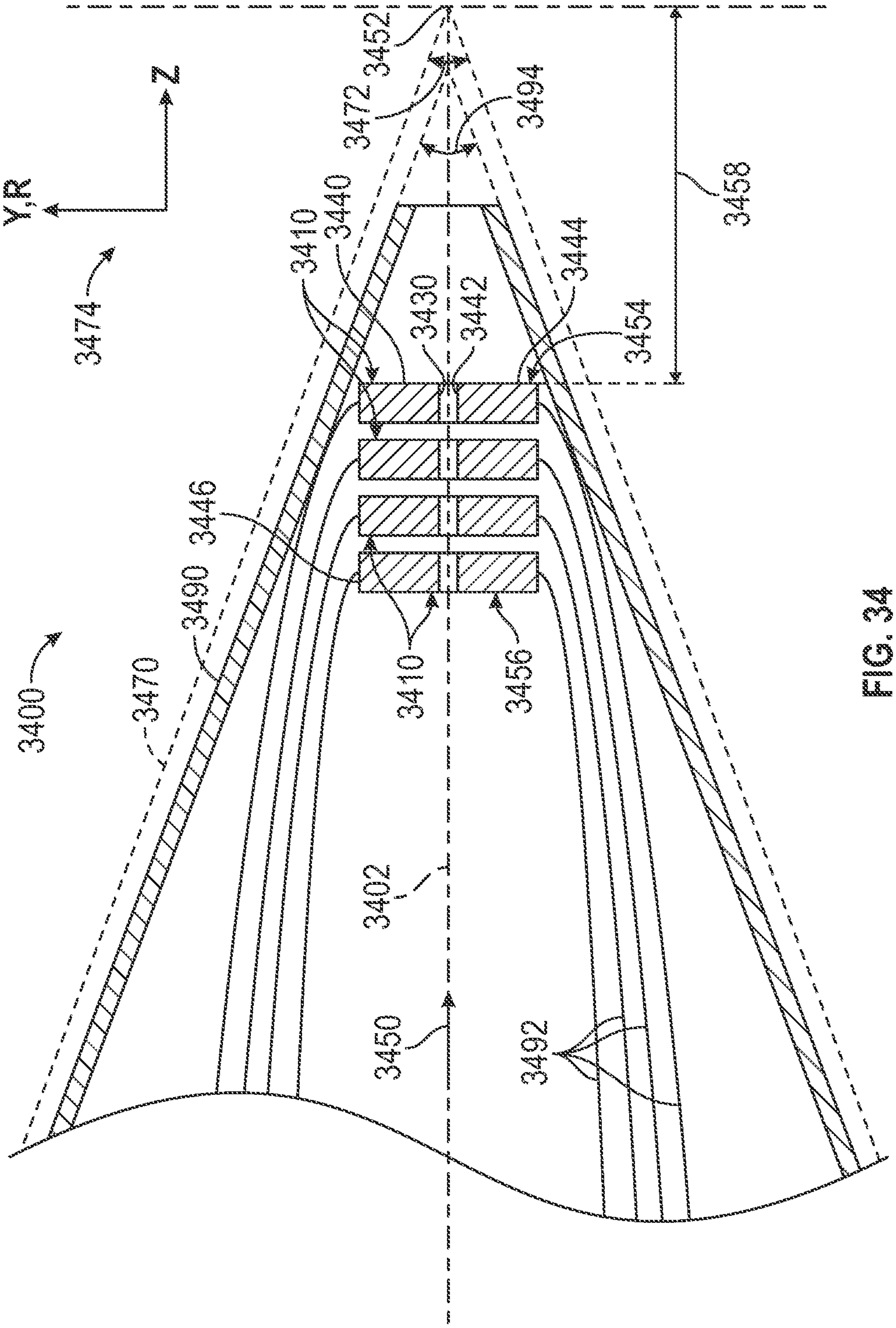
FIG. 34 is a cross-sectional side elevation view of an apparatus including a plurality of electrostatic multipole elements and a lens housing configured to be contained within a second angular envelope according to an example.

FIG. 34 illustrates an assembly 3400 including a plurality of multipole elements 3410 and a lens housing 3490 that encloses the plurality of multipole elements 3410 in a side view that projects the multipole elements 3410 onto a y-z plane (e.g., with reference to the coordinate systems of FIG. 26 or 31-33) that contains the beam axis 3402, which also may be referred to as the second plane 3474. In this manner, FIG. 34 may be described as representing the assembly 3200 of FIG. 32 as viewed in a transverse plane.

The assembly 3400 of FIG. 34 is substantially identical to the assembly 3300 of FIG. 33 aside from the presence of the lens housing 3490. The assembly 3400 of FIG. 34 also is substantially identical to the assembly 3200 of FIG. 32 aside from being viewed in the y-z plane rather than the x-z plane, in a similar manner as the relationship between FIGS. 31 and 33. Unless otherwise specified, all illustrated components of FIG. 34, labeled or unlabeled, can share any suitable features, characteristics, attributes, etc. with the corresponding components of FIGS. 31-33. For example, for those components labeled in FIG. 34, components labeled with a reference numeral of the form "34XX" are intended to correspond with the components labeled with a reference numeral of the form "31XX"/"32XX"/"33XX" in FIGS. 31-33.

Comparing FIGS. 32 and 34, it may be seen that an increase in the second angle 3472 characterizing the second angular envelope 3470 relative to the first angle 3262 characterizing the first angular envelope 3260 may allow for the lens housing 3490 to be formed with a correspondingly greater taper angle 3494. In particular, in some examples, the lens housing 3290 of FIG. 32 and the lens housing 3490 of FIG. 34 may represent transverse cross-sectional views of a common lens housing, which may have a greater taper angle 3494 in the second plane 3474 than in the first plane 3264. For example, the lens housing may have a three-dimensional shape that is similar to a flattened cone (e.g., with elliptical cross-sections in the x-y plane) and/or any other shape that may be characterized by different taper angles in transverse planes. In such examples, the taper angle 3294 of the lens housing 3290 in the first plane 3264 shown in FIG. 32 may be described as a first taper angle 3294, and the taper angle 3494 of the lens housing 3490 in the second plane 3474 shown in FIG. 34 may be described as a second taper angle 3494. As discussed above with reference to FIG. 26, such a configuration may facilitate positioning the lens housing within a free space that is constrained along a direction corresponding to the lesser taper angle (e.g., along the x-direction of FIGS. 26 and 32), thereby enabling the multipole elements to be positioned desirably close to the target focus location.

General Considerations

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

As used herein, the term "substantially" means the listed value and/or property and any value and/or property that is at least 75% of the listed value and/or property. Equivalently, the term "substantially" means the listed value and/or property and any value and/or property that differs from the listed value and/or property by at most 25%. For example, "substantially equal" refers to quantities that are fully equal, as well as to quantities that differ from one another by up to 25%.

The systems, apparatus, and methods described herein should not be construed as limiting in any way. Instead, the present disclosure is directed toward all novel and non-obvious features and aspects of the various disclosed examples, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

In various examples described herein, a module (e.g., a component) can be "programmed" to perform certain operations or provide certain functionality, indicating that computer-executable instructions for the module can be executed to perform such operations, cause such operations to be performed, or to otherwise provide such functionality. Although functionality described with respect to a software component, module, or engine can be carried out as a discrete software unit (e.g., program, function, class method), it need not be implemented as a discrete unit. That is, the functionality can be incorporated into a larger or more general-purpose program, such as one or more lines of code in a larger or general-purpose program.

Having described and illustrated the principles of the disclosed technology with reference to the illustrated examples, it will be recognized that the illustrated examples can be modified in arrangement and detail without departing from such principles. For instance, elements of examples performed in software may be implemented in hardware and vice-versa.

Also, the technologies from any example can be combined with the technologies described in any one or more of the other examples. It will be appreciated that procedures and functions such as those described with reference to the illustrated examples can be implemented in a single hardware or software module, or separate modules can be provided. The particular arrangements above are provided for convenient illustration, and other arrangements can be used.

Additional Examples of the Disclosed Technology

In view of the above-described implementations of the disclosed subject matter, this application discloses the additional examples enumerated below. It should be noted that one feature of an example in isolation or more than one feature of the example taken in combination with and optionally, in combination with one or more feature of one or more further examples are further examples also falling within the disclosure of this application.

Example 1. An apparatus, comprising:

- a plurality of electrostatic elements configured to deflect an incident charged particle beam along an α-shaped path,
- wherein the plurality of electrostatic elements comprises a plurality of electrostatic multipole elements configured to at least partially correct an axial chromatic aberration of the charged particle beam.

Example 2. The apparatus of any example herein, particularly example 1, further comprising a deflector assembly comprising a corrector electrostatic prism and the plurality of electrostatic multipole elements, wherein the deflector assembly is configured to deflect the charged particle beam along a deflector optical axis, and wherein the deflector assembly is configured to at least partially correct an axial chromatic aberration in the charged particle beam with two or more hexapole fields generated within the corrector electrostatic prism.

Example 3. The apparatus of any example herein, particularly any one of examples 1-2, wherein the plurality of electrostatic multipole elements comprises:

- a first hexapole-generating element configured to generate a first hexapole field;
- a second hexapole-generating element configured to generate a second hexapole field; and
- a third hexapole-generating element configured to generate a third hexapole field.

Example 4. The apparatus of any example herein, particularly any one of examples 2-3, wherein at least two electrostatic multipole elements of the plurality of electrostatic multipole elements are at least partially contained within the corrector electrostatic prism.

Example 5. The apparatus of any example herein, particularly any one of examples 1-4, wherein the deflector optical axis is a curved axis.

Example 6. The apparatus of any example herein, particularly any one of examples 1-5, wherein the deflector optical axis is α-shaped.

Example 7. The apparatus of any example herein, particularly any one of examples 2-6, wherein a portion of the deflector optical axis extending within the corrector electrostatic prism follows a circular path.

Example 8. The apparatus of any example herein, particularly any one of examples 2-7, wherein a location along the portion of the deflector optical axis extending within the corrector electrostatic prism is characterized by a prism angle $\phi$ that can assume any value between 0 and $\phi_{max}$.

Example 9. The apparatus of any example herein, particularly example 8, wherein the prism angle $\phi=0$ corresponds to a location at which the charged particle beam enters the corrector electrostatic prism along the deflector optical axis, and wherein the prism angle $\phi=\phi_{max}$ corresponds to a location at which the charged particle beam exits the corrector electrostatic prism along the deflector optical axis.

Example 10. The apparatus of any example herein, particularly any one of examples 8-9, wherein the prism angle $\phi_{max}$ is equal, or approximately equal, to 270 degrees.

Example 11. The apparatus of any example herein, particularly any one of examples 2-10, wherein the corrector electrostatic prism is configured to deflect the charged particle beam through an angle that is equal, or approximately equal, to 270 degrees.

Example 12. The apparatus of any example herein, particularly any one of examples 2-11, wherein at least a subset of the plurality of electrostatic multipole elements are positioned within the corrector electrostatic prism.

Example 13. The apparatus of any example herein, particularly any one of examples 2-12, further comprising:

- an entry electrostatic prism configured to direct the charged particle beam from an optical column axis toward the deflector optical axis; and
- an exit electrostatic prism configured to direct the charged particle beam from the deflector optical axis toward the optical column axis.

Example 14. The apparatus of any example herein, particularly example 13, wherein each of the entry electrostatic prism and the exit electrostatic prism is configured to deflect the charged particle beam through an angle that is equal, or approximately equal, to 45 degrees.

Example 15. The apparatus of any example herein, particularly any one of examples 13-14, wherein one or both of the entry electrostatic prism and the exit electrostatic prism is a double-focusing prism.

Example 16. The apparatus of any example herein, particularly any one of examples 13-15, wherein the plurality of electrostatic elements further comprises a first quadrupole-generating element configured to generate a first quadrupole field and a second quadrupole-generating element configured to generate a second quadrupole field, wherein the first quadrupole-generating element is one or both of defined by or coupled to the entry electrostatic prism, and wherein the second quadrupole-generating element is one or both of defined by or coupled to the exit electrostatic prism.

Example 17. The apparatus of any example herein, particularly any one of examples 13-16, wherein the apparatus is configured to be selectively operated in each of:

a correction mode, in which the entry electrostatic prism directs the charged particle beam toward the deflector optical axis; and a straight-axis mode, in which the charged particle beam bypasses the deflector assembly.

Example 18. The apparatus of any example herein, particularly any one of examples 13-17, wherein the plurality of electrostatic elements comprises:

a first hexapole-generating element configured to generate a first hexapole field;

a second hexapole-generating element configured to generate a second hexapole field;

a third hexapole-generating element configured to generate a third hexapole field;

a first quadrupole-generating element configured to generate a first quadrupole field; and a second quadrupole-generating element configured to generate a second quadrupole field, wherein the first quadrupole-generating element is positioned along the deflector optical axis between the entry electrostatic prism and the first hexapole-generating element, and wherein the second quadrupole-generating element is positioned along the deflector optical axis between the third hexapole-generating element and the exit electrostatic prism.

Example 19. The apparatus of any example herein, particularly any one of examples 2-18, wherein the plurality of electrostatic elements further comprises a first quadrupole-generating element configured to generate a first quadrupole field and a second quadrupole-generating element configured to generate a second quadrupole field, and wherein each of the first quadrupole-generating element and the second quadrupole-generating element is a tunable quadrupole-generating element.

Example 20. The apparatus of any example herein, particularly any one of examples 2-19, wherein the plurality of electrostatic elements further comprises a first quadrupole-generating element configured to generate a first quadrupole field and a second quadrupole-generating element configured to generate a second quadrupole field, and wherein each of the first quadrupole-generating element and the second quadrupole-generating element is spaced apart from the corrector electrostatic prism.

Example 21. The apparatus of any example herein, particularly any one of examples 2-20, wherein the plurality of electrostatic elements further comprises a first quadrupole-generating element configured to generate a first quadrupole field and a second quadrupole-generating element configured to generate a second quadrupole field, and wherein each of the first quadrupole-generating element and the second quadrupole-generating element is coupled to the corrector electrostatic prism.

Example 22. The apparatus of any example herein, particularly any one of examples 2-21, wherein the plurality of electrostatic elements further comprises a first quadrupole-generating element configured to generate a first quadrupole field and a second quadrupole-generating element configured to generate a second quadrupole field, and wherein each of the first quadrupole-generating element and the second quadrupole-generating element is at least partially contained within the corrector electrostatic prism.

Example 23. The apparatus of any example herein, particularly any one of examples 2-22, wherein the corrector electrostatic prism comprises a corrector prism body with a first corrector prism electrode and a second corrector prism electrode positioned radially exteriorly of the first corrector prism electrode, wherein the first corrector prism electrode and the second corrector prism electrode define an electrode gap therebetween, and wherein the deflector optical axis extends within the electrode gap.

Example 24. The apparatus of any example herein, particularly example 23, wherein the corrector electrostatic prism is configured such that, when a first electrode voltage is applied to the first corrector prism electrode and a second electrode voltage is applied to the second corrector prism electrode, the corrector electrostatic prism generates an electrostatic deflection field that directs the charged particle beam to travel along the deflector optical axis through the corrector electrostatic prism.

Example 25. The apparatus of any example herein, particularly any one of examples 23-24, wherein the first corrector prism electrode comprises a first electrode exterior surface that defines a first electrode recess extending partially along a direction parallel to the deflector optical axis, wherein the second corrector prism electrode comprises a second electrode exterior surface that defines a second electrode recess extending partially along the direction parallel to the deflector optical axis, and wherein at least one electrostatic multipole element of the plurality of electrostatic multipole elements is positioned at least partially within each of the first electrode recess and the second electrode recess.

Example 26. The apparatus of any example herein, particularly example 25, wherein, for one or more electrostatic multipole elements of the plurality of electrostatic multipole elements, the electrostatic multipole element comprises:

a first hexapole electrode;

a second hexapole electrode;

a third hexapole electrode;

a fourth hexapole electrode;

a fifth hexapole electrode; and a sixth hexapole electrode, wherein the first hexapole electrode, the second hexapole electrode, and the third hexapole electrode are at least partially received within the second electrode recess, and wherein the fourth hexapole electrode, the fifth hexapole electrode, and the sixth hexapole electrode are at least partially received within the first electrode recess.

Example 27. The apparatus of any example herein, particularly any one of examples 2-26, wherein the plurality of electrostatic elements comprises:

a first hexapole-generating element configured to generate a first hexapole field;

a second hexapole-generating element configured to generate a second hexapole field; and a third hexapole-generating element configured to generate a third hexapole field.

Example 28. The apparatus of any example herein, particularly example 27, wherein the second hexapole-generating element is positioned proximate to a midpoint of the deflector optical axis within the corrector electrostatic prism.

Example 29. The apparatus of any example herein, particularly any one of examples 27-28, wherein a location along a portion of the deflector optical axis extending within the corrector electrostatic prism is characterized by a prism angle 4 that varies from 0 degrees to 270 degrees, and wherein the second hexapole-generating element is positioned within the corrector electrostatic prism at a prism angle of 4=135 degrees.

Example 30. The apparatus of any example herein, particularly any one of examples 27-29, wherein each of the first hexapole-generating element and the third hexapole-generating element are angularly equidistant from the second hexapole-generating element.

Example 31. The apparatus of any example herein, particularly any one of examples 27-30, wherein each of the first hexapole-generating element and the third hexapole-generating element is positioned proximate to a position along the deflector optical axis corresponding to a line focus of the charged particle beam.

Example 32. The apparatus of any example herein, particularly any one of examples 2-31, wherein the second hexapole-generating element is positioned proximate to a position along the deflector optical axis corresponding to a line focus of the charged particle beam.

Example 33. The apparatus of any example herein, particularly any one of examples 2-32, wherein the corrector electrostatic prism is configured to generate at least a portion of an electrostatic deflection field that comprises a prism hexapole field.

Example 34. The apparatus of any example herein, particularly example 33, wherein a location along the portion of the deflector optical axis extending within the corrector electrostatic prism is characterized by a prism angle $\phi$, wherein a location within the corrector electrostatic prism away from the deflector optical axis is characterized by the prism angle $\phi$, a radial distance x away from the deflector optical axis, and a transverse distance y away from the deflector optical axis, and wherein a magnitude of the prism hexapole field within the corrector electrostatic prism is a function of x and y and is constant in $\phi$.

Example 35. The apparatus of any example herein, particularly any one of examples 2-34, wherein the corrector electrostatic prism comprises a first corrector prism electrode and a second corrector prism electrode positioned radially exteriorly of the first corrector prism electrode, wherein the first corrector prism electrode comprises a first electrode exterior surface that faces the second corrector prism electrode, wherein the second corrector prism electrode comprises a second electrode interior surface that faces the first corrector prism electrode, and wherein each of the first electrode exterior surface and the second electrode interior surface has a cross-sectional profile, as viewed along a direction perpendicular to the deflector optical axis, that is substantially constant within the corrector electrostatic prism away from each electrostatic multipole element.

Example 36. The apparatus of any example herein, particularly any one of examples 33-35, wherein a location along the portion of the deflector optical axis extending within the corrector electrostatic prism is characterized by a prism angle $\phi$, and wherein a magnitude of the prism hexapole field within the corrector electrostatic prism varies with $\phi$.

Example 37. The apparatus of any example herein, particularly example 36, wherein the magnitude of the prism hexapole field is proportional to a hexapole parameter p that varies with the prism angle $\phi$.

Example 38. The apparatus of any example herein, particularly example 37, wherein the hexapole parameter is piecewise constant with:

(i) $p = p_1,\ 0 < \phi \leq \phi_1$;

(ii) $p = p_2,\ \phi_1 < \phi \leq \phi_2$;

(iii) $p = p_3,\ \phi_2 < \phi \leq \phi_3$;

(iv) $p = p_3,\ \phi_3 < \phi \leq \phi_4$;

-continued (v) $p = p_2,\ \phi_4 < \phi \leq \phi_5$; and (vi) $p = p_1,\ \phi_5 < \phi \leq \phi_6$.

Example 39. The apparatus of any example herein, particularly example 38, wherein $\phi_3=\phi_6/2$.

Example 40. The apparatus of any example herein, particularly any one of examples 35-39, wherein the first corrector prism electrode comprises a first electrode exterior surface that faces the second corrector prism electrode, wherein the first electrode exterior surface defines a first electrode groove extending along a direction parallel to the deflector optical axis, wherein the second corrector prism electrode comprises a second electrode interior surface that faces the first corrector prism electrode, and wherein the second electrode interior surface defines a second electrode groove extending along a direction parallel to the deflector optical axis.

Example 41. The apparatus of any example herein, particularly example 40, wherein the corrector electrostatic prism is configured such that, when a first electrode voltage is applied to the first corrector prism electrode and a second electrode voltage is applied to the second corrector prism electrode, the first electrode groove and the second electrode groove generate a hexapole field within the corrector electrostatic prism.

Example 42. The apparatus of any example herein, particularly any one of examples 40-41, wherein the corrector electrostatic prism has a corrector prism beam radius, as measured between a center of the first corrector prism electrode and the deflector optical axis, wherein the first electrode groove has a first electrode groove depth, as measured along a radial direction parallel to the corrector prism beam radius, wherein the second electrode groove has a second electrode groove depth, as measured along the radial direction, and wherein each of the first electrode groove depth and the second electrode groove depth is at most 1/50 of the corrector prism beam radius.

Example 43. The apparatus of any example herein, particularly any one of examples 40-42, wherein a location along a portion of the deflector optical axis extending within the corrector electrostatic prism is characterized by a prism angle >, and wherein one or more dimensions of one or both of the first electrode groove and the second electrode groove vary with the prism angle.

Example 44. The apparatus of any example herein, particularly any one of examples 1-43, wherein the plurality of electrostatic multipole elements comprises:

- a first hexapole-generating element configured to generate a first hexapole field;
- a second hexapole-generating element configured to generate a second hexapole field;
- a third hexapole-generating element configured to generate a third hexapole field; and
- a fourth hexapole-generating element configured to generate a fourth hexapole field.

Example 45. The apparatus of any example herein, particularly example 44, further comprising a deflector assembly comprising a corrector electrostatic prism and the plurality of electrostatic multipole elements, wherein the deflector assembly defines a deflector optical axis, and wherein the deflector assembly is configured to at least partially correct an axial chromatic aberration in the charged particle beam as the charged particle beam travels along the deflector optical axis Example 46. The apparatus of any example herein, particularly example 45, wherein each of the second hexapole-generating element and the third hexapole-generating element is positioned at least partially within the corrector electrostatic prism.

Example 47. The apparatus of any example herein, particularly any one of examples 45-46, wherein each of the second hexapole-generating element and the third hexapole-generating element is positioned proximate to a position along the deflector optical axis corresponding to a line focus of the charged particle beam.

Example 48. The apparatus of any example herein, particularly any one of examples 2-47, wherein the corrector electrostatic prism is configured to generate a point focus of the charged particle beam proximate to a midplane location of the deflector optical axis within the corrector electrostatic prism.

Example 49. The apparatus of any example herein, particularly any one of examples 2-48, wherein the corrector electrostatic prism is configured to function as a monochromator.

Example 50. The apparatus of any example herein, particularly any one of examples 2-49, further comprising an energy-selecting slit positioned proximate to a midplane location of the deflector optical axis within the corrector electrostatic prism.

Example 51. An apparatus, comprising:

a plurality of electrostatic elements configured to deflect an incident charged particle beam along an Ω-shaped path, wherein the plurality of electrostatic elements comprises a plurality of electrostatic multipole elements configured to at least partially correct an axial chromatic aberration of the charged particle beam.

Example 52. The apparatus of any example herein, particularly example 51, further comprising:

a deflector assembly comprising a plurality of corrector electrostatic prisms and the plurality of electrostatic multipole elements, wherein the plurality of corrector electrostatic prisms comprises:

a first electrostatic prism;

a second electrostatic prism;

a third electrostatic prism; and a fourth electrostatic prism, wherein the plurality of electrostatic multipole elements comprises:

a first multipole element configured to generate a first hexapole field;

a second multipole element configured to generate a second hexapole field;

a third multipole element configured to generate a third hexapole field;

wherein the deflector assembly defines a deflector optical axis, and wherein the deflector assembly is configured to at least partially correct an axial chromatic aberration in the charged particle beam as the charged particle beam travels along the deflector optical axis.

Example 53. The apparatus of any example herein, particularly example 52, wherein at least a portion of the deflector optical axis is curved.

Example 54. The apparatus of any example herein, particularly any one of examples 52-53, wherein the deflector optical axis is Ω-shaped.

Example 55. The apparatus of any example herein, particularly any one of examples 52-54, wherein each of the first electrostatic prism, the second electrostatic prism, the third electrostatic prism, and the fourth electrostatic prism is configured to deflect the charged particle beam through an angle that is equal, or approximately equal, to 90 degrees.

Example 56. The apparatus of any example herein, particularly any one of examples 52-55, wherein the second electrostatic prism and the third electrostatic prism are fixedly coupled to one another.

Example 57. The apparatus of any example herein, particularly any one of examples 52-56, wherein the first electrostatic prism and the fourth electrostatic prism are fixedly coupled to one another.

Example 58. The apparatus of any example herein, particularly any one of examples 52-57, wherein one or more of the first electrostatic prism, the second electrostatic prism, the third electrostatic prism, or the fourth electrostatic prism is a double-focusing prism.

Example 59. The apparatus of any example herein, particularly any one of examples 52-58, wherein the plurality of electrostatic multipole elements are arranged in a mirror symmetric configuration about a midplane location of the deflector optical axis within the deflector assembly.

Example 60. The apparatus of any example herein, particularly example 59, wherein the second multipole element is a central multipole element that is positioned proximate to a midplane location of the deflector optical axis within the deflector assembly, and wherein the first multipole element and the third multipole element are arranged in a mirror symmetric configuration about the second multipole element.

Example 61. The apparatus of any example herein, particularly any one of examples 52-60, wherein the deflector assembly is configured to generate a line focus of the charged particle beam, and wherein the second multipole element is positioned proximate to a position along the deflector optical axis corresponding to the line focus of the charged particle beam.

Example 62. The apparatus of any example herein, particularly any one of examples 52-61, wherein the first multipole element further is configured to generate a first element quadrupole field, and wherein the third multipole element further is configured to generate a third element quadrupole field.

Example 63. The apparatus of any example herein, particularly example 62, wherein the deflector assembly is configured such that, during operative use of the apparatus:

the first hexapole field and the first element quadrupole field are at least partially overlapping; and the third hexapole field and the third element quadrupole field are at least partially overlapping.

Example 64. The apparatus of any example herein, particularly any one of examples 52-63, wherein each of the first multipole element, the second multipole element, and the third multipole element is a tunable multipole element.

Example 65. The apparatus of any example herein, particularly any one of examples 52-64, wherein the plurality of electrostatic multipole elements further comprises:

a fourth multipole element configured to generate a fourth hexapole field; and a fifth multipole element configured to generate a fifth hexapole field.

Example 66. The apparatus of any example herein, particularly example 65, wherein the fourth multipole element and the fifth multipole element are arranged in a mirror symmetric configuration about the second multipole element.

Example 67. The apparatus of any example herein, particularly any one of examples 65-66, wherein the fourth multipole element further is configured to generate a fourth element quadrupole field, and wherein the fifth multipole element further is configured to generate a fifth element quadrupole field.

Example 68. The apparatus of any example herein, particularly example 67, wherein the fourth hexapole field and the fourth element quadrupole field are at least partially overlapping, and wherein the fifth hexapole field and the fifth element quadrupole field are at least partially overlapping.

Example 69. The apparatus of any example herein, particularly any one of examples 65-68, wherein each of the fourth multipole element and the fifth multipole element is a tunable multipole element.

Example 70. The apparatus of any example herein, particularly any one of examples 52-64, wherein the plurality of electrostatic multipole elements further comprises:

- a fourth multipole element configured to generate a fourth element quadrupole field; and
- a fifth multipole element configured to generate a fifth element quadrupole field.

Example 71. The apparatus of any example herein, particularly example 70, wherein each of the fourth multipole element and the fifth multipole element is a tunable multipole element.

Example 72. The apparatus of any example herein, particularly any one of examples 52-71, wherein the plurality of electrostatic multipole elements further comprises:

- a sixth multipole element configured to generate a sixth element quadrupole field;
- a seventh multipole element configured to generate a seventh element quadrupole field;
- an eighth multipole element configured to generate an eighth element quadrupole field; and
- a ninth multipole element configured to generate a ninth element quadrupole field.

Example 73. The apparatus of any example herein, particularly example 72, wherein each of the sixth multipole element, the seventh multipole element, the eighth multipole element, and the ninth multipole element is a fixed multipole element.

Example 74. The apparatus of any example herein, particularly any one of examples 72-73, wherein the first electrostatic prism comprises the sixth multipole element and the seventh multipole element.

Example 75. The apparatus of any example herein, particularly any one of examples 72-74, wherein each of the sixth multipole element and the seventh multipole element are coupled to the first electrostatic prism.

Example 76. The apparatus of any example herein, particularly any one of examples 72-75, wherein the fourth electrostatic prism comprises the eighth multipole element and the ninth multipole element.

Example 77. The apparatus of any example herein, particularly any one of examples 72-76, wherein each of the eighth multipole element and the ninth multipole element are coupled to the fourth electrostatic prism.

Example 78. A charged particle microscope system comprising:

- a charged particle source configured to emit a charged particle beam toward a sample; and
- an optical column configured to focus the charged particle beam onto the sample,
- wherein the optical column comprises the apparatus of any example herein, particularly any one of examples 1-77.

Example 79. A charged particle microscope system, comprising:

- a charged particle source configured to emit a charged particle beam; and
- an optical column configured to direct the charged particle beam toward a sample,
- wherein the optical column comprises a multipole objective comprising a plurality of objective multipole elements, and wherein the optical column is configured to at least partially correct a spherical aberration of the charged particle beam.

Example 80. The charged particle microscope system of any example herein, particularly example 79, further comprising a multipole condenser comprising one or more condenser quadrupole-generating elements.

Example 81. The charged particle microscope system of any example herein, particularly example 80, wherein the one or more condenser quadrupole-generating elements comprises:

- a first condenser quadrupole-generating element configured to generate a first condenser quadrupole field; and
- a second condenser quadrupole-generating element positioned downstream of the first condenser quadrupole-generating element and configured to generate a second condenser quadrupole field.

Example 82. The charged particle microscope system of any example herein, particularly any one of examples 81-82, wherein the multipole condenser is positioned upstream of the multipole objective.

Example 83. The charged particle microscope system of any example herein, particularly any one of examples 79-82, wherein the plurality of objective multipole elements comprises:

- at least three quadrupole-generating elements; and
- at least three octupole-generating elements.

Example 84. The charged particle microscope system of any example herein, particularly example 83, wherein the octupole-generating elements are configured to at least partially correct the spherical aberration of the charged particle beam.

Example 85. The charged particle microscope system of any example herein, particularly any one of examples 79-84, wherein each objective multipole element of the plurality of objective multipole elements is characterized by a multipole element inner diameter that represents a maximum diameter of the charged particle beam that passes through the multipole element, and wherein the multipole element inner diameter of each objective multipole element is at most 5 millimeters (mm).

Example 86. The charged particle microscope system of any example herein, particularly any one of examples 79-85, wherein the charged particle source is configured to emit the charged particle beam with an accelerating voltage that is one or more of at least 200 volts (V), at least 1,000 V, at least 5,000 V, at least 10,000 V, at least 20,000 V, at least 50,000 V, at most 100,000 V, at most 30,000 V, at most 15,000 V, at most 7,000 V, at most 2,000 V, or at most 500 V.

Example 87. The charged particle microscope system of any example herein, particularly any one of examples 79-86, wherein the optical column is configured such that the charged particle beam lacks an intermediate point-crossover between the multipole condenser and the multipole objective.

Example 88. The charged particle microscope system of any example herein, particularly any one of examples 79-87, wherein the charged particle beam comprises a linear combination of a first fundamental ray component, as measured along a first direction perpendicular to an optical column axis along which the charged particle beam travels through the optical column, and a second fundamental ray component, as measured along a second direction perpendicular to each of the optical column axis and the first direction, and wherein the charged particle microscope system is configured such that, for a portion of the charged particle beam extending through the multipole objective, a magnitude of the first fundamental ray component is equal to or greater than a magnitude of the second fundamental ray component.

Example 89. The charged particle microscope system of any example herein, particularly any one of examples 79-88, wherein the optical column is configured such that the charged particle beam enters the multipole objective with a non-circular beam profile.

Example 90. The charged particle microscope system of any example herein, particularly any one of examples 79-89, wherein the optical column is configured such that the charged particle beam exits the multipole objective with a non-circular beam profile.

Example 91. The charged particle microscope system of any example herein, particularly any one of examples 79-90, wherein the plurality of objective multipole elements comprises exactly three quadrupole-generating elements.

Example 92. The charged particle microscope system of any example herein, particularly any one of examples 79-91, wherein exactly three objective multipole elements of the plurality of objective multipole elements are configured to generate quadrupole field components.

Example 93. The charged particle microscope system of any example herein, particularly any one of examples 79-92, wherein at least one objective multipole element of the plurality of objective multipole elements comprises electrodes formed as a microelectromechanical system (MEMS).

Example 94. The charged particle microscope system of any example herein, particularly any one of examples 79-93, wherein the plurality of objective multipole elements comprises:

a first objective multipole element configured to generate a first objective multipole field;

a second objective multipole element positioned downstream of the first objective multipole element and configured to generate a second objective multipole field; and a third objective multipole element positioned downstream of the second objective multipole element and configured to generate a third objective multipole field.

Example 95. The charged particle microscope system of any example herein, particularly example 94, wherein the first objective multipole field comprises a first objective quadrupole field component and a first objective octupole field component, wherein the second objective multipole field comprises a second objective quadrupole field component and a second objective octupole field component, and wherein the third objective multipole field comprises a third objective quadrupole field component and a third objective octupole field component.

Example 96. The charged particle microscope system of any example herein, particularly any one of examples 94-95, wherein one or more of the first objective multipole element, the second objective multipole element, or the third objective multipole element comprises four electrodes that are shaped to produce octupole fields and quadrupole fields.

Example 97. The charged particle microscope system of any example herein, particularly any one of examples 94-96, wherein the third objective multipole element comprises eight electrodes.

Example 98. The charged particle microscope system of any example herein, particularly any one of examples 94-97, wherein one or more of the first objective multipole element, the second objective multipole element, or the third objective multipole element comprises electrodes formed as a microelectromechanical system (MEMS).

Example 99. The charged particle microscope system of any example herein, particularly any one of examples 94-98, wherein the plurality of objective multipole elements further comprises a fourth objective multipole element positioned downstream of the third objective multipole element and configured to generate fourth objective multipole field, wherein the first objective multipole field comprises a first objective quadrupole field component and a first objective octupole field component, wherein the second objective multipole field comprises a second objective octupole field component, wherein the third objective multipole field comprises a third objective quadrupole field component and a third objective octupole field component, and wherein the fourth objective multipole field comprises a fourth objective quadrupole field component.

Example 100. The charged particle microscope system of any example herein, particularly example 99, wherein the fourth objective multipole element comprises eight electrodes.

Example 101. The charged particle microscope system of any example herein, particularly any one of examples 79-100, wherein the optical column further comprises a chromatic aberration corrector positioned between the multipole condenser and the multipole objective.

Example 102. The charged particle microscope system of any example herein, particularly example 101, wherein the chromatic aberration corrector comprises the apparatus of any example herein, particularly any one of examples 1-77.

Example 103. The charged particle microscope system of any example herein, particularly any one of examples 79-102, wherein the charged particle beam is a first charged particle beam, and wherein the charged particle microscope further is configured to emit a second charged particle beam toward the sample.

Example 104. The charged particle microscope system of any example herein, particularly example 103, wherein the charged particle microscope is configured such that the first charged particle beam and the second charged particle beam approach the sample along directions that are nonparallel.

Example 105. The charged particle microscope system of any example herein, particularly any one of examples 103-104, wherein the second charged particle beam has a conical beam profile as the second charged particle beam approaches the sample, and wherein the first charged particle beam has a tapered non-circular beam profile as the first charged particle beam approaches the sample.

Example 106. A multipole element comprising:

a plurality of electrodes defining a central bore therebetween, the central bore extending at least partially along a beam axis, wherein each electrode of the plurality of electrodes comprises a respective electrode active surface that faces the central bore, wherein the plurality of electrodes comprises a first shape subset of electrodes and a second shape subset of electrodes, wherein the electrode active surface of each electrode of the first shape subset of electrodes has a first active surface shape, as viewed along a direction parallel to the beam axis, and wherein the electrode active surface of each electrode of the second shape subset of electrodes has a second active surface shape, as viewed along a direction parallel to the beam axis, that is different than the first active surface shape.

Example 107. The multipole element of any example herein, particularly example 106, wherein the plurality of electrodes extend away from a central bore such that the multipole element has a first dimension, as measured along a first direction perpendicular to the beam axis, that is smaller than a second dimension of the multipole element, as measured along a second direction perpendicular to each of the beam axis and the first direction.

Example 108. The multipole element of any example herein, particularly example 107, wherein a ratio of the second dimension to the first dimension is one or more of at least 1.2:1, at least 1.5:1, at least 2:1, at least 2.5:1, at least 3:1 at most 4:1, at most 2.7:1, at most 2.3:1, at most 1.7:1, or at most 1.3:1.

Example 109. The multipole element of any example herein, particularly any one of examples 106-108, wherein the plurality of electrodes extend away from the central bore along a plane that is at least substantially perpendicular to the beam axis.

Example 110. The multipole element of any example herein, particularly any one of examples 106-109, wherein each electrode of the plurality of electrodes comprises a respective electrode extension extending away from the respective electrode active surface and configured to supply an electrical voltage to the respective electrode active surface, wherein the plurality of electrodes comprises a first side subset of electrodes and a second side subset of electrodes, wherein, for each electrode of the first side subset of electrodes, the electrode extension extends away from the electrode active surface along a first lateral direction, and wherein, for each electrode of the second side subset of electrodes, the electrode extension extends away from the electrode active surface along a second lateral direction that is opposed to the first lateral direction.

Example 111. The multipole element of any example herein, particularly example 110, wherein, for each electrode of the plurality of electrodes, the electrode extension comprises an electrical contact location configured to be coupled to an electrical lead to supply the electrical voltage to the electrode active surface.

Example 112. The multipole element of any example herein, particularly any one of examples 106-111, wherein the plurality of electrodes extend away from the central bore partially along a radial direction perpendicular to the beam axis and partially along an axial direction parallel to the beam axis.

Example 113. The multipole element of any example herein, particularly any one of examples 106-112, wherein the multipole element extends along a direction parallel to the beam axis between a proximal end region proximate to the central bore and a distal end region distal to the central bore, wherein the multipole element has:

a first diameter, as measured along a direction perpendicular to the beam axis at the proximal end region; and a second diameter, as measured along a direction perpendicular to the beam axis at the distal end region, and wherein the first diameter is less than the second diameter.

Example 114. The multipole element of any example herein, particularly example 113, wherein a ratio of the second diameter to the first diameter is one or more of at least 1.2:1, at least 1.5:1, at least 2:1, at least 2.5:1, at least 3:1 at most 4:1, at most 2.7:1, at most 2.3:1, at most 1.7:1, or at most 1.3:1.

Example 115. The multipole element of any example herein, particularly any one of examples 106-114, wherein each electrode of the plurality of electrodes comprises a respective electrode extension extending away from the respective electrode active surface and configured to supply an electrical voltage to the respective electrode active surface, and wherein, for each electrode, the electrode extension extends away from the electrode active surface along a direction that is angled relative to each of a radial direction perpendicular to the beam axis and an axial direction parallel to the beam axis.

Example 116. The multipole element of any example herein, particularly example 115, wherein, for each electrode of the plurality of electrodes, the electrode extension comprises an electrical contact location configured to be coupled to an electrical lead to supply the electrical voltage to the electrode active surface.

Example 117. The multipole element of any example herein, particularly any one of examples 106-116, wherein the multipole element is configured to generate one or more of a quadrupole electrostatic field, a hexapole electrostatic field, an octupole electrostatic field, or a 12-pole electrostatic field within the central bore.

Example 118. The multipole element of any example herein, particularly any one of examples 106-117, wherein the plurality of electrodes consists of one of four electrodes, six electrodes, and eight electrodes.

Example 119. The multipole element of any example herein, particularly any one of examples 106-118, wherein the plurality of electrodes comprises exactly four electrodes, and wherein the multipole element is configured to generate a quadrupole electrostatic field within the central bore.

Example 120. The multipole element of any example herein, particularly any one of examples 106-118, wherein the plurality of electrodes comprises exactly eight electrodes, and wherein the multipole element is configured to generate a quadrupole electrostatic field within the central bore.

Example 121. The multipole element of any example herein, particularly example 120, wherein the multipole element is configured to generate the quadrupole electrostatic field with an accompanying parasitic 12-pole electrostatic field such that a 12-pole to quadrupole component ratio characterizing the 12-pole and quadrupole electrostatic fields generated by the multipole element is one or more of at most 0.1, at most 0.05, at most 0.01, or at least 0.001.

Example 122. The multipole element of any example herein, particularly any one of examples 106-118 and 120-121, wherein the plurality of electrodes comprises exactly eight electrodes, and wherein the multipole element is configured to generate an octupole electrostatic field within the central bore.

Example 123. The multipole element of any example herein, particularly any one of examples 106-118, wherein the plurality of electrodes comprises exactly 16 electrodes, and wherein the multipole element is configured to generate an octupole electrostatic field within the central bore.

Example 124. The multipole element of any example herein, particularly any one of examples 106-123, wherein each of the first shape subset of electrodes and the second shape subset of electrodes comprises an equal number of electrodes.

Example 125. The multipole element of any example herein, particularly any one of examples 106-124, wherein the electrodes of the first shape subset of electrodes are circumferentially interleaved with the electrodes of the second shape subset of electrodes.

Example 126. The multipole element of any example herein, particularly any one of examples 106-125, wherein the electrode active surface of each electrode of the first shape subset of electrodes is wider than the electrode active surface of each electrode of the second shape subset of electrodes.

Example 127. A multipole element comprising:

a plurality of electrodes defining a central bore therebetween, the central bore extending at least partially along a beam axis;

wherein the plurality of electrodes extend away from the central bore partially along a radial direction perpendicular to the beam axis and partially along an axial direction parallel to the beam axis.

Example 128. The multipole element of any example herein, particularly example 127, wherein the multipole element extends along a direction parallel to the beam axis between a proximal end region proximate to the central bore and a distal end region distal to the central bore, wherein the multipole element has:

a first diameter, as measured along a direction perpendicular to the beam axis at the proximal end region; and a second diameter, as measured along a direction perpendicular to the beam axis at the distal end region, and wherein the first diameter is less than the second diameter.

Example 129. The multipole element of any example herein, particularly example 128, wherein a ratio of the second diameter to the first diameter is one or more of at least 1.2:1, at least 1.5:1, at least 2:1, at least 2.5:1, at least 3:1 at most 4:1, at most 2.7:1, at most 2.3:1, at most 1.7:1, or at most 1.3:1.

Example 130. The multipole element of any example herein, particularly any one of examples 127-129, wherein each electrode of the plurality of electrodes comprises: a respective electrode active surface that faces the central bore; and a respective electrode extension extending away from the respective electrode active surface and comprising an electrical contact location configured to be coupled to an electrical lead to supply an electrical voltage to the respective electrode active surface, and wherein the electrode active surface of each electrode is offset from the electrical contact location along an axial direction parallel to the beam axis.

Example 131. The multipole element of any example herein, particularly any one of examples 127-130, wherein the multipole element has:

a first dimension, as measured along a first direction perpendicular to the beam axis and as viewed along the beam axis; and a second dimension, as measured along a second direction perpendicular to each of the beam axis and the first direction and as viewed along the beam axis, and wherein the first dimension is smaller than the second dimension.

Example 132. The multipole element of any example herein, particularly any one of examples 127-131, wherein the multipole element is configured to generate one or more of a quadrupole electrostatic field, a hexapole electrostatic field, an octupole electrostatic field, or a 12-pole electrostatic field within the central bore.

Example 133. The multipole element of any example herein, particularly any one of examples 137-132, wherein the plurality of electrodes consists of one of four electrodes, six electrodes, and eight electrodes.

Example 134. The multipole element of any example herein, particularly any one of examples 127-133, wherein the plurality of electrodes comprises exactly four electrodes, and wherein the multipole element is configured to generate a quadrupole electrostatic field within the central bore.

Example 135. The multipole element of any example herein, particularly any one of examples 127-133, wherein the plurality of electrodes comprises exactly eight electrodes, and wherein the multipole element is configured to generate a quadrupole electrostatic field within the central bore.

Example 136. The multipole element of any example herein, particularly example 135, wherein the multipole element is configured to generate the quadrupole electrostatic field with an accompanying parasitic 12-pole electrostatic field such that a 12-pole to quadrupole component ratio characterizing the 12-pole and quadrupole electrostatic fields generated by the multipole element is one or more of at most 0.1, at most 0.05, at most 0.01, or at least 0.001.

Example 137. The multipole element of any example herein, particularly any one of examples 127-133 and 136, wherein the plurality of electrodes comprises exactly eight electrodes, and wherein the multipole element is configured to generate an octupole electrostatic field within the central bore.

Example 138. The multipole element of any example herein, particularly any one of examples 127-133, wherein the plurality of electrodes comprises exactly 16 electrodes, and wherein the multipole element is configured to generate an octupole electrostatic field within the central bore.

Example 139. The multipole element of any example herein, particularly any one of examples 127-138, wherein each electrode of the plurality of electrodes comprises a respective electrode active surface that faces the central bore, wherein the plurality of electrodes comprises a first shape subset of electrodes and a second shape subset of electrodes, wherein the electrode active surface of each electrode of the first shape subset of electrodes has a first active surface shape, as viewed along a direction parallel to the beam axis, and wherein the electrode active surface of each electrode of the second shape subset of electrodes has a second active surface shape, as viewed along a direction parallel to the beam axis, that is different than the first active surface shape.

Example 140. The multipole element of any example herein, particularly example 139, wherein each of the first shape subset of electrodes and the second shape subset of electrodes comprises an equal number of electrodes.

Example 141. The multipole element of any example herein, particularly any one of examples 139-140, wherein the electrodes of the first shape subset of electrodes are circumferentially interleaved with the electrodes of the second shape subset of electrodes.

Example 142. A multipole element comprising:

a plurality of electrodes distributed around and defining a central bore, wherein each electrode of the plurality of electrodes comprises:

a respective electrode active surface that faces the central bore; and a respective electrode extension extending away from the respective electrode active surface and configured to supply an electrical voltage to the respective electrode active surface, wherein the plurality of electrodes comprises a first side subset of electrodes and a second side subset of electrodes, wherein, for each electrode of the first side subset of electrodes, the electrode extension extends away from the electrode active surface along a first lateral direction, and wherein, for each electrode of the second side subset of electrodes, the electrode extension extends away from the electrode active surface along a second lateral direction that is opposed to the first lateral direction.

Example 143. The multipole element of any example herein, particularly example 142, wherein the electrode extensions of the electrodes of the first side subset of electrodes extend to and terminate in a first side region of the multipole element, wherein the electrode extensions of the electrodes of the second side subset of electrodes extend to and terminate in a second side region of the multipole element, and wherein the first side region and the second side region are positioned on opposite sides of the central bore.

Example 144. The multipole element of any example herein, particularly any one of examples 142-143, wherein, for each electrode of the plurality of electrodes, the electrode extension comprises an electrical contact location configured to be coupled to an electrical lead to supply the electrical voltage to the electrode active surface.

Example 145. The multipole element of any example herein, particularly any one of examples 142-144, wherein the first lateral direction and the second lateral direction are at least substantially antiparallel to one another.

Example 146. The multipole element of any example herein, particularly any one of examples 142-145, wherein the multipole element is configured to receive a charged particle beam that travels along a beam axis that extends through the central bore, and wherein each of the first lateral direction and the second lateral direction is at least substantially perpendicular to the beam axis.

Example 147. The multipole element of any example herein, particularly any one of examples 142-146, wherein the multipole element is configured to receive a charged particle beam that travels along a beam axis that extends through the central bore, and wherein each of the first lateral direction and the second lateral direction is angled relative to each of a radial direction perpendicular to the beam axis and an axial direction parallel to the beam axis.

Example 148. The multipole element of any example herein, particularly any one of examples 142-147, wherein the first lateral direction and the second lateral direction extend along opposed directions with respect to the beam axis, and wherein the first lateral direction and the second lateral direction extend away from the central bore partially along an axial direction parallel to the beam axis.

Example 149. The multipole element of any example herein, particularly any one of examples 142-148, wherein the plurality of electrodes extend away from a central bore such that the multipole element has a first dimension, as measured along a first direction perpendicular to the beam axis, that is smaller than a second dimension of the multipole element, as measured along a second direction perpendicular to each of the beam axis and the first direction.

Example 150. The multipole element of any example herein, particularly example 149, wherein a ratio of the second dimension to the first dimension is one or more of at least 1.2:1, at least 1.5:1, at least 2:1, at least 2.5:1, at least 3:1 at most 4:1, at most 2.7:1, at most 2.3:1, at most 1.7:1, or at most 1.3:1.

Example 151. The multipole element of any example herein, particularly any one of examples 142-150, wherein the multipole element is configured to generate one or more of a quadrupole electrostatic field, a hexapole electrostatic field, an octupole electrostatic field, or a 12-pole electrostatic field within the central bore.

Example 152. The multipole element of any example herein, particularly any one of examples 142-151, wherein the plurality of electrodes consists of one of four electrodes, six electrodes, and eight electrodes.

Example 153. The multipole element of any example herein, particularly any one of examples 142-152, wherein the plurality of electrodes comprises exactly four electrodes, and wherein the multipole element is configured to generate a quadrupole electrostatic field within the central bore.

Example 154. The multipole element of any example herein, particularly any one of examples 142-152, wherein the plurality of electrodes comprises exactly eight electrodes, and wherein the multipole element is configured to generate a quadrupole electrostatic field within the central bore.

Example 155. The multipole element of any example herein, particularly example 154, wherein the multipole element is configured to generate the quadrupole electrostatic field with an accompanying parasitic 12-pole electrostatic field such that a 12-pole to quadrupole component ratio characterizing the 12-pole and quadrupole electrostatic fields generated by the multipole element is one or more of at most 0.1, at most 0.05, at most 0.01, or at least 0.001.

Example 156. The multipole element of any example herein, particularly any one of examples 142-152 and 154-155, wherein the plurality of electrodes comprises exactly eight electrodes, and wherein the multipole element is configured to generate an octupole electrostatic field within the central bore.

Example 157. The multipole element of any example herein, particularly any one of examples 142-152, wherein the plurality of electrodes comprises exactly 16 electrodes, and wherein the multipole element is configured to generate an octupole electrostatic field within the central bore.

Example 158. The multipole element of any example herein, particularly any one of examples 142-157, wherein each electrode of the plurality of electrodes comprises a respective electrode active surface that faces the central bore, wherein the plurality of electrodes comprises a first shape subset of electrodes and a second shape subset of electrodes, wherein the electrode active surface of each electrode of the first shape subset of electrodes has a first active surface shape, as viewed along a direction parallel to the beam axis, and wherein the electrode active surface of each electrode of the second shape subset of electrodes has a second active surface shape, as viewed along a direction parallel to the beam axis, that is different than the first active surface shape.

Example 159. The multipole element of any example herein, particularly example 158, wherein each of the first shape subset of electrodes and the second shape subset of electrodes comprises an equal number of electrodes.

Example 160. The multipole element of any example herein, particularly any one of examples 158-159, wherein the electrodes of the first shape subset of electrodes are circumferentially interleaved with the electrodes of the second shape subset of electrodes.

Example 161.A charged particle microscope system comprising:

a charged particle source configured to emit a charged particle beam; and an optical column configured to direct the charged particle beam toward a sample;

wherein the optical column comprises the multipole element of any example herein, particularly any one of examples 106-160.

Example 162. The charged particle microscope system of any example herein, particularly example 161, wherein the optical column is configured to at least partially correct a spherical aberration of the charged particle beam.

Example 163. The charged particle microscope system of any example herein, particularly any one of examples 161-162, wherein the optical column comprises a multipole objective that comprises the multipole element of any example herein, particularly any one of examples 106-160.

Example 164. A multipole objective comprising:

a plurality of multipole elements axially aligned with respect to a beam axis, wherein the plurality of multipole elements are configured to focus a charged particle beam to a target focus location, wherein the plurality of multipole elements comprises a proximal multipole element that is proximate to the target focus location relative to the remaining multipole elements and that is separated from the target focus location by a working distance, and wherein the plurality of multipole elements are fully contained within a first angular envelope, defined in a first plane that contains the beam axis, that subtends a first angle that is at most 50 degrees while the working distance is at most 10 mm.

Example 165. The multipole objective of any example herein, particularly example 164, wherein the plurality of multipole elements comprises at least three multipole elements, each of which is configured to generate each of a respective quadrupole electrostatic field and a respective octupole electrostatic field.

Example 166. The multipole objective of any example herein, particularly any one of examples 164-165, wherein the plurality of multipole elements comprises at least four multipole elements, wherein at least three multipole elements of the plurality of multipole elements are configured to generate respective quadrupole electrostatic fields, and wherein at least three multipole elements of the plurality of multipole elements are configured to generate respective octupole electrostatic fields.

Example 167. The multipole objective of any example herein, particularly example 166, wherein at least two multipole elements of the plurality of multipole elements are configured to generate each of a respective quadrupole electrostatic field and a respective octupole electrostatic field.

Example 168. The multipole objective of any example herein, particularly any one of examples 164-167, wherein each pair of adjacent multipole elements of the plurality of multipole elements is separated by a respective multipole element gap that is one or more of at least 0.2 mm, at least 0.5 mm, at least 1 mm, at most 1.5 mm, at most 0.7 mm, or at most 0.3 mm.

Example 169. The multipole objective of any example herein, particularly any one of examples 164-168, wherein each multipole element of the plurality of multipole elements has a respective multipole element length, as measured along a direction parallel to the beam axis, that is one or more of at least 2 mm, at least 5 mm, at least 10 mm, at most 15 mm, at most 10 mm, at most 7 mm, or at most 3 mm.

Example 170. The multipole objective of any example herein, particularly example 169, wherein each multipole element of the plurality of multipole elements comprises a respective central region that defines a central bore through which the beam axis extends, and wherein the multipole element length of each multipole element is measured in the respective central region thereof.

Example 171. The multipole objective of any example herein, particularly any one of examples 164-170, wherein the plurality of multipole elements comprises a distal multipole element that is distal to the target focus location relative to the remaining multipole elements, and wherein the plurality of multipole elements has a stack length, as measured along a direction parallel to the beam axis between the proximal multipole element and the distal multipole element, that is one or more of at least 15 mm, at least 20 mm, at least 25 mm, at least 30 mm, at least 35 mm, at least 40 mm, at most 50 mm, at most 37 mm, at most 32 mm, at most 27 mm, at most 22 mm, or at most 17 mm.

Example 172. The multipole objective of any example herein, particularly any one of examples 164-171, wherein the plurality of multipole elements are configured to operate as an objective lens to focus the charged particle beam to the target focus location with a third order spherical aberration that is at most 1 mm.

Example 173. The multipole objective of any example herein, particularly any one of examples 164-172, wherein the plurality of multipole elements are fully contained within a second angular envelope, defined in a second plane that contains the beam axis and that is perpendicular to the first plane, that subtends a second angle that is substantially equal to the first angle while the working distance is at most 10 mm.

Example 174. The multipole objective of any example herein, particularly example 173, wherein the second angle is at most 50 degrees.

Example 175. The multipole objective of any example herein, particularly any one of examples 164-174, further comprising a lens housing that encloses the plurality of multipole elements, wherein a portion of the lens housing that encloses the plurality of multipole elements is conical or frusto-conical in shape.

Example 176. The multipole objective of any example herein, particularly any one of examples 164-175, wherein the plurality of multipole elements are fully contained within a second angular envelope, defined in a second plane that contains the beam axis and that is perpendicular to the first plane, that subtends a second angle that is greater than the first angle while the working distance is at most 10 mm.

Example 177. The multipole objective of any example herein, particularly any one of examples 164-176, further comprising a lens housing that encloses the plurality of multipole elements, wherein a portion of the lens housing that encloses the plurality of multipole elements has an angular extent that is greater in a second plane, which contains the beam axis and that is perpendicular to the first plane, than in the first plane.

Example 178. An apparatus comprising:

a charged particle source configured to emit a charged particle beam; and an optical column configured to direct the charged particle beam at least partially along a beam axis and toward a target focus location;

wherein the optical column comprises the multipole objective of any example herein, particularly any one of examples 164-177.

Example 179. The apparatus of any example herein, particularly example 178, wherein the charged particle beam is a first charged particle beam, wherein the beam axis is a first beam axis, wherein the apparatus is configured to direct a second charged particle beam at least partially along a second beam axis and toward the target focus location, wherein the second charged particle beam extends within an excluded region, and wherein the multipole objective is positioned fully exteriorly of the excluded region.

Example 180. The apparatus of any example herein, particularly example 179, wherein the excluded region comprises a conical region.

Example 181. The apparatus of any example herein, particularly any one of examples 179-180, wherein the second charged particle beam at least partially defines the excluded region.

Example 182. The apparatus of any example herein, particularly any one of examples 179-181, wherein the optical column is a first optical column, wherein the apparatus further comprises a second optical column configured to direct the second charged particle beam toward the target focus location, and wherein the second optical column at least partially defines the excluded region.

Example 183. The apparatus of any example herein, particularly any one of examples 179-182, wherein the target focus location corresponds to a location on a sample, and wherein the sample partially defines the excluded region.

Example 184. The apparatus of any example herein, particularly any one of examples 179-183, wherein the excluded region at least partially defines the first angular envelope.

Example 185. The apparatus of any example herein, particularly any one of examples 179-184, wherein the first angular envelope represents a region fully exterior of the excluded region.

Example 186. The apparatus of any example herein, particularly any one of examples 179-185, wherein the first charged particle beam is a focused ion beam, and wherein the second charged particle beam is an electron beam.

Example 187. A method of assembling and/or operating the apparatus of any example herein, particularly any one of examples 1-77 or examples 178-186.

Example 188. A method of assembling and/or operating the charged particle microscope system of any example herein, particularly any one of examples 78-105 or examples 161-163.

Example 189. A method of assembling and/or operating the multipole element of any example herein, particularly any one of examples 106-160 or examples 164-177.

In view of the many possible examples to which the principles of the disclosed technology may be applied, it should be recognized that the illustrated examples are only preferred examples and should not be taken as limiting in scope. Rather, the scope of the disclosed technology is defined by the following claims. We therefore claim all that comes within the scope of these claims.

The invention claimed is:

1. An apparatus, comprising:

a plurality of electrostatic elements configured to deflect an incident charged particle beam along an α-shaped path, wherein the plurality of electrostatic elements comprises a plurality of electrostatic multipole elements configured to at least partially correct an axial chromatic aberration of the charged particle beam, and a deflector assembly comprising a corrector electrostatic prism and the plurality of electrostatic multipole elements, wherein the deflector assembly is configured to deflect the charged particle beam along a deflector optical axis, wherein the corrector electrostatic prism comprises a corrector prism body with a first corrector prism electrode and a second corrector prism electrode positioned radially exteriorly of the first corrector prism electrode, wherein the first corrector prism electrode and the second corrector prism electrode define an electrode gap therebetween, and wherein the deflector assembly is configured to at least partially correct an axial chromatic aberration in the charged particle beam with two or more hexapole fields generated within the corrector electrostatic prism.

2. The apparatus of claim 1, wherein the plurality of electrostatic multipole elements comprises:

a first hexapole-generating element configured to generate a first hexapole field;

a second hexapole-generating element configured to generate a second hexapole field; and a third hexapole-generating element configured to generate a third hexapole field.

3. The apparatus of claim 1, wherein at least two electrostatic multipole elements of the plurality of electrostatic multipole elements are at least partially contained within the corrector electrostatic prism.

4. The apparatus of claim 1, wherein the first corrector prism electrode comprises a first electrode exterior surface that defines a first electrode recess extending partially along a direction parallel to the deflector optical axis, wherein the second corrector prism electrode comprises a second electrode exterior surface that defines a second electrode recess extending partially along the direction parallel to the deflector optical axis, and wherein at least one electrostatic multipole element of the plurality of electrostatic multipole elements is positioned at least partially within each of the first electrode recess and the second electrode recess.

5. The apparatus of claim 1, wherein the corrector electrostatic prism is configured to deflect the charged particle beam through an angle that is approximately equal to 270 degrees.

6. The apparatus of claim 1, wherein the first corrector prism electrode comprises a first electrode exterior surface that faces the second corrector prism electrode, wherein the first electrode exterior surface defines a first electrode groove extending along a direction parallel to the deflector optical axis, wherein the second corrector prism electrode comprises a second electrode interior surface that faces the first corrector prism electrode, wherein the second electrode interior surface defines a second electrode groove extending along a direction parallel to the deflector optical axis, and wherein the corrector electrostatic prism is configured such that, when a first electrode voltage is applied to the first corrector prism electrode and a second electrode voltage is applied to the second corrector prism electrode, the first electrode groove and the second electrode groove generate a hexapole field within the corrector electrostatic prism.

7. The apparatus of claim 6, wherein the corrector electrostatic prism has a corrector prism beam radius, as measured between a center of the first corrector prism electrode and the deflector optical axis, wherein the first electrode groove has a first electrode groove depth, as measured along a radial direction parallel to the corrector prism beam radius, wherein the second electrode groove has a second electrode groove depth, as measured along the radial direction, and wherein each of the first electrode groove depth and the second electrode groove depth is at most 1/50 of the corrector prism beam radius.

8. The apparatus of claim 6, wherein a location along a portion of the deflector optical axis extending within the corrector electrostatic prism is characterized by a prism angle >, and wherein one or more dimensions of one or both of the first electrode groove and the second electrode groove vary with the prism angle.

9. The apparatus of claim 1, further comprising:

an entry electrostatic prism configured to direct the charged particle beam from an optical column axis toward the deflector optical axis; and an exit electrostatic prism configured to direct the charged particle beam from the deflector optical axis toward the optical column axis, wherein the entry electrostatic prism and the exit electrostatic prism are configured to be selectively operated in each of:

a correction mode, in which the entry electrostatic prism directs the charged particle beam toward the deflector optical axis; and a straight-axis mode, in which the charged particle beam bypasses the deflector assembly.

10. A charged particle microscope system comprising:

a charged particle source configured to emit a charged particle beam toward a sample; and an optical column configured to focus the charged particle beam onto the sample, wherein the optical column comprises the apparatus of claim 1.

11. An apparatus, comprising:

a plurality of electrostatic elements configured to deflect an incident charged particle beam along an α-shaped path, wherein the plurality of electrostatic elements comprises a plurality of electrostatic multipole elements configured to at least partially correct an axial chromatic aberration of the charged particle beam, and a deflector assembly comprising a corrector electrostatic prism and the plurality of electrostatic multipole elements, wherein the plurality of electrostatic multipole elements comprises:

a first hexapole-generating element configured to generate a first hexapole field;

a second hexapole-generating element configured to generate a second hexapole field; and a third hexapole-generating element configured to generate a third hexapole field, wherein the deflector assembly defines a deflector optical axis, wherein the second hexapole-generating element is positioned proximate to a midpoint of the deflector optical axis within the corrector electrostatic prism and at a position along the deflector optical axis corresponding to a line focus of the charged particle beam, and wherein the deflector assembly is configured to at least partially correct an axial chromatic aberration in the charged particle beam as the charged particle beam travels along the deflector optical axis.

12. The apparatus of claim 11, wherein each of the first hexapole-generating element and the third hexapole-generating element are angularly equidistant from the second hexapole-generating element.

13. The apparatus of claim 11, wherein each of the first hexapole-generating element and the third hexapole-generating element is positioned proximate to a position along the deflector optical axis corresponding to a line focus of the charged particle beam.

14. The apparatus of claim 11, wherein each of the first hexapole-generating element, the second hexapole-generating element, and the third hexapole-generating element is at least partially contained within the corrector electrostatic prism.

15. The apparatus of claim 11, wherein the corrector electrostatic prism is configured to generate at least a portion of an electrostatic deflection field that comprises a prism hexapole field, wherein a location along the portion of the deflector optical axis extending within the corrector electrostatic prism is characterized by a prism angle ϕ, and wherein a magnitude of the prism hexapole field within the corrector electrostatic prism varies with ϕ.

16. The apparatus of claim 15, wherein the magnitude of the prism hexapole field is proportional to a hexapole parameter p that varies with the prism angle ϕ, and wherein the hexapole parameter is piecewise constant with:

(i)

$$p = p_1,\ 0 < \phi \le \phi_1;$$

(ii)

$$p = p_2,\ \phi_1 < \phi \le \phi_2;$$

(iii)

$$p = p_3,\ \phi_2 < \phi \le \phi_3;$$

(iv)

$$p = p_3,\ \phi_3 < \phi \le \phi_4;$$

(v)

$$p = p_2,\ \phi_4 < \phi \le \phi_5;$$

and (vi)

$$p = p_1,\ \phi_5 < \phi \le \phi_6.$$

17. An apparatus, comprising:

a plurality of electrostatic elements configured to deflect an incident charged particle beam along an α-shaped path, wherein the plurality of electrostatic elements comprises a plurality of electrostatic multipole elements configured to at least partially correct an axial chromatic aberration of the charged particle beam, and a deflector assembly comprising a corrector electrostatic prism and the plurality of electrostatic multipole elements, wherein the plurality of electrostatic multipole elements comprises:

a first hexapole-generating element configured to generate a first hexapole field;

a second hexapole-generating element configured to generate a second hexapole field;

a third hexapole-generating element configured to generate a third hexapole field; and a fourth hexapole-generating element configured to generate a fourth hexapole field, wherein each of the second hexapole-generating element and the third hexapole-generating element is positioned at least partially within the corrector electrostatic prism, wherein the deflector assembly defines a deflector optical axis, and wherein the deflector assembly is configured to at least partially correct an axial chromatic aberration in the charged particle beam as the charged particle beam travels along the deflector optical axis.

18. The apparatus of claim 17, wherein each of the first hexapole-generating element and the fourth hexapole-generating element is positioned at least partially exterior of the corrector electrostatic prism.

19. The apparatus of claim 17, wherein the corrector electrostatic prism is configured to function as a monochromator.

20. The apparatus of claim 19, wherein the corrector electrostatic prism is configured to generate a point focus of the charged particle beam proximate to a midplane location of the deflector optical axis within the corrector electrostatic prism, and wherein the apparatus further comprises an energy-selecting slit positioned proximate to the midplane location of the deflector optical axis.

* * * * *